(12) United States Patent
Tamura et al.

(10) Patent No.: US 7,927,971 B2
(45) Date of Patent: Apr. 19, 2011

(54) METHOD FOR MANUFACTURING SEMICONDUCTOR DEVICE

(75) Inventors: Tomoko Tamura, Atsugi (JP); Eiji Sugiyama, Tochigi (JP); Yoshitaka Dozen, Tochigi (JP); Koji Dairiki, Isehara (JP); Takuya Tsurume, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 148 days.

(21) Appl. No.: 11/632,048

(22) PCT Filed: Jul. 28, 2005

(86) PCT No.: PCT/JP2005/014253
§ 371 (c)(1),
(2), (4) Date: Jan. 10, 2007

(87) PCT Pub. No.: WO2006/011664
PCT Pub. Date: Feb. 2, 2006

(65) Prior Publication Data
US 2007/0196999 A1 Aug. 23, 2007

(30) Foreign Application Priority Data

Jul. 30, 2004 (JP) ................. 2004-224762
Jul. 30, 2004 (JP) ................. 2004-224803

(51) Int. Cl.
*H01L 21/30* (2006.01)
*H01L 21/46* (2006.01)
*H01L 21/302* (2006.01)
*H01L 21/461* (2006.01)
*H01L 23/58* (2006.01)

(52) U.S. Cl. .............. 438/458; 438/689; 257/635

(58) Field of Classification Search .................. None
See application file for complete search history.

(56) References Cited

U.S. PATENT DOCUMENTS

| 5,308,967 | A  | 5/1994 | Jurisch        |
|-----------|----|--------|----------------|
| 5,541,399 | A  | 7/1996 | de Vall        |
| 6,422,473 | B1 | 7/2002 | Ikefuji et al. |
| 6,911,358 | B2 | 6/2005 | Azami et al.   |

(Continued)

FOREIGN PATENT DOCUMENTS

EP      1 434 263      6/2004

(Continued)

OTHER PUBLICATIONS

International Search Report (Application No. PCT/JP2005/014253) dated Nov. 8, 2005.

(Continued)

*Primary Examiner* — Andy Huynh
*Assistant Examiner* — Valerie Brown
(74) *Attorney, Agent, or Firm* — Eric J. Robinson; Robinson Intellectual Property Law Office, P.C.

(57) ABSTRACT

A release layer formed over a substrate; at least one of thin film integrated circuits is formed over the release layer; a film is formed over each of the at least one of thin film integrated circuits; and the release layer is removed by using an etchant; thus, the at least one of thin film integrated circuits is peeled from the substrate. A semiconductor device is formed by sealing the peeled thin film integrated circuit by lamination or the like.

21 Claims, 30 Drawing Sheets

U.S. PATENT DOCUMENTS

| | | |
|---|---|---|
| 7,045,442 B2 | 5/2006 | Maruyama et al. |
| 7,091,070 B2 | 8/2006 | Imai et al. |
| 7,105,448 B2 | 9/2006 | Takayama et al. |
| 7,159,241 B1 | 1/2007 | Horiguchi et al. |
| 7,271,076 B2 | 9/2007 | Yamazaki et al. |
| 7,452,786 B2 | 11/2008 | Dozen et al. |
| 7,465,647 B2 | 12/2008 | Yamazaki et al. |
| 2001/0015256 A1 | 8/2001 | Yamazaki et al. |
| 2003/0006121 A1 | 1/2003 | Lee et al. |
| 2003/0022403 A1* | 1/2003 | Shimoda et al. ............ 438/14 |
| 2004/0016115 A1 | 1/2004 | Hashimoto |
| 2004/0026520 A1 | 2/2004 | Kawai et al. |
| 2004/0118805 A1* | 6/2004 | Hareland et al. ............ 216/13 |
| 2004/0129960 A1 | 7/2004 | Maruyama et al. |
| 2005/0116048 A1 | 6/2005 | Sauter et al. |
| 2005/0148121 A1 | 7/2005 | Yamazaki et al. |
| 2005/0285231 A1 | 12/2005 | Arao et al. |
| 2005/0287846 A1 | 12/2005 | Dozen et al. |
| 2006/0063309 A1 | 3/2006 | Sugiyama et al. |
| 2006/0189097 A1 | 8/2006 | Maruyama et al. |
| 2007/0063057 A1 | 3/2007 | Masubuchi et al. |
| 2007/0161159 A1 | 7/2007 | Yamazaki et al. |
| 2007/0166954 A1 | 7/2007 | Yamazaki et al. |

FOREIGN PATENT DOCUMENTS

| | | |
|---|---|---|
| EP | 1 435 653 | 7/2004 |
| JP | 08-254686 | 10/1996 |
| JP | 10-125929 | 5/1998 |
| WO | WO 2005/057658 | 6/2005 |
| WO | WO 2005/076358 | 8/2005 |
| WO | WO 2006/001287 | 1/2006 |
| WO | WO 2006/022169 | 3/2006 |

OTHER PUBLICATIONS

Written Opinion (Application No. PCT/JP2005/014253) dated Nov. 8, 2005.

* cited by examiner 100  103  104  101

105

100  101  106  103

2070

2000 2010 2040 2030

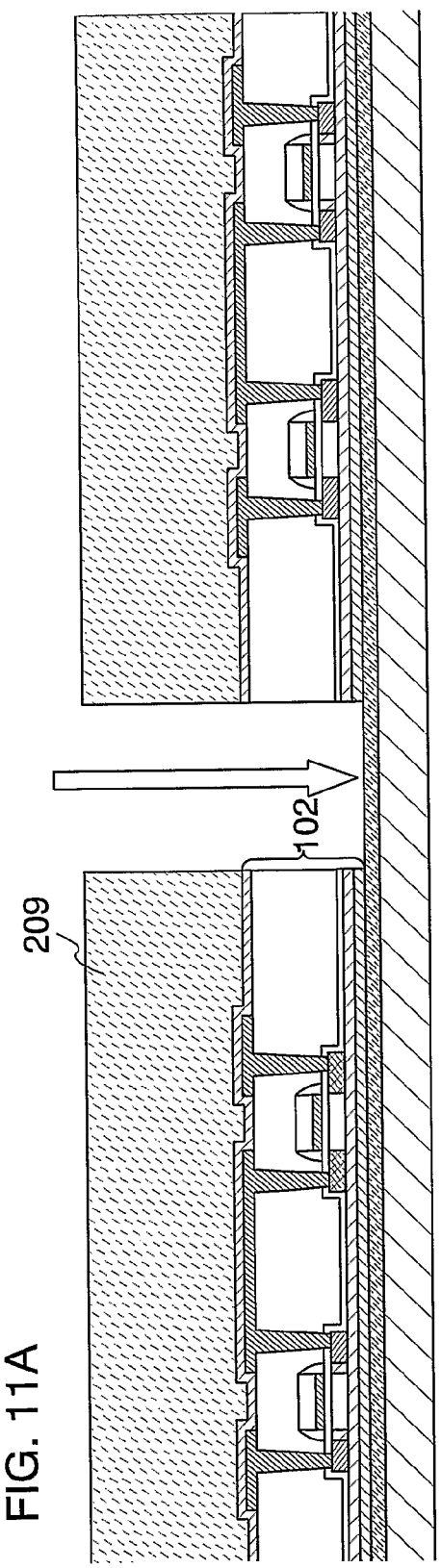
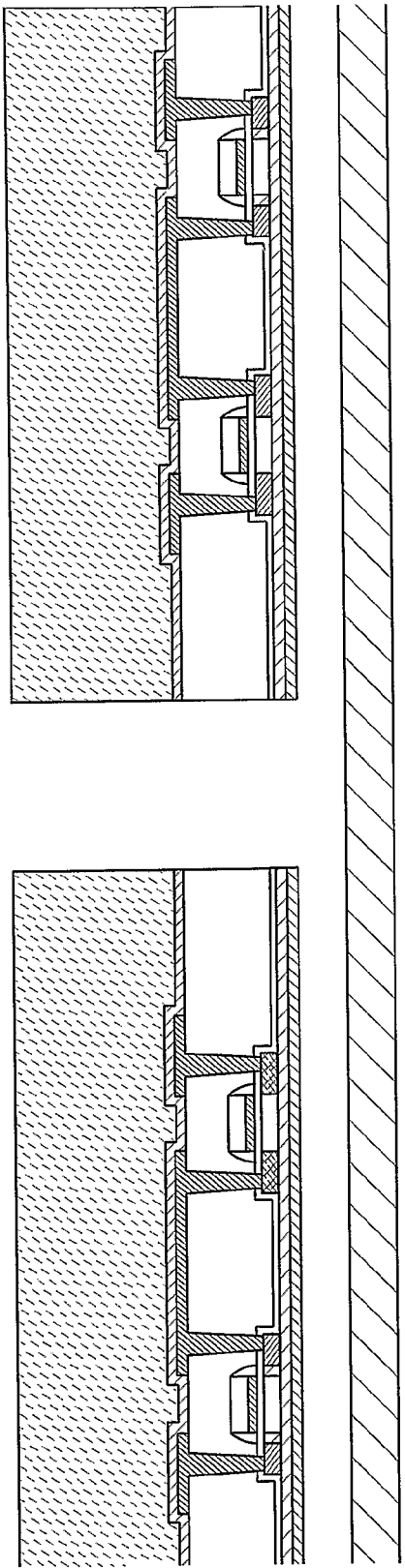
FIG. 11A
FIG. 11B

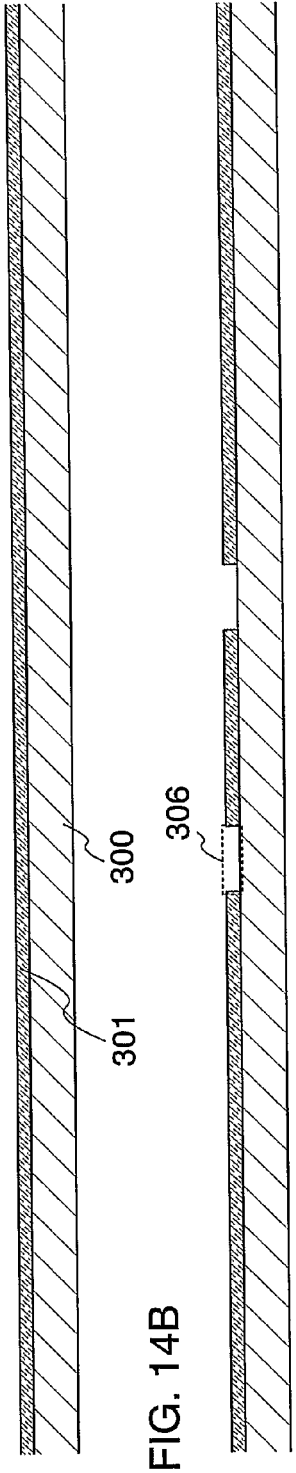
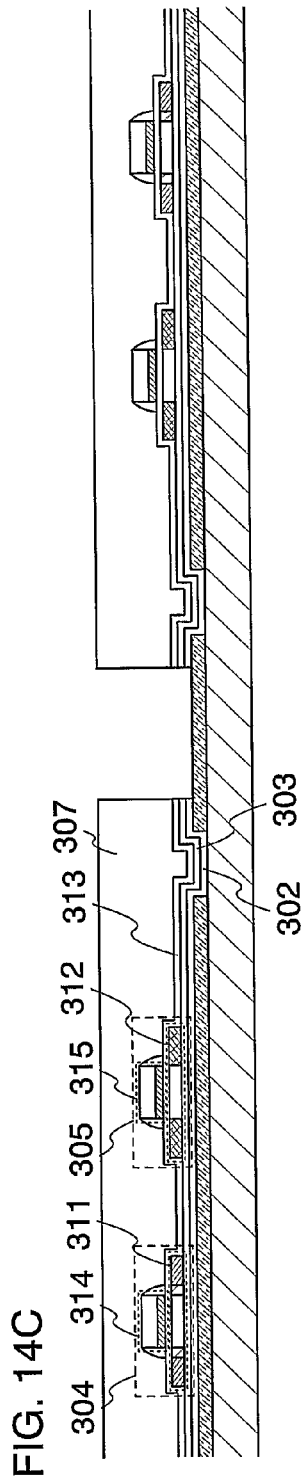
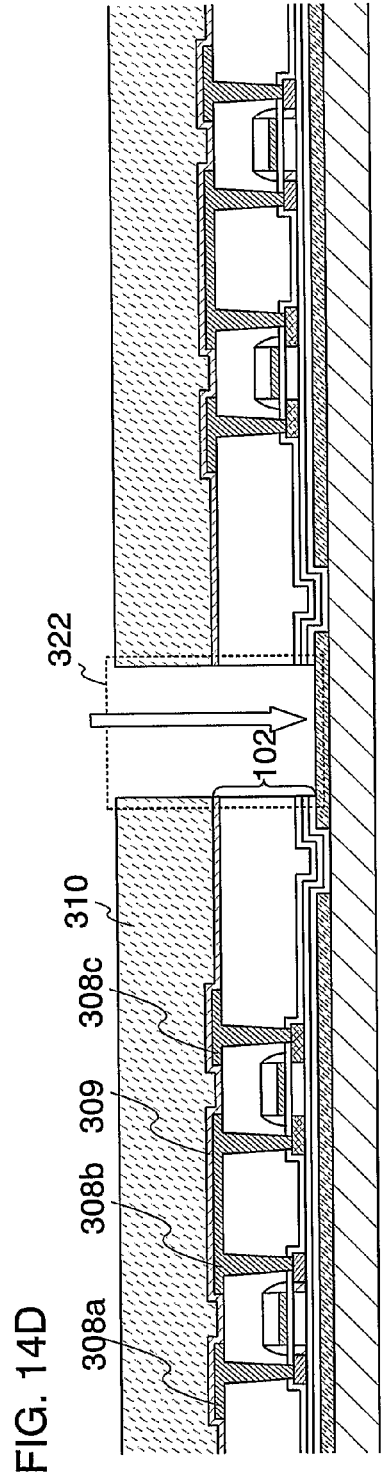

316

Y-axis direction

X-axis direction

E  F

G  H

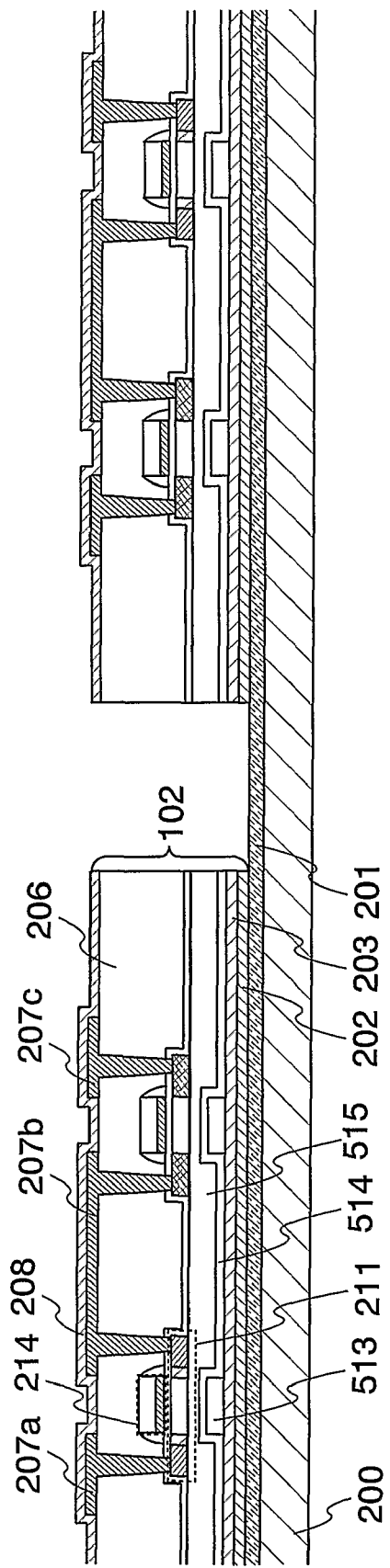

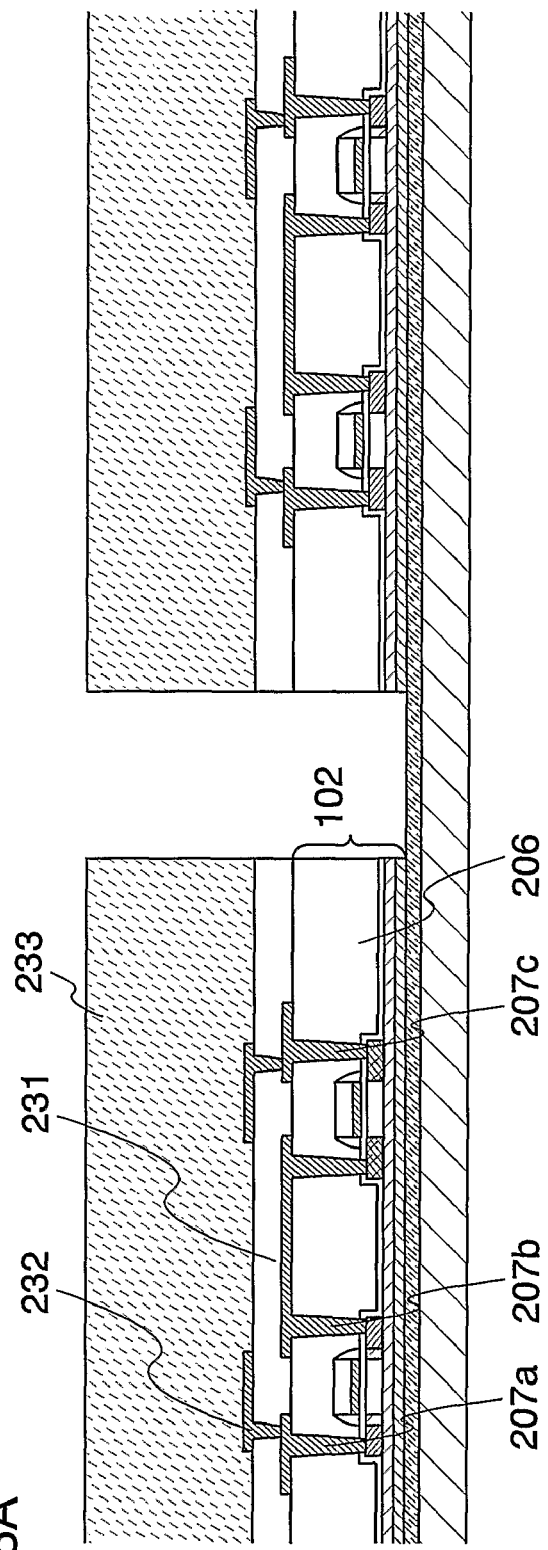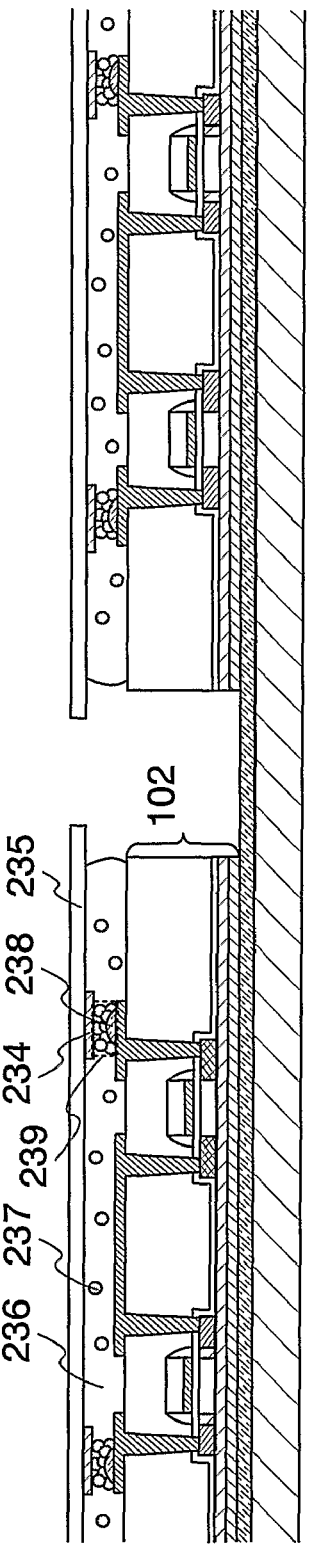

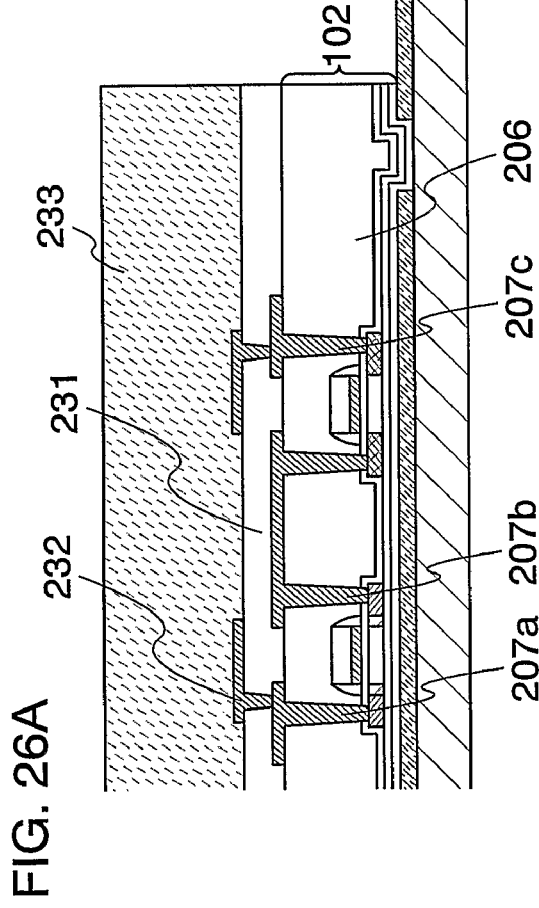
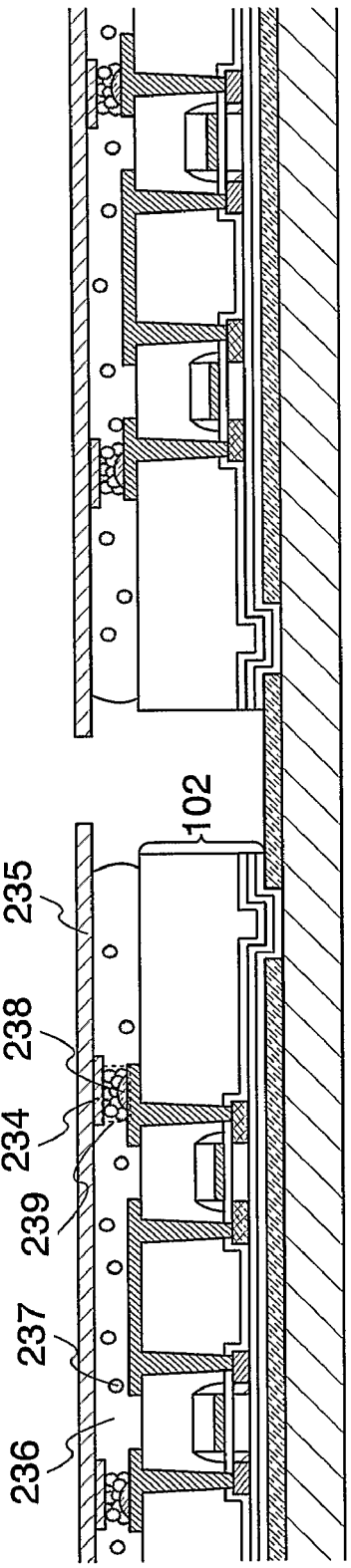
FIG. 26A
FIG. 26B

METHOD FOR MANUFACTURING SEMICONDUCTOR DEVICE

TECHNICAL FIELD

The present invention relates to a method for peeling a thin film integrated circuit in which a large amount of information can be stored and also to a method for manufacturing a semiconductor device using the peeling method.

BACKGROUND ART

In recent years, technologies for an IC chip (also referred to as an IC tag, an ID tag, an RF (Radio Frequency) tag, a wireless tag, or an electronic tag) using a thin film integrated circuit formed over a glass substrate have been developed. In such technologies, a thin film integrated circuit formed over a glass substrate needs to be separated from the glass substrate, which is a supporting substrate, after the completion. Accordingly, various techniques have been invented so far to separate a thin film integrated circuit provided over a supporting substrate.

For example, a substrate may be thinned by grinding or polishing to obtain a thin film integrated circuit out, a supporting substrate may be removed by chemical reaction or the like, or a thin film integrated circuit may be peeled off a supporting substrate.

As a specific method for peeling off a thin film integrated circuit provided over a supporting substrate, there is a technique for providing a space and separating a supporting substrate, by providing a separation layer of amorphous silicon (or polysilicon) and irradiating the same with laser light through the substrate to release hydrogen contained in amorphous silicon (Reference 1: Japanese Patent Laid-Open No. 10-125929). Further, there is a technique for separating a thin film integrated circuit from a supporting substrate, by providing a release layer containing silicon between the thin film integrated circuit and the supporting substrate and removing the same using a gas containing halogen fluoride (Reference 2: Japanese Patent Laid-Open No. 8-254686). Thus, there are many ways to separate a thin film integrated circuit provided over a supporting substrate.

However, in the case of removing a supporting substrate by grinding, polishing, or dissolution, it is very difficult to reuse a substrate that has been used once and cost is high.

In the case of separating a thin film integrated circuit provided over a supporting substrate by removing a release layer provided between the thin film integrated circuit and the supporting substrate, removal of the release layer becomes important. In other words, time needed to remove the release layer, the state of the thin film integrated circuit after the removal, and the like are dependent on the selection of a material used for the release layer and an etchant. Consequently, the step of peeling the thin film integrated circuit from the supporting substrate greatly affects the production efficiency, total cost, and the like. In addition, in the peeling step using the release layer, the thin film integrated circuit is distorted due to stress or the like when the thin film integrated circuit provided over the supporting substrate is separated, so that it is difficult to maintain its original shape.

DISCLOSURE OF INVENTION

In view of the above-described problems, it is an object of the present invention to provide a method for peeling a thin film integrated circuit at low cost with high production efficiency and a method for manufacturing a semiconductor device using the peeling method.

One feature of the invention is to include the steps of: forming a release layer with a metal-containing film over a substrate; forming a plurality of thin film integrated circuits over the release layer; forming a resin film over each of the plurality of thin film integrated circuits; removing the release layer by introducing a gas or a liquid containing halogen fluoride into the release layer; and peeling the thin film integrated circuits from the substrate. The metal-containing film may be any film that contains metal, for example, a film containing any of tungsten (W), molybdenum (Mo), niobium (Nb), and titanium (Ti) can be used. In addition, oxide of the metal film may be formed on a surface of the metal film. Specifically, a film containing $WO_x$ can be formed on W; a film containing $Mo_x$, on Mo; a film containing $Nb_x$, on Nb; a film containing $TiO_x$, on Ti; or the like (x=2 to 3).

Another feature of the invention is to include the steps of: forming a release layer with a metal-containing layer over a substrate; forming a plurality of thin film integrated circuits over the release layer; forming a resin film over each of the plurality of thin film integrated circuits; removing the release layer while leaving at least a part of the release layer disposed below the thin film integrated circuits by introducing a gas or a liquid containing halogen fluoride into the release layer; and peeling by a physical means (physical force, or physical dynamic) the substrate and the plurality of thin film integrated circuits from each other which are attached to each other by the part of the release layer. Note that the physical means is a means recognized not by chemistry but by physics and specifically refers to a dynamic means or a mechanical means having a process which can be used according to the low of dynamics and also a means which can change some sort of dynamic energy (mechanical energy). In other words, "peeling by a physical means" means peeling by externally making an impact (stress) using, for example, a human hand, air pressure of a gas sprayed from a nozzle, ultrasonic waves, a load using a wedge-shaped member, or the like.

Still another feature of the invention is to includes the steps of: forming a release layer with a metal-containing film over a substrate; forming a plurality of openings in the release layer by selectively removing a part of the release layer; forming a thin film integrated circuit over the release layer and in the openings; forming a resin film over the thin film integrated circuit; removing the release layer by introducing a gas or a liquid containing halogen fluoride into the release layer; and peeling by a physical means the substrate and the thin film integrated circuit from each other which are attached to each other in the opening.

Yet another feature of the invention is to include the steps of: forming a release layer with a metal-containing film over a substrate; forming a thin film integrated circuit over the release layer; forming a resin film having a projection on at least a part of a surface thereof over the thin film integrated circuit; removing the release layer while leaving at least a part of the release layer disposed below the projection of the thin film integrated circuit by introducing a gas or a liquid containing halogen fluoride into the release layer; and peeling by a physical means the substrate and the thin film integrated circuit from each other which are attached to each other by the part of the release layer.

In the invention, the above-described gas or liquid containing halogen fluoride is preferably, but not exclusively, used as an etchant to remove the release layer. Any material that reacts with the release layer may be used. $CF_4$, $SF_6$, $NF_3$, $F_2$, TMAH, or the like can also be used as an etchant.

The resin film preferably covers the entire upper surface of the thin film integrated circuit, or may cover at least a part of the thin film integrated circuit. In addition, the resin film may cover a side face as well as the upper surface.

Note that the thin film integrated circuit of the invention may have any structure. All kinds of thin film integrated circuits such as an LSI (large scale integrated circuit), a CPU (central processing unit), a memory, and a microprocessor belong to the category. A typical one of thin film integrated circuits which can be formed using the peeling method of the invention is an IC chip. The IC chip is a semiconductor device which can wirelessly transmit and receive data, and practical application thereof is proceeding in various fields. The IC chip is also referred to as a wireless tag, an RFID (radio frequency identification) tag, an IC tag, or an ID chip.

A semiconductor device formed using the peeling method of the invention has an integrated circuit using a thin film transistor. The semiconductor device using the manufacturing method of the invention may also have a structure including an antenna in addition to the integrated circuit. The integrated circuit operates with AC voltage generated in the antenna, and can transmit signals to a reader/writer by modulating AC voltage applied to the antenna. Note that the antenna may be formed together with the integrated circuit, or may be formed separately from the integrated circuit and then electrically connected.

According to the invention, even after a thin film integrated circuit provided over a substrate is peeled from the substrate, the shape of the thin film integrated circuit can be maintained. Further, by selecting a combination of the release layer and the etchant disclosed in the invention, a peeling step can be performed in a short time and production efficiency is improved. Moreover, according to the invention, the substrate to be provided with the thin film integrated circuit can be reused, so that cost reduction can be achieved.

BRIEF DESCRIPTION OF DRAWINGS

FIGS. 11A and 11B show a peeling method of the invention.
FIGS. 14A to 14D show a peeling method of the invention.
FIG. 24 is a cross-sectional view showing a thin film integrated circuit of the invention.
FIGS. 25A and 25B are cross-sectional views showing a semiconductor device of the invention.
FIGS. 26A and 26B are cross-sectional views showing a semiconductor device of the invention.

BEST MODE FOR CARRYING OUT THE INVENTION

Figure 1A:
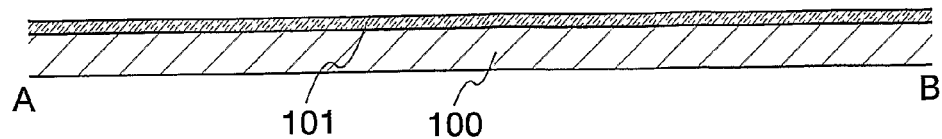
FIGS. 1A to 1E show a peeling method of the invention.

Embodiment modes and embodiments of the present invention will be described below with reference to the drawings. However, the present invention is not limited to the following description. As is easily understood by a person skilled in the art, the mode and the detail of the invention can be variously changed without departing from the purpose and the scope of the present invention. Accordingly, the present invention is not interpreted as being limited to the following description of the embodiment modes and embodiments. Note that the same reference numeral is commonly used to denote the same component among the different drawings showing the structures of the present invention described below.

The invention relates to a method for peeling a thin film integrated circuit formed over a substrate, and the peeled thin film integrated circuit can be used for a semiconductor device which can wirelessly transmit and receive data, or the like.

In the invention, as a method of peeling a thin film integrated circuit from a substrate after forming the thin film integrated circuit over the substrate, a release layer is provided at the boundary between a substrate and a thin film integrated circuit, and a peeling means is used at that part in order to peel the thin film integrated circuit after being formed over the substrate from the substrate. Accordingly, a thin film integrated circuit is once manufactured over the substrate with the release layer therebetween; thereafter, the thin film integrated circuit is separated from the substrate. Thus, the substrate can be reused after peeling the thin film integrated circuit from the substrate; therefore, the thin film integrated circuit can be manufactured and peeled at low cost. Even in the case of using, for example, a quartz substrate of which cost is higher than that of a glass substrate, cost reduction can be achieved by reuse.

In the invention, a peeling step becomes important. In other words, as the release layer can be removed in a shorter time, processing time can be further shortened and production efficiency is further increased. Therefore, a combination of the release layer formed between the substrate and the thin film integrated circuit and an etchant for removing the release layer needs to be selected with due consideration.

After peeling the thin film integrated circuit from the substrate, the thin film integrated circuit would be warped due to stress or the like. Accordingly, in the invention, the thin film integrated circuit is provided with a protective film in advance before being peeled, in order to maintain the shape of the peeled thin film integrated circuit. By forming the protective film to reinforce the thin film integrated circuit, the thin film integrated circuit can be prevented from being damaged or destroyed due to stress or the like even when physically peeled.

In the invention, a practitioner may appropriately select an optimum material of the release layer and an optimum etchant in order to peel the thin film integrated circuit manufactured over the substrate from the substrate. The thin film integrated circuit may include, for example, an LSI (large integrated circuit), a CPU (central processing unit), a memory, and the like, and can be mounted on an article after peeling for use.

Hereinafter, a method for peeling a thin film integrated circuit formed over a substrate from the substrate and a method for manufacturing a semiconductor device will be specifically explained with reference to the drawings.

Embodiment Mode 1

In this embodiment mode, a method for separating a thin film integrated circuit provided over a substrate from the substrate will be explained. Here, the case of providing a plurality of integrated circuits over a substrate and then separating the plurality of integrated circuits from the substrate will be explained with reference to drawings.

First, a substrate 100 is prepared and a release layer 101 is formed over the substrate 100 as shown in FIG. 1A. Specifically, a glass substrate of, for example, barium borosilicate glass, aluminoborosilicate glass, a quartz substrate, a ceramic substrate, or the like can be used as the substrate 100. Further, a substrate of metal of such as stainless steel or a semiconductor substrate provided with an insulating film on its surface may also be used. Although a substrate made of a flexible synthetic, such as plastics, generally tends to have lower heat-resistance than the above-described substrate, it can be used as the substrate 100 as long as it can withstand process temperature in the manufacturing step. The surface of the substrate 100 may be planarized by polishing such as a CMP method.

The release layer 101 is formed with a film containing a metal such as tungsten (W), molybdenum (Mo), niobium (Nb), or titanium (Ti), or silicon (Si), or the like. The crystalline structure of a film containing silicon may be any one of an amorphous state, a microcrystalline state, or a polycrystalline state. In this embodiment mode, a metal film containing W is used as the release layer 101. Note that W can be formed by a CVD method, a sputtering method, an electron beam method, or the like; here, it is formed by a sputtering method. In the case where the thin film integrated circuit is physically peeled from the substrate in the following step, an oxide (for example, $WO_x$) film may be formed over the metal film (for example, W) or a film comprising silicon. Other than W, Mo and $MoO_x$, Nb and $NbO_x$, Ti and $TiO_x$, or the like can be used as a combination of the metal film and the metal oxide film.

Note that, in FIG. 1A, the release layer 101 is formed directly on the substrate 100; however, a base film may be formed between the substrate 100 and the release layer 101. The base film can have a single-layer structure of an insulating film containing oxygen or nitrogen such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film or a laminated structure thereof. The base film is preferably formed between the substrate 100 and the release layer 101 particularly when there is a concern about contamination from the substrate.

Figure 1B:
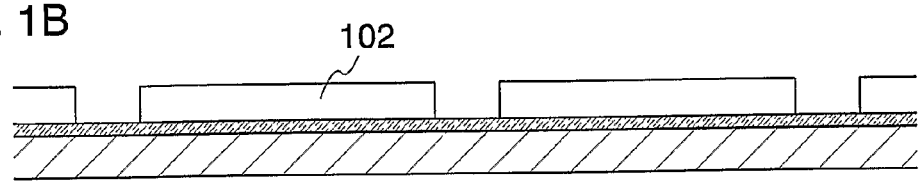

Next, a layer including an integrated circuit formed with a thin film transistor (TFT) 102 (hereinafter, referred to as a TFT layer 102) is formed over the release layer 101 (FIG. 1B). The TFT layer 102 may have any structure; for example, an LSI, a CPU, a memory, or the like can be provided.

Note that a semiconductor film included in the TFT layer 102 has a thickness of 0.2 μm or less, typically, 40 nm to 170 nm, preferably, 50 nm to 150 nm. Since such an extremely thin semiconductor film is used, the integrated circuit can be further thinned, compared with a chip formed from a silicon wafer.

Figure 1C:
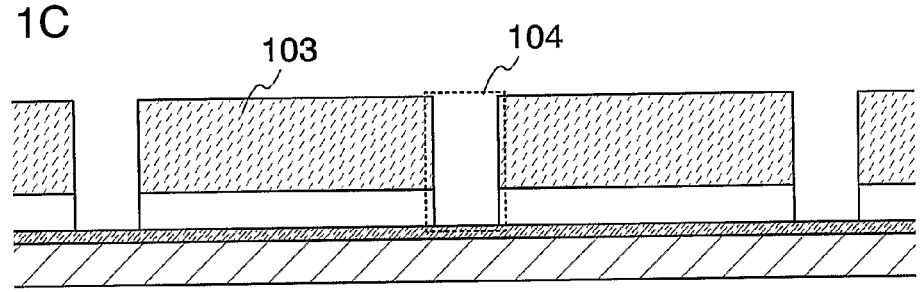
Figure 3A:
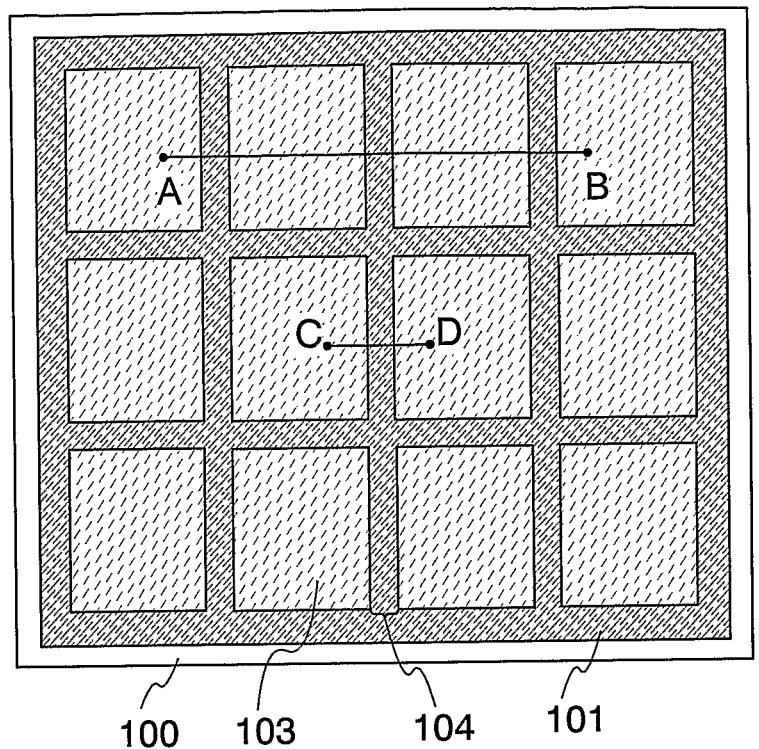
FIGS. 3A and 3B show a peeling method of the invention.

Subsequently, a protective film 103 is formed over the TFT layer 102 (FIG. 1C). When the TFT layer 102 is separated from the substrate 100, the TFT layer 102 may warp due to stress or the like and the thin film transistor included in the TFT layer may be destroyed. The more thinly the TFT 102 is formed, the more the fear of the warp in TFT layer 102 becomes noticeable. Therefore, by providing the TFT layer 102 with the protective film for reinforcement in advance before peeling the TFT layer 102 from the substrate 100, the warpage of the peeled TFT layer 102 can be prevented. Note that a schematic view of a top view in FIG. 1C is shown in FIG. 3A. FIG. 3A shows the case of forming 12 thin film integrated circuits over the substrate 100, and a cross-sectional view taken along line A-B corresponds to FIG. 1C.

For the protective film 103, a resin material such as an epoxy resin, an acrylic resin, a phenol resin, a novolac resin, a melamine resin, a urethane resin, or silicone resin can be used. Alternatively, the protective film 103 may be formed of an organic material such as benzocyclobutene, parylene, flare, or polyimide, a compound material formed by polymerization of siloxane (including a skeleton formed from a bond of silicon (Si) and oxygen (O), in which an organic group containing at least hydrogen (for example, an alkyl group or an aromatic hydrocarbon) or a fluoro group is used for a substituent, or an organic group containing at least hydrogen and a fluoro group is used for a substituent) or the like, a composition material containing a water-soluble homopolymer and a water-soluble copolymer, or the like. The protective film 103 can be formed by a screen printing method or a droplet discharge method. The droplet discharge method is a method for selectively discharging (spraying) a droplet (also referred to as a dot) of a composition including a material of a conductive film, an insulating film, or the like to form the film in an arbitrary position. The droplet discharge method includes as an inkjet method. When the etchant has resistance, an inorganic material may be used without limitation to a resin material.

Although FIG. 1 shows the case where the protective film 103 is formed over an upper surface of the TFT layer 102, the protective film 103 may be formed to cover a side face of the TFT layer 102 as well as the upper surface. In this case, the TFT layer 102 can be effectively prevented from being damaged or destroyed when the TFT layer 102 is peeled from the substrate 100. However, attention needs to be paid in this case so that the protective film 103 does not completely cover an opening 104 for introducing the etchant later.

Figure 1D:
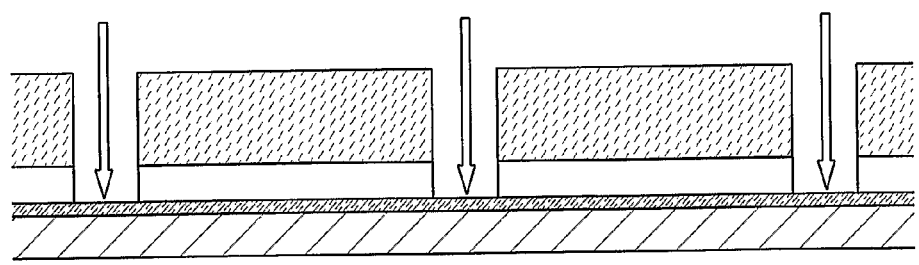
Figure 3B:
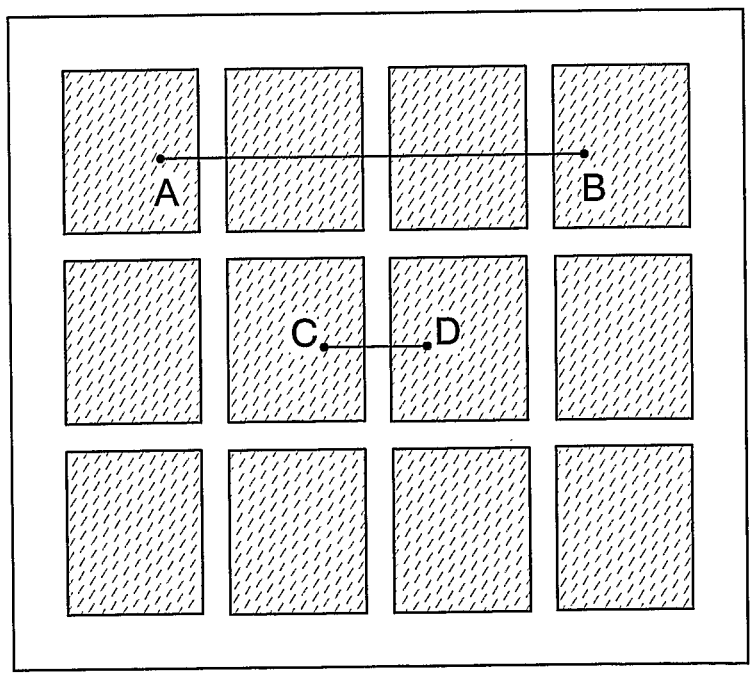

Then, the etchant is introduced into the opening 104 to remove the release layer 101 (FIGS. 1D and 3B). In this embodiment mode, the release layer is removed by chemical reaction thereof with the etchant. As the etchant, a gas or a liquid containing halogen fluoride (interhalogen compound), which easily reacts with the release layer, can be used. In this embodiment mode, a chlorine trifluoride ($ClF_3$) gas, which reacts well with W used for the release layer 102, is used. Alternatively, $CF_4$, $SF_6$, $NF_3$, $F_2$, or the like may also be used, which may be appropriately selected by a practitioner.

Figure 1E:
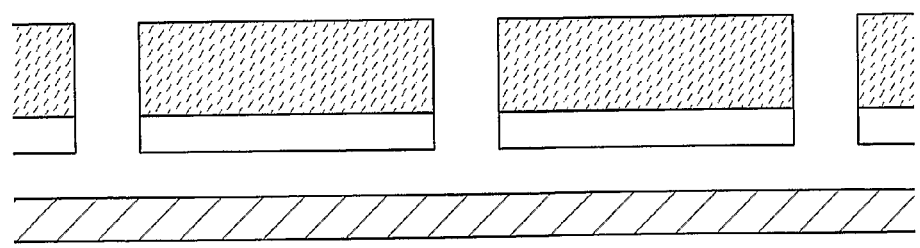

After removing the release layer 101, the substrate 100 is separated. Since the release layer 101 is completely removed in this embodiment mode, the TFT layer 102 can be separated from the substrate 100 without using a physical means (FIG. 1E).

Since the TFT layer 102 separated from the substrate 100 is provided with the protective film 103 for reinforcement, it may be mounted directly on an article or may be mounted together with a separate transfer layer to which the TFT layer is transferred. A flexible substrate is preferably used as the transfer substrate. A substrate made from a synthetic resin such as plastic typified by polyethyleneterephthalate (PET), polyethylenenaphthalate (PEN), or polyetersulfone (PES) or acrylic can be used for the flexible substrate.

A thermosetting resin, an ultraviolet curing resin, an epoxy resin, a resin additive, two-sided tape, or the like can be used as an adhesive for attaching the peeled TFT layer 102 to the flexible substrate.

As a result of transferring the peeled TFT layer 102 to the flexible substrate after peeling, the breaking strength of the thin film integrated circuit can be increased. The thin film integrated circuit can be made lightweight and thin, and flexibility thereof can be enhanced compared to a thin film integrated circuit formed over an insulating substrate. Further, the TFT layer 102 may be sealed by lamination process using a flexible substrate.

The peeled substrate 100 can be reused. Accordingly, cost reduction can be achieved in manufacturing a thin film integrated circuit using a substrate. Therefore, cost reduction can be achieved even in the case of using a quartz substrate of which cost is higher than a glass substrate. Note that, in the case of reusing a substrate, the peeling step is preferably controlled so as not to damage the substrate. However, if when the substrate is damaged, planarization process may be performed by forming an organic or inorganic resin film by a coating method or a droplet discharge method, or grinding or polishing.

In the case of thus forming a thin film integrated circuit over a substrate having an insulating surface, there is less limitation on the shape of a mother substrate, compared with the case of taking a chip out of a circular silicon wafer. Therefore, the productivity of the thin film integrated circuit is increased, and mass production can be conducted. Moreover, cost can be reduced since the insulating substrate can be reused.

Embodiment Mode 2

In this embodiment mode, a method for separating a thin film integrated circuit provided over a substrate from the substrate, which is different from that in Embodiment Mode 1, will be explained with reference to FIGS. 2A to 2D.

In this embodiment mode, steps shown in figures up to FIG. 1C can be carried out in the same manner as Embodiment Mode 1. Accordingly, the materials and the structure described in Embodiment Mode 1 are used in the steps shown in figures up to FIG. 2A.

Figure 2A:
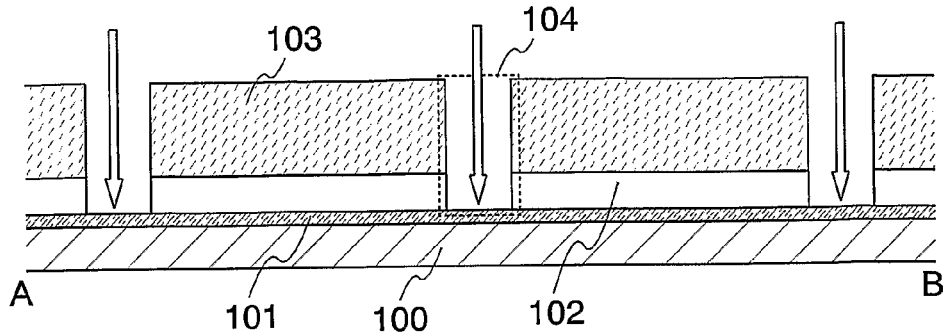
FIGS. 2A to 2D show a peeling method of the invention.
Figure 2B:
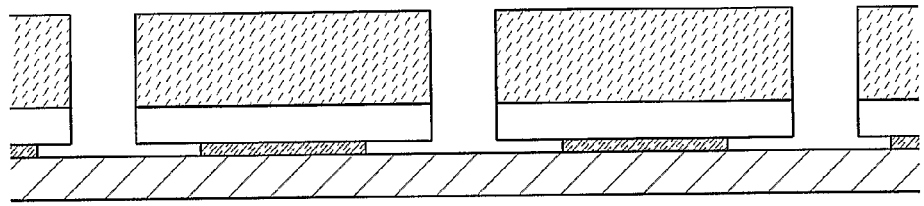

Thereafter, in this embodiment mode, an etchant is introduced into the opening 104 (FIG. 2A), and at least a part of the release layer disposed below the TFT layer 102 is left without completely removing the release layer 101 (FIG. 2B). How much of the release layer is left can be controlled by setting an etching flow rate and reaction time in consideration of reaction of the release layer with the etchant. Any material described in Embodiment Mode 1 can be used for the release layer. Note that the case of using a metal film containing W as the release layer and $ClF_3$ as the etchant is described also in this embodiment mode.

Figure 2C:
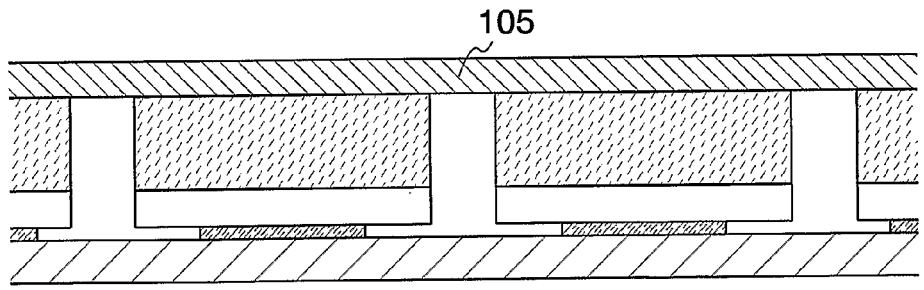

Subsequently, the TFT layer 102 is peeled from the substrate 100. In this embodiment mode, the TFT layer 102 is peeled from the substrate 100 using a physical means. Here, an auxiliary substrate 105 for peeling is formed over the protective film 103 formed to reinforce the TFT layer 102 (FIG. 2C). A thermosetting resin, an ultraviolet curing resin, an epoxy resin, a resin additive, two-sided tape, or the like can be used as an adhesive for attaching the protective film 103 to the auxiliary substrate 105. As the auxiliary substrate 105, a flexible substrate may be used. For example, a sheet material in which an adhesive is provided over a flexible film of polyester or the like can be used.

In this embodiment mode, the TFT layer 102 is peeled from the substrate 100 using a physical means. Therefore, as adhesion at the interface between the release layer 101 and the TFT layer 102 is poorer, peeling can be performed more easily, and the TFT layer is less damaged. Thus, a layer which can be easily peeled (here, the release layer 101) is preferably formed in advance between the substrate 100 and the TFT layer 102. In addition, a metal oxide film may be provided over the metal film used as the release layer as described in Embodiment Mode 1. For example, in the case of using W, Mo, or the like for the release layer, $SiO_x$ which functions as the base film is formed over W or Mo and then heat-treated so as to form $WO_x$ or $MoO_x$ on the surface of W or Mo. Thus, adhesion between the release layer and $SiO_x$ decreases by respectively forming the metal oxide film of $WO_x$ or $MoO_x$ over the metal film of W or Mo, and it becomes easier to peel the release layer. The thin film integrated circuit can be easily peeled from the substrate without completely removing the release layer.

Figure 2D:
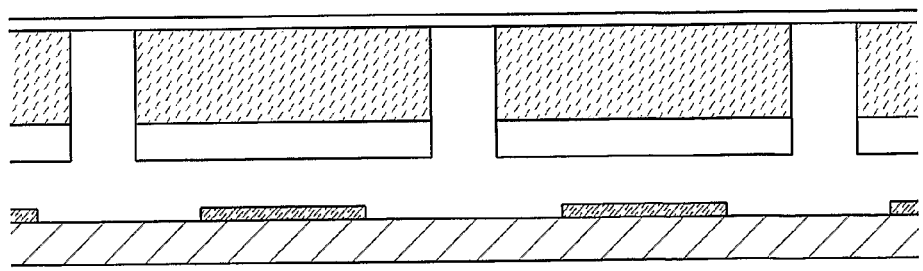

Subsequently, the TFT layer 102 is physically peeled from the substrate 100 using the auxiliary substrate 105 (FIG. 2D). Any rigid body may be used as the auxiliary substrate 105, but a flexible substrate is preferably used. For example, a substrate made of a synthetic resin such as plastic typified by polyethyleneterephthalate (PET), polyethylenenaphthalate (PEN), or polyetersulfone (PES) or acrylic can be used. A thermosetting resin, an ultraviolet curing resin, an epoxy resin, a resin additive, two-sided tape, or the like can be used as an adhesive for attaching the protective film 103 to the auxiliary substrate 105. In addition, a flexible film or tape previously provided with an adhesive surface on one surface thereof can be used as the auxiliary substrate 105 and can be attached to the protective film 103.

Through the above steps, the TFT layer 102 can be peeled from the substrate 100. By using the method described in this embodiment mode, the peeled TFT layer 102 can be obtained in a regularly arranged state as the same as before the peeling. In other words, since the peeling is performed without completely removing the release layer 101, a part of the TFT layer attached to the auxiliary substrate 105 can be obtained in an arranged state as the same as before the peeling.

After peeling the TFT layer 102 from the substrate 100, each TFT layer 102 can be taken out by selectively cutting the auxiliary substrate 105 by a dicing, scribing, or laser cutting method. Each TFT layer can be cut by using, for example, a laser which is absorbed by a glass substrate, such as a $CO_2$ laser.

When the TFT layer does not have sufficient strength, the TFT layer 102 may be transferred to a separate transfer substrate. A flexible substrate is preferable as the transfer substrate. A substrate made from a synthetic resin such as plastic typified by polyethyleneterephthalate (PET), polyethylenenaphthalate (PEN), or polyetersulfone (PES) or acrylic can be used as the flexible substrate. When the TFT layer 102 has a problem with strength, a lamination process is preferably performed.

The peeled substrate 100 can be reused. Accordingly, cost reduction can be achieved in manufacturing a thin film integrated circuit using a substrate. Therefore, cost reduction can be achieved even in the case of using a quartz substrate of which cost is higher than a glass substrate. Note that, in the case of reusing the substrate, the peeling step is preferably controlled so as not to damage the substrate. However, even when the substrate is damaged, planarization process may be performed by forming an organic or inorganic resin film by a coating method or a droplet discharge method, or grinding or polishing.

Thus, in the case of forming a thin film integrated circuit over a substrate having an insulating surface, there is less limitation on the shape of a mother substrate, compared with the case of taking a chip out of a circular silicon wafer. Therefore, the productivity of the thin film integrated circuit is increased, and mass production can be conducted. Moreover, cost can be reduced since the insulating substrate can be reused.

Note that this embodiment mode can be freely combined with the above embodiment mode.

Embodiment Mode 3

In this embodiment mode, a method for separating a thin film integrated circuit provided over a substrate from the substrate, which is different from those in the above embodiment modes, will be explained with reference to drawings. Specifically, explained is the case where a thin film integrated circuit is formed over a substrate with a release layer having an opening therebetween, and the release layer is removed, thereby peeling by a physical means the substrate and the thin film integrated circuit from each other which are attached to each other in the opening.

Figure 4A:
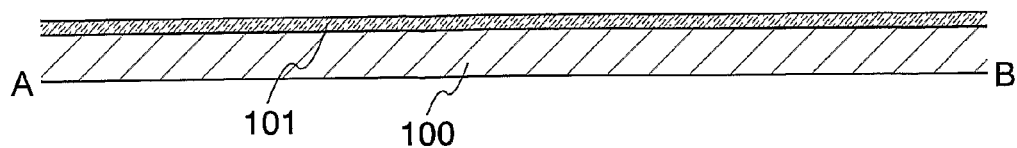
FIGS. 4A to 4E show a peeling method of the invention.

First, a release layer 101 is formed over the substrate 100 as previously shown in FIG. 1A (FIG. 4A).

Figure 4B:
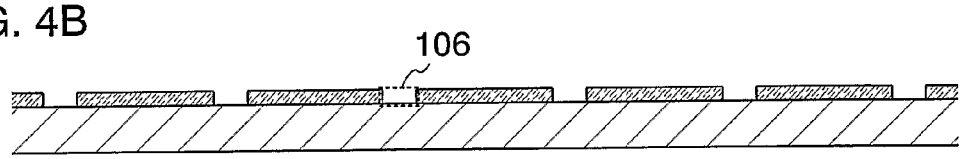
Figure 4C:
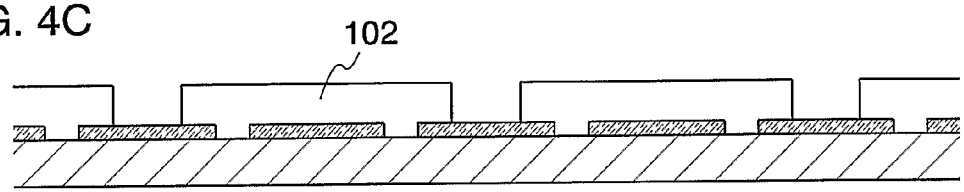

Next, the release layer 101 is etched using a photolithography technique to form a pattern having a plurality of openings 106 (FIG. 4B). Alternatively, a pattern may be formed by forming a resist by a droplet discharge method and etching the same. The droplet discharge method is a method for selectively discharging (spraying) a droplet (also referred to as a dot) of a composition including a material of a conductive film, an insulating film, or the like to form the film in an arbitrary position, and is also referred to as an inkjet method depending on its mode. Note that the opening 106 is preferably provided in a part of a TFT layer to be formed later, except in a region to be provided with a transistor.

Subsequently, a layer including an integrated circuit formed with a thin film transistor (TFT) 102 (hereinafter, referred to as a TFT layer 102) is selectively formed to cover the release layer 101 and the opening 106. The TFT layer may have any structure; for example, an LSI (large scale integrated circuit), a CPU (central processing unit), a memory, or the like can be provided.

Note that a semiconductor film in the TFT layer 102 has a thickness of 0.2 µm or less, typically 40 nm to 170 nm, preferably, 50 nm to 150 nm. Since such an extremely thin semiconductor film is used, the integrated circuit can be further thinned, compared with a chip formed from a silicon wafer.

Figure 4D:
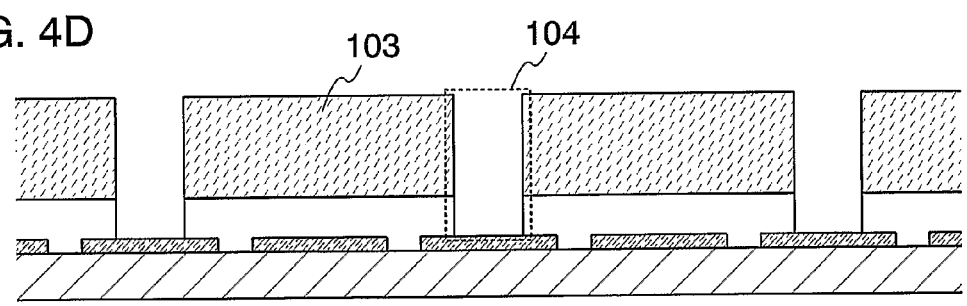
Figure 4E:
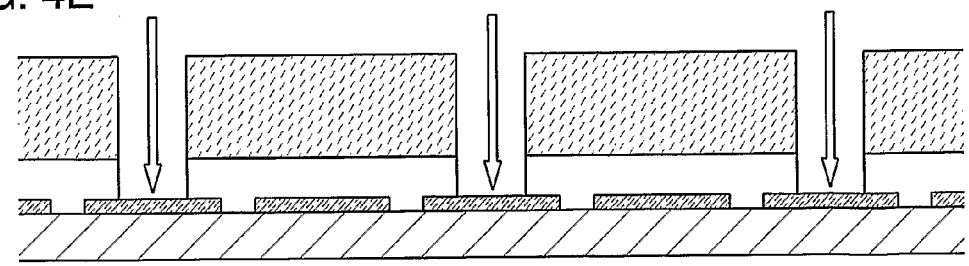
Figure 6A:
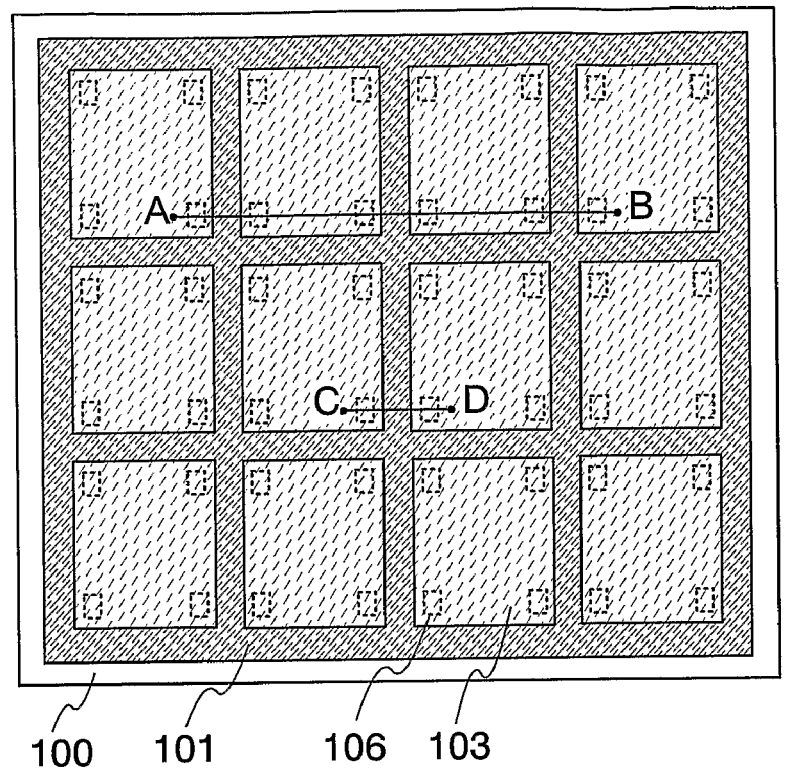
FIGS. 6A and 6B show a peeling method of the invention.

Subsequently, a protective film 103 is formed over the TFT layer 102 (FIG. 4D). When the TFT layer 102 is separated from the substrate 100, the TFT layer 102 would warp due to stress or the like and the TFT would be destroyed. The more thinly the TFT 102 is formed, the more fear of the warp in TFT layer 102 becomes noticeable. Therefore, by providing the TFT layer 102 with the protective film for reinforcement in advance before peeling, the warpage of the peeled TFT layer 102 can be prevented. Note that a top view at this time is shown in FIG. 6A. FIG. 6A shows the case of forming 12 thin film integrated circuits over the substrate 100, and a cross-sectional view taken along line A-B corresponds to FIG. 4D.

Although the protective film is formed over an upper surface of each TFT layer in FIG. 4, the protective film may be formed to cover a side face as well the an upper surface. In this case, the protective film functions more effectively when the integrated circuit is peeled. However, attention needs to be paid in this case so that the protective film 103 does not cover an opening 104 for introducing the etchant used to remove the release layer later.

Figure 5A:
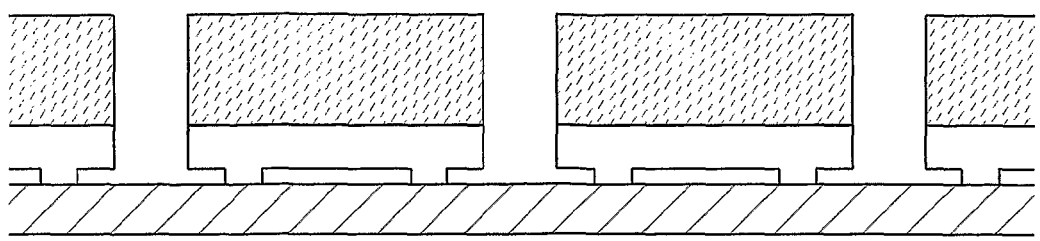
FIGS. 5A to 5C show a peeling method of the invention.
Figure 6B:
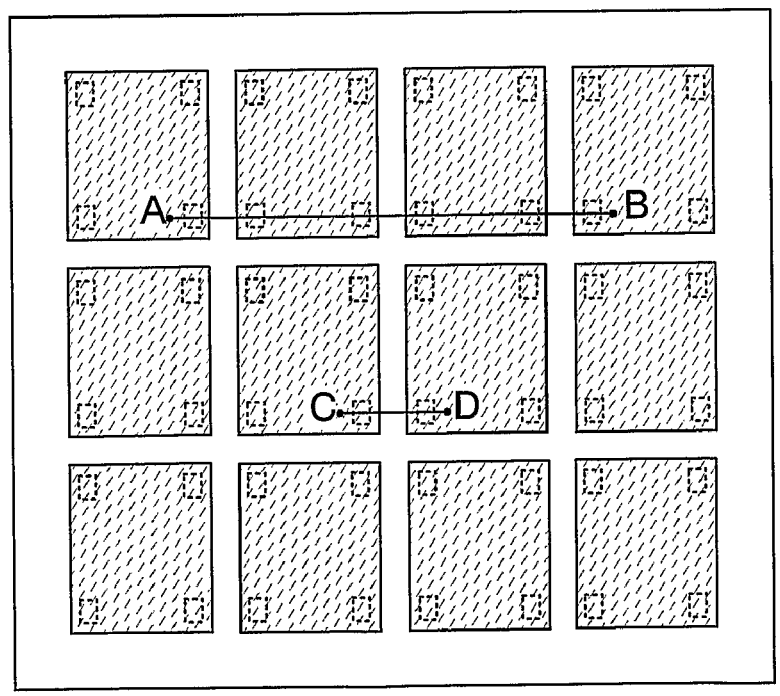

Then, the etchant is introduced into the opening 104 (FIG. 4E) to remove the release layer 101 (FIGS. 5A and 6B). In this embodiment mode, the release layer 101 is removed by chemical reaction of the release layer with the etchant. As the etchant, a gas or a liquid containing halogen fluoride (interhalogen compound), which easily reacts with the release layer, can be used. In this embodiment mode, a chlorine trifluoride ($ClF_3$) gas, which reacts well with W used for the release layer 102, is used. Alternatively, a plasma gas containing fluorine such as $CF_4$, $SF_6$, $NF_3$, $F_2$, or the like may also be used, or a strong alkaline solution such as tetramethylammonium hydroxide (TMAH) may also be used.

Figure 5B:
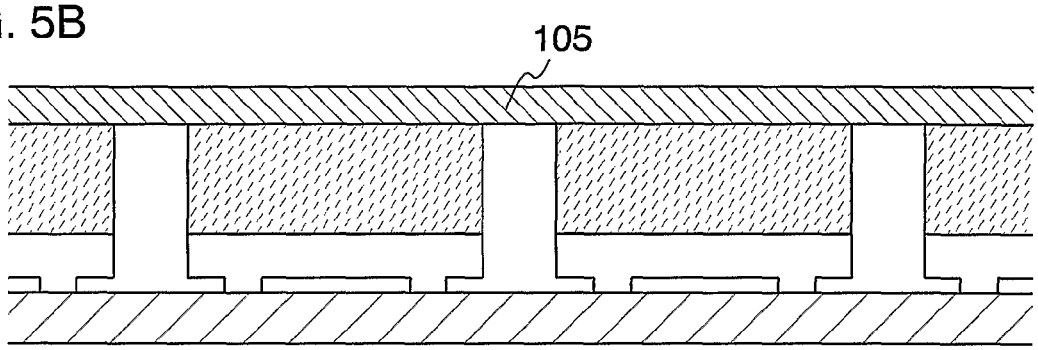

After removing the release layer 101, the substrate 100 is peeled. In this embodiment mode, the semiconductor layer 102 formed in the opening 106 is partially connected to the substrate 100 even after the release layer is completely removed (FIG. 5A). Therefore, the TFT layer 102 is separated from the substrate 100 using a physical means. Here, an auxiliary substrate 105 for peeling is formed over the protective film 103 formed to reinforce the TFT layer 102 (FIG. 5B).

Any rigid body may be used as the auxiliary substrate 105, but a flexible substrate is preferably used. For example, a substrate made of a synthetic resin such as plastic typified by polyethyleneterephthalate (PET), polyethylenenaphthalate (PEN), or polyetersulfone (PES) or acrylic can be used. A thermosetting resin, an ultraviolet curing resin, an epoxy resin, a resin additive, two-sided tape, or the like can be used as an adhesive for attaching the protective film 103 to the auxiliary substrate 105. In addition, a flexible film or tape previously provided with an adhesive surface on one surface thereof can be used as the auxiliary substrate 105 and can be attached to the protective film 103.

Figure 5C:
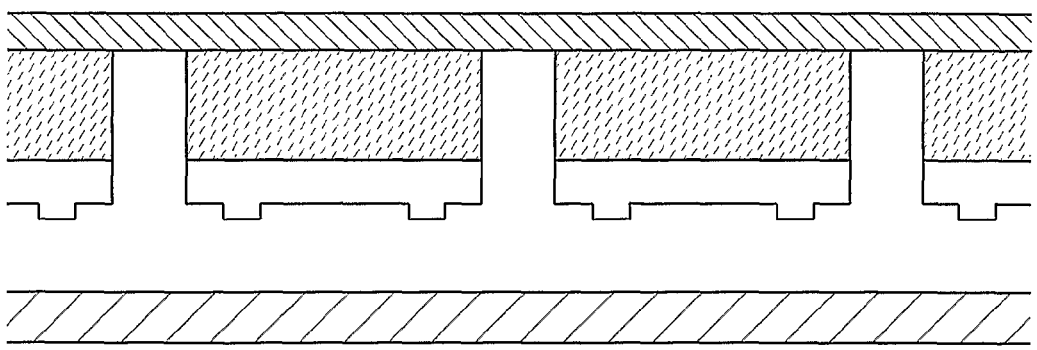

Subsequently, the TFT layer 102 is physically peeled from the substrate 100 using the auxiliary substrate 105 (FIG. 5C). Through the above steps, the TFT layer 102 can be peeled from the substrate 100. By using the method described in this embodiment mode, the TFT layer 102 even after peeling can be obtained in a regularly arranged state as the same as before the peeling, without being separated.

Since the TFT layer 102 separated from the substrate 100 is provided with the protective film 103 for reinforcement, it may be mounted directly on an article or may be mounted together with a separate transfer layer to which the TFT layer is transferred. A flexible substrate is preferably used as the transfer substrate. A substrate made from a synthetic resin such as plastic typified by polyethyleneterephthalate (PET), polyethylenenaphthalate (PEN), or polyetersulfone (PES) or acrylic can be used as the flexible substrate.

A thermosetting resin, an ultraviolet curing resin, an epoxy resin, a resin additive, two-sided tape, or the like can be used as an adhesive for attaching the flexible substrate.

As a result of transferring the thin film integrated circuit to the flexible substrate, the breaking strength of the thin film integrated circuit can be increased. The thin film integrated circuit can be made lightweight and thin, and flexibility thereof can be enhanced compared to a thin film integrated circuit formed over an insulating substrate.

The peeled substrate can be reused. Accordingly, cost reduction can be achieved in manufacturing a thin film integrated circuit. In the case of reusing a substrate, the peeling step is preferably controlled so as not to damage the substrate. However, even when the substrate is damaged, planarization process may be performed by forming an organic or inorganic resin film by a coating method or a droplet discharge method.

Thus, in the case of forming a thin film integrated circuit over a substrate having an insulating surface, there is less limitation on the shape of a mother substrate, compared with the case of taking a chip out of a circular silicon wafer. Therefore, the productivity of the thin film integrated circuit is increased, and mass production can be conducted. Moreover, cost can be reduced since the insulating substrate can be reused.

Note that this embodiment mode can be freely combined with the above embodiment modes.

Embodiment Mode 4

In this embodiment mode, a method for separating a thin film integrated circuit provided over a substrate from the substrate, which is different from those in the above embodiment modes, will be explained with reference to drawings.

Figure 7A:
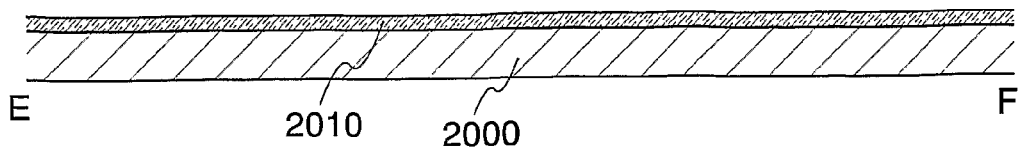
FIGS. 7A to 7E show a peeling method of the invention.

First, a substrate 2000 is prepared and a release layer 2010 is formed thereover as shown in FIG. 7A. Specifically, any of the substrate materials described in Embodiment Mode 1 can be used. The surface of the substrate 2000 may be planarized in advance by polishing such as a CMP method.

The release layer 2010 is formed using a film containing a metal such as tungsten (W), titanium (Ti), niobium (Nb), or molybdenum (Mo), or silicon (Si) or the like. The crystalline structure of a film containing silicon may be any one of an amorphous state, a microcrystalline state, or a polycrystalline state. In this embodiment mode, a metal film containing W is used as the release layer 2010. Note that W can be formed by a CVD method, a sputtering method, an electron beam method, or the like; here, it is formed by a sputtering method. In the case of physically peeling the substrate in the following step, an oxide (for example, $WO_x$) film may be formed over the film (for example, W). Alternatively, Mo and $MoO_x$, Nb and $NbO_x$, Ti and $TiO_x$, or the like can be used as a combination of the film and the oxide film. In addition, a base film may be formed between the substrate 2000 and the release layer 2010 to prevent contamination due to impurity diffusion.

Figure 7B:
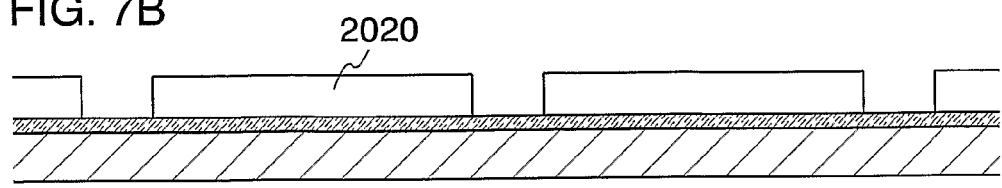

Next, a layer including an integrated circuit formed with a thin film transistor (TFT) 2020 (hereinafter, referred to as a TFT layer 2020) is selectively formed over the release layer 2010 (FIG. 7B). The TFT layer may have any structure; for example, an LSI (large scale integrated circuit), a CPU (central processing unit), a memory, or the like can be provided.

Note that a semiconductor film included in the TFT layer 2020 has a thickness of 0.2 μm or less, typically 40 nm to 170 nm, preferably, 50 nm to 150 nm. Since such an extremely thin semiconductor film is used, the integrated circuit can be further thinned, compared with a chip formed from a silicon wafer.

Figure 7C:
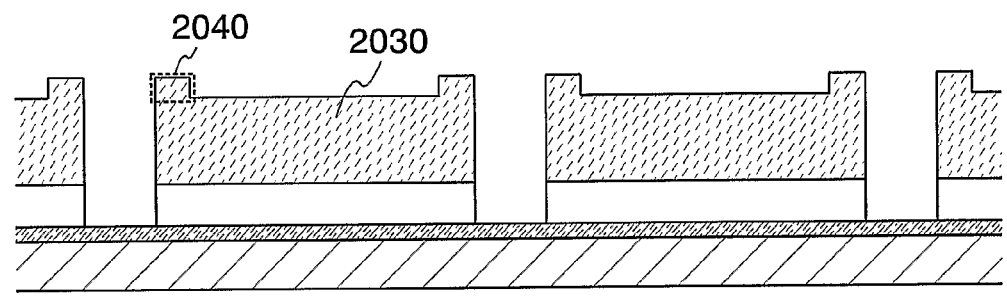

Subsequently, a protective film 2030 is formed over the TFT layer 2020 (FIG. 7C). When the TFT layer 2020 is separated from the substrate 2000, the TFT layer 2020 may warp due to stress and the TFT may be destroyed. The more thinly the TFT 2020 is formed, the more the fear of the warp in TFT layer 2020 becomes noticeable. Therefore, by providing the TFT layer 2020 with the protective film for reinforcement in advance before peeling, the warpage of the peeled TFT layer 2020 can be prevented.

Figure 9:
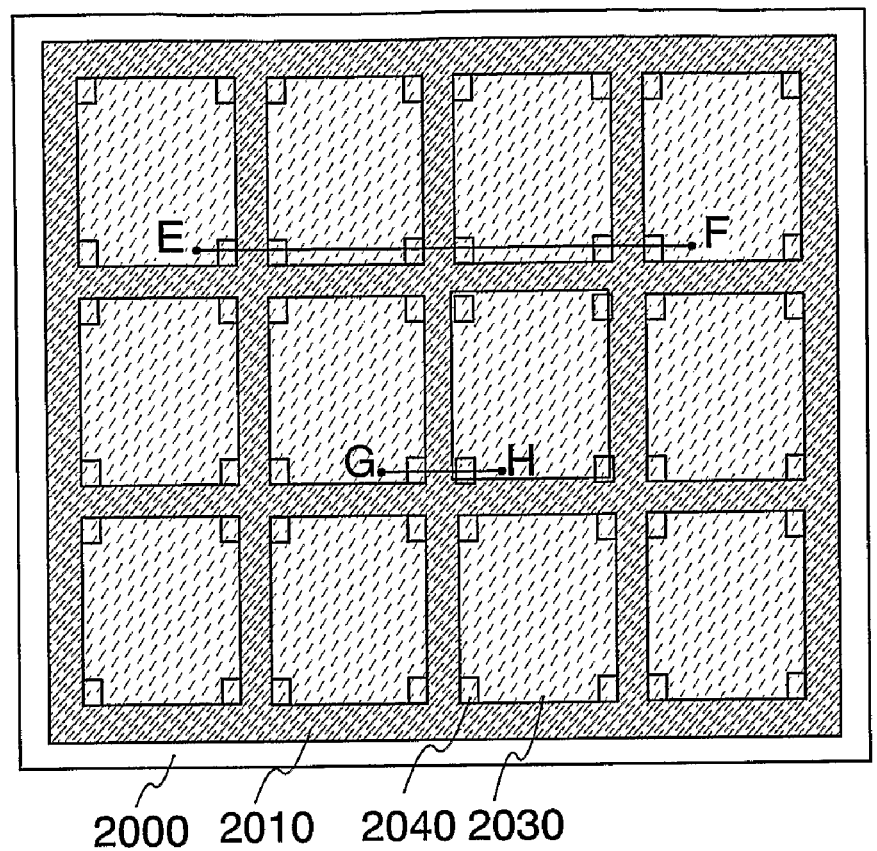
FIG. 9 shows a peeling method of the invention.

In this embodiment mode, a thick part (projection region 2040) is selectively formed in at least a part of an upper surface of the protective film 2030. The projection region 2040 is preferably formed in a part of the previously formed TFT layer, except in a region provided with a transistor. Note that the projection regions 2040 are formed at four corners of the protective film 2030, but the position and the number thereof are not limited thereto. A top view at this time is shown in FIG. 9A. FIG. 9A shows the case of forming 12 thin film integrated circuits over the substrate 2000, and a cross-sectional view taken along line E-F corresponds to FIG. 7C.

For the protective film 2030, a resin material such as an epoxy resin, an acrylic resin, a phenol resin, a novolac resin, a melamine resin, a urethane resin, or silicone resin can be used. Alternatively, the protective film 2030 may be formed from an organic material such as benzocyclobutene, parylene, flare, or polyimide, a compound material formed by polymerization of a siloxane resin or the like, a composition material containing a water-soluble homopolymer and a water-soluble copolymer, or the like. The protective film 2030 can be formed by a screen printing method or a droplet discharge method.

Although the protective film 2030 is formed over an upper surface of the TFT layer 2020 in FIG. 7C, the protective film 2030 may be formed to cover a side face as well as the upper surface. In this case, the protective film functions more effectively when the integrated circuit is peeled. However, attention needs to be paid in this case so that the protective film 2030 does not cover an opening 2050 for introducing the etchant used to remove the release layer later.

Figure 7D:
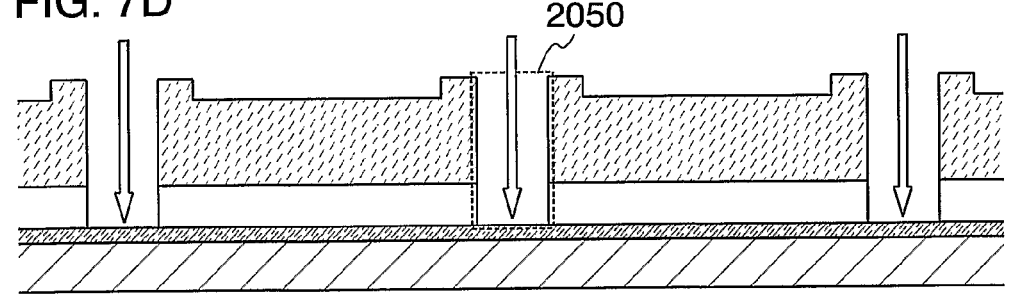
Figure 7E:
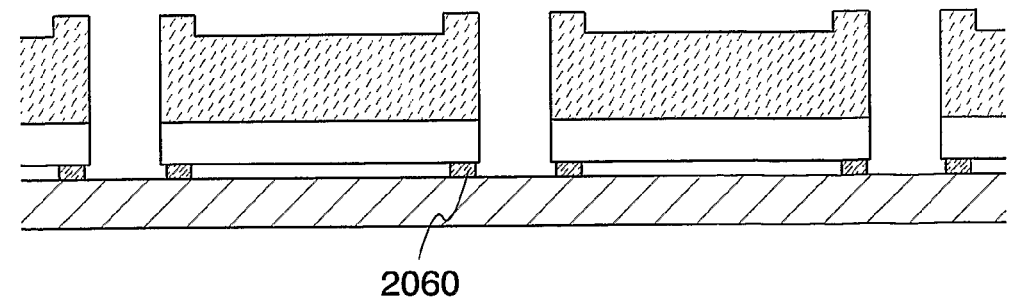

Then, the etchant is introduced into the opening 2050 (FIG. 7D) to remove the release layer 2010 (FIGS. 7E and 9B). In this embodiment mode, the release layer 2010 is removed by chemical reaction of the release layer 2010 with the etchant. As the etchant, a gas or a liquid containing halogen fluoride (interhalogen compound), which easily reacts with the release layer, can be used. In this embodiment mode, a chlorine trifluoride ($ClF_3$) gas, which reacts well with W used for the release layer 2020, is used. Alternatively, a plasma gas containing fluorine such as $CF_4$, $SF_6$, $NF_3$, $F_2$, or the like may also be used, or a strong alkaline solution such as tetramethylammonium hydroxide (TMAH) may also be used.

At this time, etching of the release layer 2010 disposed below the projection region 2040 proceeds slowly compared with the other part of the release layer. In the structure of the present invention, a rate at which etching of the release layer proceeds is inversely proportional to the thickness of the protective film formed over the release layer. In other words, the thicker the protective film is, the slower the etching rate becomes.

Therefore, the release layer below the projection region remains by providing the thick part (projection region 2040) over the protective film 2030 and adjusting etching time (FIG. 7E). In other words, the TFT layer 2020 is attached to the substrate 2000 with a remaining part 2060 of the release layer.

Figure 8A:
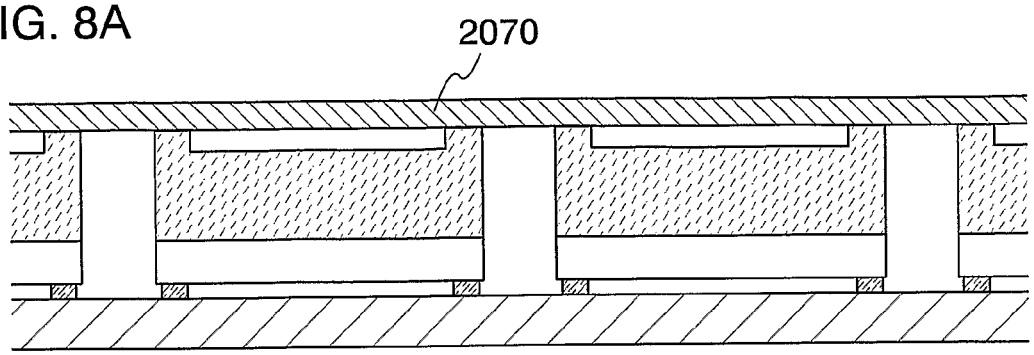
FIGS. 8A and 8B show a peeling method of the invention.

Then, the TFT layer 2020 is separated from the substrate 2000 using a physical means. Here, an auxiliary substrate 2070 for peeling is formed over the protective film 2030 formed to reinforce the TFT layer 2020 (FIG. 8A). Any rigid body may be used as the auxiliary substrate 2070, but a flexible substrate is preferably used. For example, a substrate made of a synthetic resin such as plastic typified by polyethylenterephthalate (PET), polyethylenenaphthalate (PEN), or polyetersulfone (PES) or acrylic can be used. A thermosetting resin, an ultraviolet curing resin, an epoxy resin, a resin additive, two-sided tape, or the like can be used as an adhesive for attaching the auxiliary substrate 2070 to the protective film 2030. In addition, a flexible film or tape having an adhesive surface on one surface thereof may be used as the auxiliary substrate 2070 and can be attached to the protective film 2030.

In this embodiment mode, the TFT layer 2020 is peeled from the substrate 2000 using a physical means. Therefore, as adhesion at the interface between the release layer 2010 and the TFT layer 2020 is poorer, peeling can be performed more easily, and the TFT layer is less damaged. In addition, a metal oxide film may be provided over the metal film. For example, in the case of using W, Mo, or the like for the release layer, $SiO_x$ is formed over W or Mo and then heat-treated so as to form $WO_x$ or $MoO_x$ over W or Mo. Thus, adhesion between the release layer and $SiO_x$ decreases by respectively forming the metal oxide film of $WO_x$ or $MoO_x$ over the metal film of W or Mo, and it becomes easier to peel the release layer. The thin film integrated circuit can be easily peeled from the substrate without completely removing the release layer.

Figure 8B:
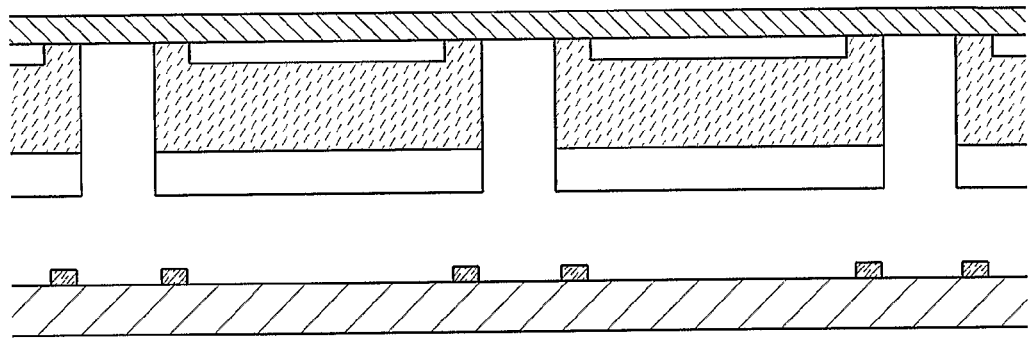

Subsequently, the TFT layer 2020 is peeled from the substrate 2000 by a physical means using the auxiliary substrate 2070 (FIG. 8B). In the case where the release layer is attached to the TFT layer 2020 after the peeling, it is preferably removed using the etchant again.

Through the above steps, the TFT layer 2020 formed over the substrate 2000 can be peeled. By using the method described in this embodiment mode, the TFT layer 2020 after peeling can be obtained in a regularly arranged state as the same as before the peeling, without being separated.

Since the TFT layer 2020 separated from the substrate 2000 is provided with the protective film 2030 for reinforcement, it may be mounted directly on an article or may be mounted together with a separate transfer layer to which the TFT layer is transferred. A flexible substrate is preferably used as the transfer substrate. A substrate made from a synthetic resin such as plastic typified by polyethyleneterephthalate (PET), polyethylenenaphthalate (PEN), or polyetersulfone (PES) or acrylic can be used as the flexible substrate.

A thermosetting resin, an ultraviolet curing resin, an epoxy resin, a resin additive, two-sided tape, or the like can be used as an adhesive for attaching the flexible substrate.

As a result of transferring the thin film integrated circuit to the flexible substrate, the breaking strength of the thin film integrated circuit can be increased. The thin film integrated circuit can be made lightweight and thin, and flexibility thereof can be improved compared to a thin film integrated circuit formed over an insulating substrate.

The peeled substrate can be reused. Accordingly, cost reduction can be achieved in manufacturing a thin film integrated circuit. In the case of reusing a substrate, the peeling step is preferably controlled so as not to damage the substrate. However, even when the substrate is damaged, a planarization process may be performed by forming an organic or inorganic resin film by a coating method or a droplet discharge method.

In the case of thus forming a thin film integrated circuit over a substrate having an insulating surface, there is less limitation on the shape of a mother substrate, compared with the case of taking a chip out of a circular silicon wafer. Therefore, the productivity of the thin film integrated circuit can be increased, and mass production can be conducted. Moreover, cost can be reduced since the insulating substrate can be reused.

Note that this embodiment mode can be freely combined with any of the above-described embodiment modes.

Embodiment 1

In this embodiment, the peeling methods described in Embodiment modes 1 and 2 will be more specifically explained with reference to drawings.

Figure 10A:
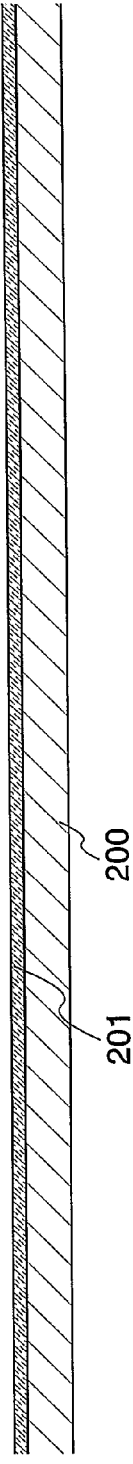
FIGS. 10A to 10D show a peeling method of the invention.

First, a release layer 201 is formed over a substrate 200 as shown in FIG. 10A. Specifically, a glass substrate of barium borosilicate glass, aluminoborosilicate glass, or the like, a quartz substrate, a ceramic substrate, or the like can be used as the substrate 200. Alternatively, a substrate of metal of such as stainless steel or a semiconductor substrate provided with an insulating film on its surface may also be used. Although a substrate made of a flexible synthetic resin, such as plastics, generally tends to have lower heat-resistance than the above-described substrate, it can be used as the substrate 200 as long as it can withstand the process temperature in the manufacturing step. The surface of the substrate 200 may be planarized by polishing such as a CMP method. Note that a quartz substrate is used as the substrate 200 in this embodiment.

As the release layer 201, a W film formed by a sputtering method to a thickness of 30 nm to 1 μm, preferably, 30 nm to 50 nm, is used. Alternatively, the W film can be formed by a CVD method as well as the sputtering method. Although a metal film containing W is used as the release layer 201 in this embodiment, another material described in the above embodiment modes may be used.

Figure 10B:
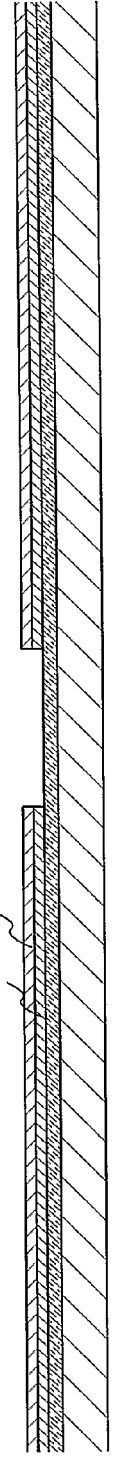

An insulating film is selectively formed over the release layer 201 in a region to be provided with a thin film integrated circuit (FIG. 10B). The insulating film can be formed to have a single-layer structure or a laminated structure. In this embodiment, it is formed to have a laminated structure of a first insulating film 202 and a second insulating film 203. For example, a silicon oxide film and a silicon oxynitride film are used as the first insulating film and the second insulating film, respectively. Alternatively, the insulating film may have a laminated structure of three layers: a silicon oxide film as the first insulating film, a silicon nitride oxide film as the second insulating film, and a silicon oxynitride film as the third insulating film. In the case where the peeling is performed in the following step using a physical means, a silicon oxide film is preferably used as the first insulating film 202 which is in direct contact with the release layer 201.

Figure 10C:
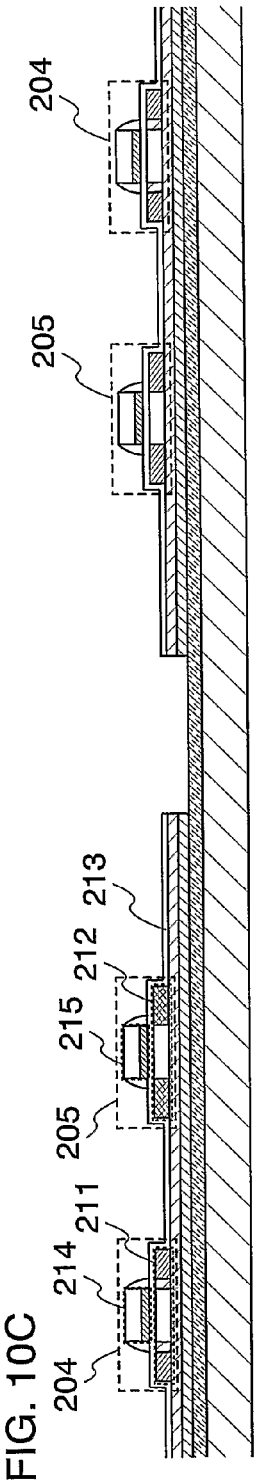

Subsequently, thin film transistors are formed over the insulating film 203 (FIG. 10C). The thin film transistors include at least semiconductor films 211 and 212 which are patterned into a desired shape, and gate electrodes 214 and 215 with an insulating film serving as a gate insulating film (gate insulating film) 213 therebetween.

The semiconductor films 211 and 212 may be in any state of an amorphous semiconductor, a SAS (Semi Amorphous Semiconductor) in which an amorphous state and a crystalline state are mixed, a microcrystalline semiconductor in which a crystal grain of 0.5 nm to 20 nm can be observed within an amorphous semiconductor, and a crystalline semiconductor.

In the case of using a substrate which can withstand the process temperature in film formation, for example, a quartz substrate, a crystalline semiconductor film may be formed over the substrate by a CVD method or the like.

In this embodiment, an amorphous semiconductor film is formed and to form a crystalline semiconductor film that is crystallized by heat treatment. A heating furnace, laser irradiation, irradiation with light emitted from a lamp in place of laser light (lamp annealing), or a combination thereof can be employed for the heat treatment.

A continuous wave laser (CW laser) or a pulsed laser can be used in the case of performing laser irradiation; one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser may be used. A crystal having a large grain size can be obtained by irradiation with one of a fundamental wave of the above laser and the second to fourth harmonics. For example, a second harmonic (532 nm) or a third harmonic (355 nm) of an Nd:$YVO_4$ laser (fundamental wave: 1064 nm) can be used. Power density of the laser at the time needs to be in the range of approximately 0.01 $MW/cm^2$ to 100 $MW/cm^2$ (preferably, 0.1 $MW/cm^2$ to 10 $MW/cm^2$). Then, laser irradiation is performed at a scanning speed of approximately 10 cm/sec to 2000 cm/sec.

Figure 18A:
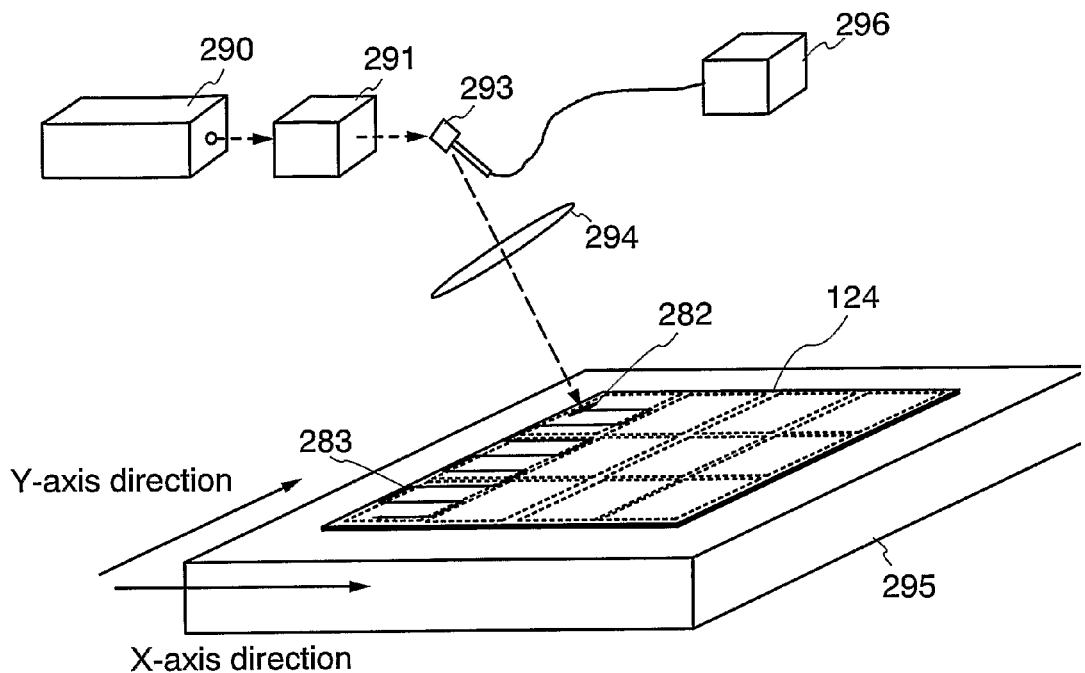
FIGS. 18A and 18B show a step of manufacturing a semiconductor device of the invention.

At the same time, crystallization is performed with a CW laser using, for example, an optical system shown in FIG. 18A. First, a CW laser beam emitted from a laser oscillator 290 is elongated by an optical system 291 and is processed into a linear shape. Specifically, a laser beam can be processed into a linear shape when the laser beam passes a cylindrical lens or a convex lens included in the optical system 291. The laser beam is preferably processed to have a spot with a long axis length of 200 μm to 350 μm.

Thereafter, the laser beam processed into a linear shape enters the semiconductor film 124 through a galvanometer mirror 293 and an fθ lens 294. At this time, the linear laser is adjusted to form a laser spot 282 having a predetermined size on the semiconductor film. In addition, the fθ lens 294 can make the shape of the laser spot 282 constant on the surface of an irradiated object, regardless of the angle of the galvanometer mirror.

At this time, a device for controlling the vibration of the galvanometer mirror (control device) 296 vibrates the galvanometer mirror, in other words, changes the angle of the mirror. The laser spot 282 is moved in one direction (for example, in an X-axis direction in the figure) (outward). For example, when the galvanometer mirror vibrates in half cycle, the laser spot is moved in an X-axis direction on the semiconductor film by a certain width.

Then, the semiconductor film is moved in a Y-axis direction by an XY stage 295. The laser spot is moved in an X-axis direction on the semiconductor film by the galvanometer mirror in the same manner (homeward). With such back-and-forth movement of the laser beam, the laser spot is moved along a pathway 283 to perform laser annealing on the entire semiconductor film.

Figure 18B:
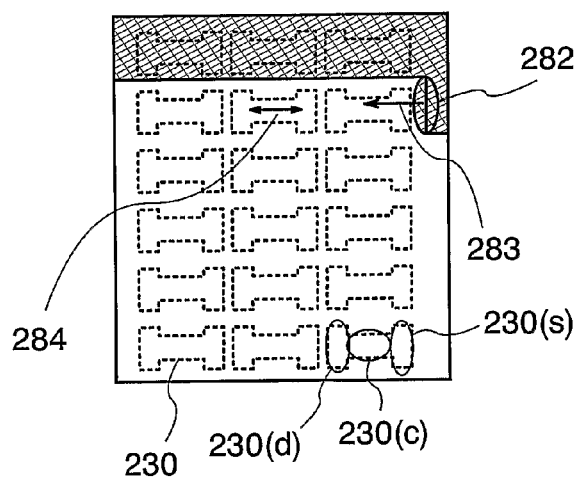

As shown in FIG. 18B, the laser annealing is performed on the thin film transistor so that a carrier flow direction 284 and a moving direction of the laser beam to a long axis (scanning direction) 283 are in the same direction. For example, in the case of a semiconductor film 230 having such a shape shown in FIG. 18B, a source region 230(*s*), a channel formation region 230(*c*), and a drain region 230(*d*) formed in the semiconductor film are arranged to be parallel to the moving direction of the laser beam to a long axis (scanning direction). Consequently, grain boundaries through which carriers pass can be reduced or eliminated; therefore, mobility of the thin film transistor can be improved.

In addition, the laser may have an incident angle θ ($0° < θ < 90°$) at the semiconductor film. Consequently, laser interference can be prevented.

The semiconductor film may be irradiated with continuous wave laser light of a fundamental wave and continuous wave laser light of a higher harmonic wave, or may be irradiated with continuous wave laser light of a fundamental wave and pulsed laser light of a harmonic. Energy can be supplemented by irradiating with plural kinds of laser light.

In the case of the pulsed laser, pulsed laser may be oscillated with such a repetition rate that the laser of the next pulse is emitted after melting the semiconductor film and before solidifying the semiconductor film. This makes it possible to obtain crystal grains which are sequentially grown in the scanning direction. In other words, it is possible to use a pulsed beam with a lower limit of a repetition rate that is set shorter than the time required for the melted semiconductor film to solidify.

Actually used is a pulsed beam with a repetition rate of 10 MHz or more which is much higher repetition rate than that of several tens to several hundreds Hz of a typically used pulsed beam.

The laser light irradiation may be performed in an inert gas atmosphere such as a noble gas or nitrogen. This can suppress roughness of a semiconductor surface due to the laser light irradiation and prevent variations in the threshold caused by variations in interface state density.

A microcrystalline semiconductor film may be formed using $SiH_4$ and $F_2$, or $SiH_4$ and $H_2$ and be then irradiated with the laser as described above for crystallization.

In the case of using a heating furnace for another heat treatment, an amorphous semiconductor film is heated at temperatures of 500° C. to 550° C. for 2 to 20 hours. At this time, the temperature may be set in multiple stages in the range of 500° C. to 550° C. so as to gradually reach a higher temperature. This is because so-called dehydrogenation can be performed to reduce film roughness during crystallization, since hydrogen and the like of the amorphous semiconductor film are released at the first low temperature heating step. When a metal element which accelerates crystallization, for example, Ni, is further formed over the amorphous semiconductor film, the heat temperature can be lowered, which is preferable. Even in the case of crystallization using such a metal element, heat treatment may be performed at high temperatures of 600° C. to 950° C.

However, in the case of forming a metal element, there is a concern that the metal element may adversely affect electric characteristics of a semiconductor element. Thus, a gettering process is required to reduce or remove the metal element. For example, such a step as to capture the metal element may be performed using the amorphous semiconductor film as a gettering sink.

Alternatively, a crystalline semiconductor film may be directly formed on a formation surface. In this case, the crystalline semiconductor film can be directly formed on a formation surface by utilizing heat or plasma with the use of a fluorine-based gas such as $GeF_4$ or $F_2$ and a silane-based gas such as $SiH_4$ or $Si_2H_6$. In the case of directly forming the crystalline semiconductor film as described above and requiring a high temperature treatment, a quartz substrate that is highly heat resistant may preferably be used.

The heat treatment of the semiconductor film is considered to affect the release layer. For example, when the heat treatment is performed using a heating furnace or laser irradiation using a wavelength of 532 nm, the energy reaches the release layer in some cases.

On the other hand, in order to effectively crystallize the semiconductor film, a base film can be formed to have such a structure that prevents the energy of a laser from reaching the release layer. For example, materials, film thickness, and laminate order of the base film are selected.

A semiconductor film formed by any of the above described methods contains more hydrogen than a chip formed with a silicon wafer. Specifically, the semiconductor film can be formed to contain hydrogen of $1\times10^{19}/cm^3$ to $1\times10^{22}/cm^3$, preferably, $1\times10^{19}/cm^3$ to $5\times10^{20}/cm^3$. The hydrogen can provide a so-called defect termination effect, which reduces defects in the semiconductor film. Further, hydrogen can increase flexibility of the thin film integrated circuit.

Further, damage or peeling of the thin film transistor due to bending stress can be prevented by making the ratio of the area of the patterned semiconductor film in the thin film integrated circuit 1% to 30%.

The gate insulating film 213 is formed to cover the semiconductor films 211 and 212. The gate insulating film 213 can be a single layer of silicon oxide, silicon nitride, silicon nitride oxide, or the like or can be formed by stacking a plurality of films thereof. A plasma CVD method, a sputtering method, or the like can be used to form the gate insulating film 213. Here, the gate insulating film 213 is formed from an insulating film containing silicon to a thickness of 30 nm to 200 nm by a sputtering method.

The gate electrodes 214 and 215 can be formed by forming a first conductive layer over the gate insulating film 213, forming a second conductive layer thereover, and patterning the first conductive layer and the second conductive layer. In this embodiment, tantalum nitride (TaN) is used for the first conductive layer and tungsten (W) is used for the second conductive layer. The TaN film may be formed by a sputtering method using a target of tantalum in a nitrogen atmosphere. The W film may be formed by a sputtering method using a target of tungsten.

In this embodiment, the first conductive layer is made from TaN and the second conductive layer is made from W. However, without limitation thereto, the first conductive layer and the second conductive layer may each be formed using an element selected from Ta, W, Ti, Mo, Al, Cu, Cr, and Nd; an alloy material or a compound material containing the element as its main component. Alternatively, a semiconductor film as typified by a polycrystalline silicon film, doped with impurity elements such as phosphorus, may be used. An AgPdCu alloy may be used instead. Combinations thereof may also be appropriately selected. The first conductive layer may be formed to have a thickness in the range of 20 nm to 100 nm. The second conductive layer may be formed to have a thickness in the range of 100 nm to 400 nm. In this embodiment, the gate electrodes are formed to have a laminated structure of two layers. Alternatively, they may have a single-layer structure or a laminated structure of three or more layers.

Subsequently, impurities imparting n-type or p-type conductivity are selectively added to the semiconductor films 211 and 212, using a gate electrode or a resist which is formed and patterned as a mask. The semiconductor films 211 and 212 each have a channel formation region and an impurity region (including a source region, a drain region, a GOLD region, and an LDD region), and can be divided into an n-channel TFT 204 or a p-channel TFT 205 depending on the conductivity of the added impurity elements.

In FIG. 10C, the n-channel TFT 204 has a sidewall on the side of the gate electrode 214, and a source region, a drain region, and an LDD region, to which impurities imparting n-type conductivity are selectively added, are formed in the semiconductor film 211. In the semiconductor film 212 of the p-channel TFT 205, a source region and a drain region, to which impurities imparting p-type conductivity are selectively added, are formed. Here, shown is a structure in which the sidewall are formed on the sides of the gate electrodes 214 and 215 and the LDD region is selectively formed in the n-channel TFT 204; however, the invention is not limited to this structure. The LDD region may also be formed in the p-channel TFT 205, and/or the sidewall may not be formed in the p-channel TFT 205.

Alternatively, a CMOS structure, in which the n-channel TFT 204 is complementarily combined with the p-channel TFT 205, may be formed. Note that impurity elements (such as boron or phosphorus) may be added in advance by doping or the like to the channel region of the semiconductor film, disposed below the gate electrode. The addition of impurity elements to the channel region in the semiconductor film can suppress threshold variation or the like and can provide a thin film transistor with good characteristics.

Figure 10D:
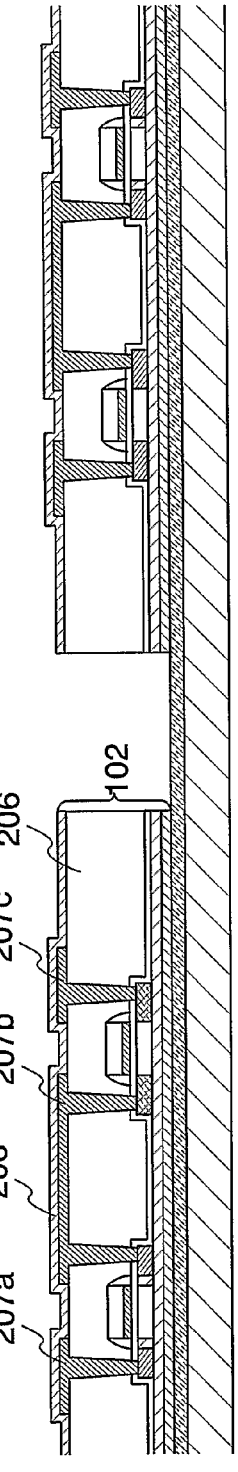

Subsequently, an interlayer insulating film 206 is formed (FIG. 10D). The interlayer insulating film 206 may be an inorganic insulating film or an organic insulating film. A silicon oxide film or a silicon oxynitride film formed by a CVD method, a silicon oxide film applied by an SOG (Spin On Glass) method, or the like may be used as the inorganic insulating film. A film of polyimide, polyamide, BCB (benzocyclobutene), acrylic, a positive photosensitive organic resin, a negative photosensitive organic resin, or the like may be used as the organic insulating film. Moreover, a laminated structure of an acrylic film and a silicon oxynitride film may be used.

A siloxane resin can also be used for the interlayer insulating film. The siloxane resin corresponds to a resin containing a Si—O—Si bond. The skeleton of siloxane is composed of a bond of silicon (Si) and oxygen (O). An organic group which contains at least hydrogen (for example, an alkyl group or aromatic hydrocarbon) may be used as the substituent. A fluoro group may also be used as the substituent. Alternatively, both an organic group which contains at least hydrogen and a fluoro group may be used.

The siloxane resin can be classified into, for example, silica glass, an alkyl siloxane polymer, an alkyl silsesquioxane polymer, a hydrosilsesquioxane polymer, a hydroalkyl silsesquioxane polymer, or the like depending on the structure. Alternatively, the interlayer insulating film may be formed from a material containing a polymer having a Si—N bond (polysilazane).

With the use of the above material, an interlayer insulating film with sufficient insulating properties and planarity can be obtained even if the thickness is thin. Further, the above material is highly resistant to heat; thus, an interlayer insulating film which can withstand the reflow process in a multilayer wiring can be obtained. Further, an interlayer insulating film with less dehydration can be formed due to low hygroscopicity of the material.

In this embodiment, a siloxane resin is used to form the interlayer insulating film 206. Irregularities on the substrate due to TFTs can be reduced and planarized using the interlayer insulating film 206. The interlayer insulating film 206 specifically functions to planarize; thus, an insulating film is preferably formed with a material which can be easily planarized.

In addition, a first passivation film may be formed before forming the interlayer insulating film 206. An insulating film containing silicon is formed as the passivation film to have a thickness of 100 nm to 200 nm. A plasma CVD method or a sputtering method may be used to form the passivation film.

Alternatively, a silicon oxynitride hydride film formed from SiH$_4$, N$_2$O, and H$_2$ may be used as the passivation film. Naturally, the passivation film can be formed to have a single-layer structure or a laminated structure.

Further, a second passivation film of a silicon nitride oxide film or the like may be formed after forming the interlayer insulating film 206. The second passivation film may be formed to a thickness of approximately 10 nm to 200 nm, which can protect the interlayer insulating film 206 from moisture. Alternatively, a silicon nitride film, an aluminum nitride film, an aluminum oxynitride film, a diamond-like carbon (DLC) film, or a carbon nitride (CN) film can be used as the second passivation film.

Next, the interlayer insulating film 206 is etched to form contact holes reaching the source regions and drain regions. Subsequently, wirings 207a to 207c, each of which is electrically connected to each source region and each drain region, are formed. The wirings 207a to 207c may each have a single-layer structure or a laminated structure including an element selected from Al, Ni, C, W, Mo, Ti, Pt, Cu, Ta, Au, and Mn, or an alloy containing a plurality of the elements. Here, the wirings 207a to 207c are preferably formed with a metal film containing Al. In this embodiment, a laminated film of a Ti film and an alloy film containing Al and Ti is patterned to form the wirings 207a to 207c. Naturally, the wirings may have a single-layer structure or a laminated structure of three or more layers without being limited to the two-layer structure. Further, the material of the wirings is not limited to a laminated film of Al and Ti. For example, a laminated film, in which an Al film or a Cu film is formed over a TaN film, and a Ti film is further formed thereover, may be patterned to form the wirings 207a to 207c.

Then, an insulating film 208 is formed to cover the wirings 207a to 207c. An insulating film containing oxygen or nitrogen such as a silicon oxide (SiO$_x$) film, a silicon nitride (SiN$_x$) film, a silicon oxynitride (SiO$_x$N$_y$) (x>y) film, or a silicon nitride oxide (SiN$_x$O$_y$) (x>y) film (x,y=1, 2, ...) can be used as the insulating film 208. Typically, a silicon nitride oxide (SiN$_x$O$_y$) film is preferably used. Alternatively, a resin film may be used.

Subsequently, a protective film 209 is formed over the insulating film 208 as shown in FIG. 11A. For the protective film 209, a resin material such as an epoxy resin, an acrylic resin, a phenol resin, a novolac resin, a melamine resin, a urethane resin, or a silicone resin can be used. Alternatively, the protective film 209 may be formed from an organic material such as benzocyclobutene, parylene, flare, or permeable polyimide, a compound material formed by polymerization of a siloxane resin or the like, a composition material containing a water-soluble homopolymer and a water-soluble copolymer, or the like. The protective film 209 can be formed by a screen printing method or a droplet discharge method. Note that, in this embodiment, the protective film 209 is formed by a screen printing method using an epoxy resin.

A TFT layer 102 when peeled from the substrate 200 can be prevented from warping by providing the protective film 209.

Figure 21:
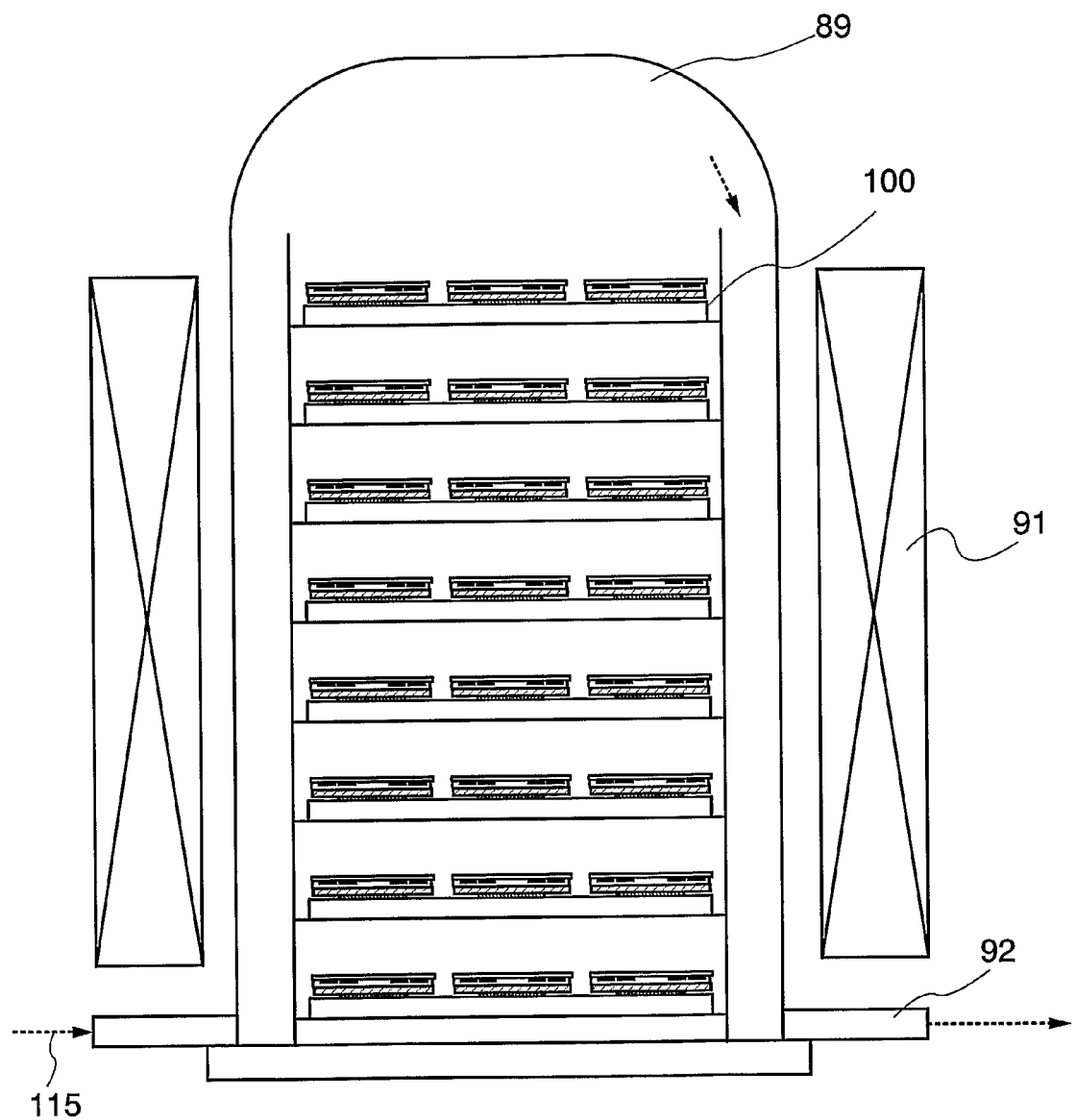
FIG. 21 shows a manufacturing apparatus of a semiconductor device of the invention.

Thereafter, the release layer 201 is completely removed. In this embodiment, the release layer is removed by chemical reaction thereof with an etchant. As shown in FIGS. 11A and 11B, the release layer is removed by introducing a gas or a liquid containing halogen fluoride as the etchant. Here, the release layer is removed using an apparatus provided with a pressure reducing means, a pressurizing means, and a temperature control means as shown in FIG. 21 under the following conditions: etchant, ClF$_3$ (chlorine trifluoride); temperature, room temperature to 150° C.; and flow rate, 50 sccm; and pressure, 9 Torr (about 1200 Pa). However, the conditions are not limited thereto. The apparatus shown in FIG. 21 has a bell jar 89 which enables treatment of a plurality of the substrates 200. ClF$_3$ gas 115 is introduced through a gas inlet tube, and unnecessary gas is expelled through an exhaust pipe 92. Further, a heating means, for example, a heater 91 may be provided on the side face of the apparatus.

As shown in FIG. 11A, a gas or a liquid containing halogen fluoride is introduced into an opening 104. When a processing temperature is in the range of 100° C. to 300° C. using a heating means, the reaction rate can be increased. Consequently, the consumption of a ClF$_3$ gas can be reduced and processing time can be shortened.

An etchant, gas flow rate, temperature, and the like are determined so that each layer of the TFT layer 102 is not etched. Since the ClF$_3$ gas used in this embodiment has a characteristic of selectively etching W, it selectively removes W which is the release layer. Therefore, a layer formed from a metal film containing W is used as the release layer and an insulating film containing oxygen or nitrogen is used as the base film. Since difference in the reaction rate between the release layer and the base film is large, meaning that the selectivity is high, the release layer can be easily removed with the TFT layer 102 protected. In this embodiment, the TFT layer 102 is not etched by ClF$_3$ due to the insulating films which are provided above and below the TFT layer and edge portions of the interlayer insulating film, the gate insulating film, the wiring, and the like which are exposed on the side face.

Note that ClF$_3$ can be generated through the process of Cl$_2$(g)+3F$_2$(g)→2ClF$_3$ (g) by the reaction of chlorine with fluorine at a temperature of 200° C. or more. ClF$_3$ (boiling point: 11.75° C.) may be liquid in some cases depending on the temperature of the reaction field. In that case, wet etching can also be employed.

A gas of ClF$_3$ or the like mixed with nitrogen may be used as another gas containing halogen fluoride.

The etchant is not limited to ClF$_3$ or halogen fluoride as long as it etches the release layer and it does not etch the base film. For example, a plasma gas containing fluorine such as CF$_4$, SF$_6$, NF$_3$, or F$_2$ can be used. A strong alkaline solution such as tetramethylammonium hydroxide (TMAH) may be used as another etchant.

The combination of the release layer and the base film is not limited to the above-described material as long as the material that is selectively etched is used for the release layer and a material that is not etched is used for the base film in the case of chemically removing the release layer with a gas containing halogen fluoride such as ClF$_3$.

Subsequently, the substrate 200 is peeled after removing the release layer 201. In the case of completely removing the release layer 201, the substrate 200 can be separated from the TFT layer 102 without using a physical means (FIG. 11B).

On the other hand, a method for separating the TFT layer 102 from the substrate 200 without completely removing the release layer is shown in FIGS. 12A to 12C and 13A to 13C.

Figure 12A:
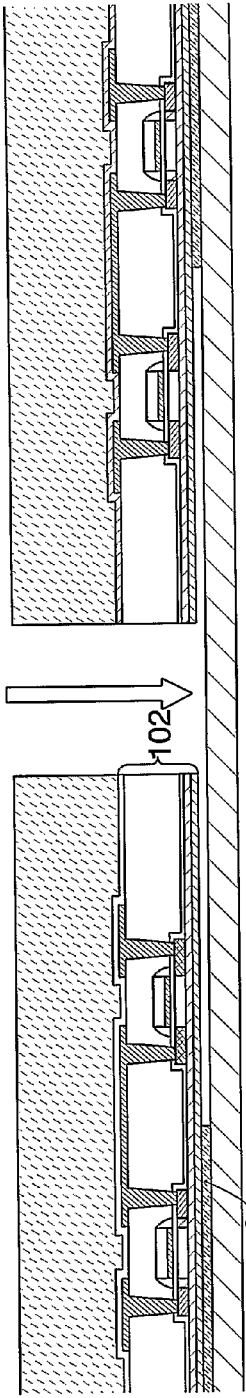
FIGS. 12A to 12C show a peeling method of the invention.

In FIG. 12A, after similar formation up to the step shown in FIG. 11A, an etchant is introduced into an opening 104 and a part of a release layer 221 is left without being completely removed. How much of the release layer 221 is left can be controlled by adjusting the etchant flow rate and reaction time.

Figure 12B:
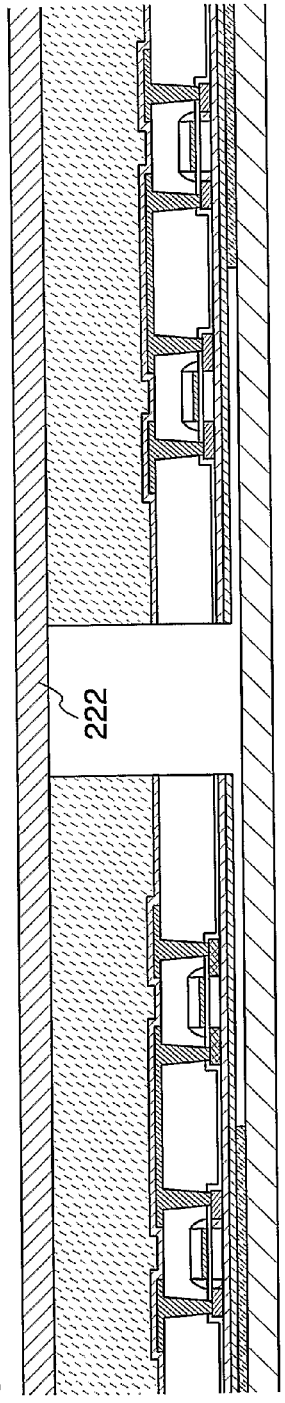

Thereafter, an auxiliary substrate 222 is provided over the protective film 209 (FIG. 12B). As the auxiliary substrate 222, a quartz substrate or a flexible substrate is used. When a flexible substrate is used, it can be attached to the protective film 209 with a flexible film having an adhesive on one surface. In this case, an adhesive such as a thermosetting resin, an ultraviolet curing resin, an epoxy or acrylic resin, or a resin additive, or tape can be used as the adhesive for attaching the auxiliary substrate 222 to the protective film 209.

Figure 12C:
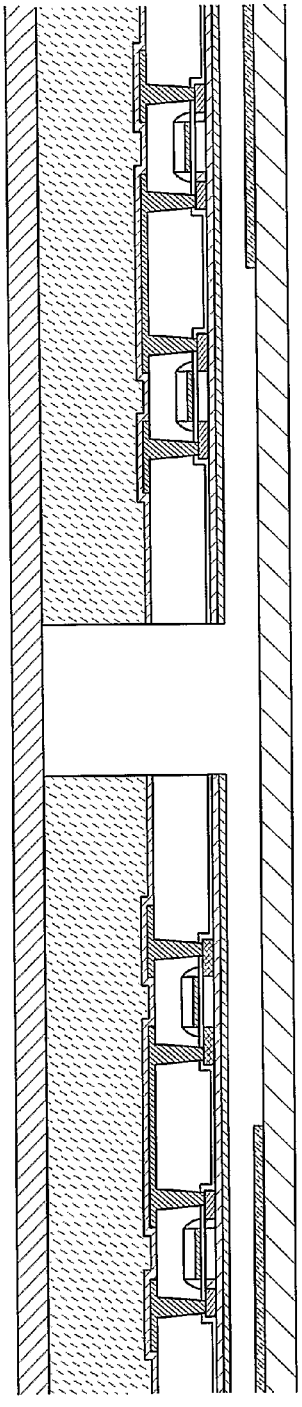

Then, the TFT layer 102 is physically peeled from the substrate 200 using the auxiliary substrate 222 (FIG. 12C). Through the above steps, the TFT layer 102 can be peeled from the substrate 200. Since the TFT layer can be peeled from the substrate, by using this method, without completely removing the release layer, the processing time of the peeling step can be shortened. The peeled TFT layer 102 can be obtained in a regularly arranged state as the same as before the peeling. In other words, since the peeling is performed without completely removing the release layer 221, the TFT layer attached to the auxiliary substrate 222 can be obtained in an arranged state as the same as before the peeling. Therefore, the processing time can be shortened also in the following step.

Since the TFT layer 102 peeled from the substrate 200 is provided with the protective film 209 for reinforcement, it may be directly mounted on an article or may be mounted together with a separate transfer layer to which the TFT layer is transferred. The case of transferring the TFT layer 102 to a separate transfer substrate is shown in FIGS. 13A to 13C.

Figures 13A, 13B, 13C:
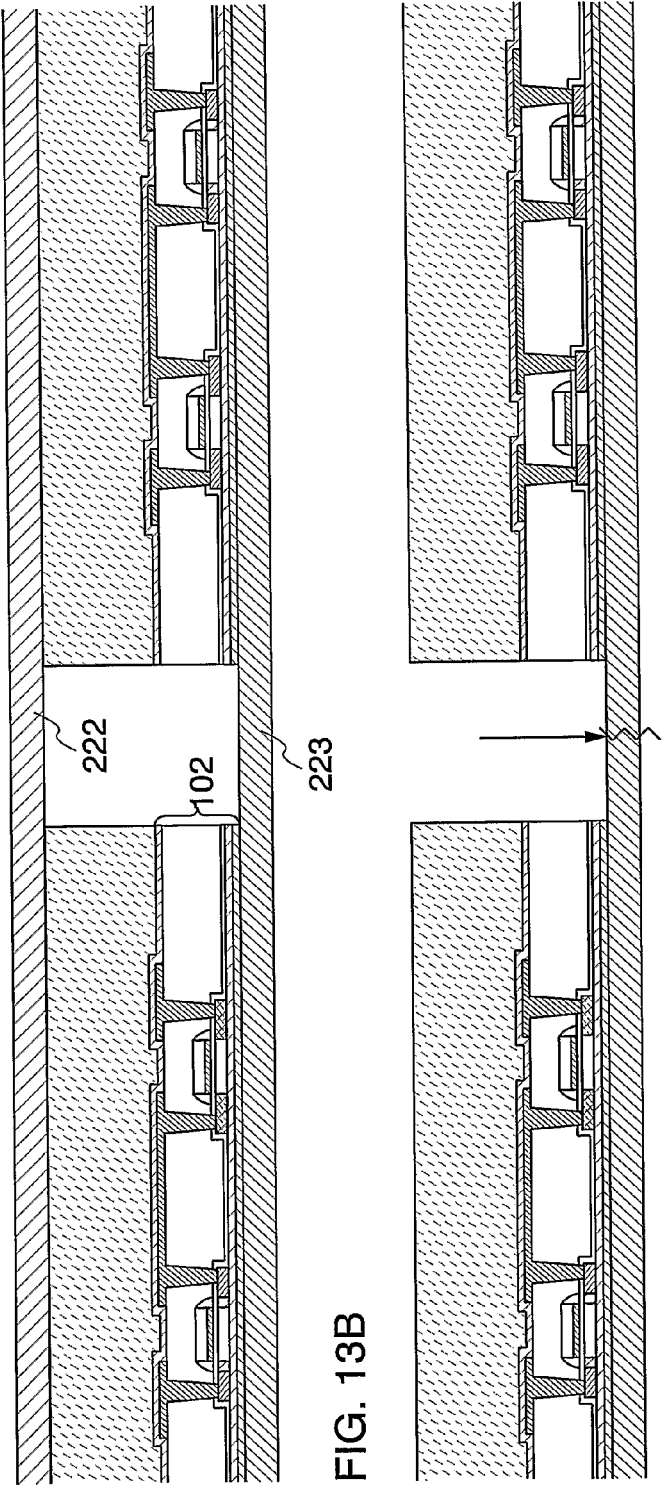
FIGS. 13A to 13C show a peeling method of the invention.

As shown in FIG. 13A, the peeled TFT layer 102 is attached to a transfer substrate 223. As the transfer substrate 223, a flexible substrate is preferably used. A substrate made of a synthetic resin such as plastic typified by polyethyleneterephthalate (PET), polyethylenenaphthalate (PEN), or polyetersulfone (PES) or acrylic can be used as the flexible substrate. When the TFT layer 102 has a problem with strength, a lamination process is preferably performed.

Thereafter, the auxiliary substrate 222 is peeled and the transfer substrate 223 is selectively cut by a dicing, scribing, or laser cutting method (FIG. 13B), thereby separating the thin film integrated circuits from each other (FIG. 13C). Here, the thin film integrated circuits are cut using a $CO_2$ laser which is absorbed by a glass substrate. The TFT layer 102 may be provided with an organic resin such as an epoxy resin around the side face or the like for reinforcement. Consequently, the TFT layer 102 can be protected from the external, and the mechanical strength can be more improved.

The peeled substrate 200 can be reused. Accordingly, cost reduction can be achieved in manufacturing a thin film integrated circuit using a substrate. For example, a quartz substrate has advantages of good planarity, high heat-resistance, and the like; however, it has a problem of high cost. But, by reusing the substrate, cost reduction can be achieved even in the case of using a quartz substrate of which cost is higher than a glass substrate.

Figure 31A:
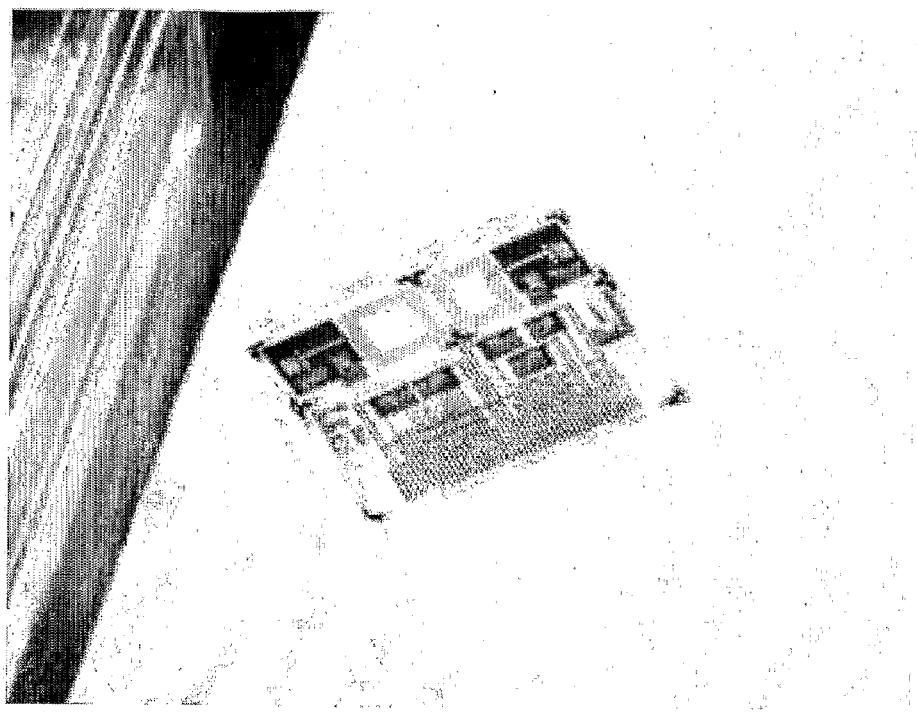
FIGS. 31A and 31B are photographs of a semiconductor device of the invention.
Figure 31B:
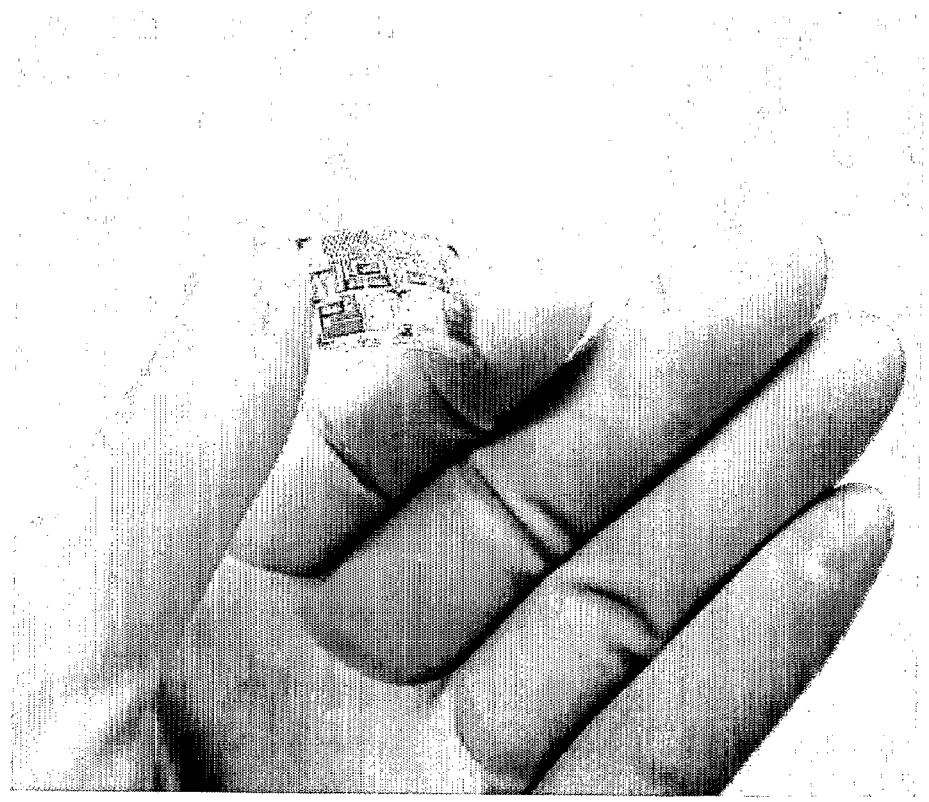

FIGS. 31A and 31B are photographs of the thin film integrated circuit described in this embodiment. FIG. 31A is a photograph of a thin film integrated circuit which is sealed after being peeled from the substrate. The thin film integrated circuit was peeled by completely removing the release layer. In other words, the thin film integrated circuit shown here was manufactured using the method explained in Embodiment Mode 1. Since the thin film integrated circuit is provided with the semiconductor layer and the protective film as described in the above embodiment modes, it can have a curved shape as shown in FIG. 31B.

Note that this embodiment can be freely combined with the above embodiment modes.

Embodiment 2

In this embodiment, the peeling methods described in Embodiment Mode 3 and 4 will be more specifically explained with reference to drawings.

The structure and the peeling method described in Embodiment Mode 3 are more specifically shown in FIGS. 14A to 14D and 15A to 15C.

First, as shown in FIG. 14A, a release layer 301 is formed over a substrate 300. Specifically, a glass substrate of barium borosilicate glass, aluminoborosilicate glass, or the like, a quartz substrate, a ceramic substrate, or the like can be used as the substrate 300. Alternatively, a substrate of metal of such as stainless steel or a semiconductor substrate provided with an insulating film on its surface may also be used. Although a substrate made of a flexible synthetic resin, such as plastics, generally tends to have lower heat-resistance than the abovedescribed substrate, it can be used as the substrate 300 as long as it can withstand the process temperature in the manufacturing step. The surface of the substrate 300 may be planarized by polishing such as a CMP method. Note that a glass substrate is used as the substrate 300 in this embodiment.

As the release layer 301, a W film formed by a sputtering method to have a thickness of 30 nm to 1 μm, preferably, 30 nm to 50 nm, is used. Alternatively, the W film can be formed by a CVD method as well as the sputtering method. Although a metal film containing W is used as the release layer 301 in this embodiment, the other material described in the above embodiment modes may be used.

Subsequently, the release layer 301 is selectively etched to form a pattern (FIG. 14B). The pattern can be formed by photolithography, a droplet discharge method, or the like. In this embodiment, the release layer 301 is etched by photolithography to form a pattern including a plurality of openings 306 (FIG. 14B). Alternatively, the pattern may be formed by a droplet discharge method. In that case, a resist can be directly formed and a mask becomes unnecessary. Note that the opening 306 is preferably provided in a part of a TFT layer to be formed later, except in a region to be provided with a transistor.

Then, a semiconductor layer is formed over the release layer 301 (FIG. 14C). The semiconductor layer includes at least an insulating film, a semiconductor film, a gate insulating film, a gate electrode, an interlayer insulating film, and a wiring. A specific peeling method will be explained below.

First, an insulating film is selectively formed over the release layer 301 in a region to be provided with a thin film integrated circuit. The insulating film can be formed to have a single-layer structure or a laminated structure. In this embodiment, it is formed to have a laminated structure of a first insulating film 302 and a second insulating film 303. For example, a silicon oxide film and a silicon oxynitride film are used as the first insulating film and the second insulating film, respectively. Alternatively, the insulating film may have a laminated structure of three layers: a silicon oxide film as the first insulating film, a silicon nitride oxide film as the second insulating film, and a silicon oxynitride film as the third insulating film. In the case where peeling is performed in the following step using a physical means, a silicon oxide film is preferably used as the first insulating film which is in direct contact with the release layer 301. In the opening 306 at this time, the first insulating film 302 is in direct contact with the substrate 300.

Subsequently, a thin film transistor is formed over the insulating film 303. The thin film transistor includes at least semiconductor films 311 and 312 which are patterned into a desired shape, and gate electrodes 314 and 315 with an insulating film serving as a gate insulating film (gate insulating film) 313 therebetween.

The semiconductor films 311 and 312 may be in any state of an amorphous semiconductor, a SAS in which an amorphous state and a crystalline state are mixed, a microcrystalline semiconductor in which a crystal grain of 0.5 nm to 20 nm can be observed within an amorphous semiconductor, and a crystalline semiconductor.

In the case of using a substrate which can withstand the process temperature in film formation, for example, a quartz substrate, a crystalline semiconductor film may be formed over the substrate by a CVD method or the like.

In this embodiment, an amorphous semiconductor film is formed and to form a crystalline semiconductor film that is crystallized by heat treatment. A heating furnace, laser irradiation, irradiation with light emitted from a lamp in place of laser light (lamp annealing), or a combination thereof can be employed for the heat treatment.

A continuous wave laser (CW laser) or a pulsed laser (pulsed laser) can be used in the case of performing laser irradiation; one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. A crystal having a large grain size can be obtained by irradiation with one of a fundamental wave of the above laser and the second to fourth harmonics. For example, a second harmonic (532 nm) or a third harmonic (355 nm) of an Nd:$YVO_4$ laser (fundamental wave: 1064 nm) can be used. Power density of the laser at the time needs to be in the range of approximately 0.01 $MW/cm^2$ to 100 $MW/cm^2$ (preferably, 0.1 MW/cm to 10 $MW/cm^2$). Then, laser irradiation is performed at a scanning speed of approximately 10 cm/sec to 2000 cm/sec.

At this time, crystallization can be performed with a CW laser using, for example, an optical system shown in FIG. 18A.

In the case of using a heating furnace for another heat treatment, an amorphous semiconductor film is heated at temperatures of 500° C. to 550° C. for 2 to 20 hours. At this time, the temperature may be set in multiple stages in the range of 500° C. to 550° C. so as to gradually reach a higher temperature. This is because so-called dehydrogenation can be performed to reduce film roughness during crystallization, since hydrogen and the like of the amorphous semiconductor film are released at the first low temperature heating step. When a metal element which accelerates crystallization, for example, Ni, is further formed over the amorphous semiconductor film, the heat temperature can be lowered, which is preferable. Even in the case of crystallization using such a metal element, heat treatment may be performed at high temperatures of 600° C. to 950° C.

However, in the case of forming a metal element, there is a concern that the metal element may adversely affect electric characteristics of a semiconductor element. Thus, a gettering process is required to reduce or remove the metal element. For example, such a step as to capture the metal element may be performed using the amorphous semiconductor film as a gettering sink.

Alternatively, a crystalline semiconductor film may be directly formed on a formation surface. In this case, the crystalline semiconductor film can be directly formed on a formation surface by utilizing heat or plasma with the use of a fluorine-based gas such as $GeF_4$ or $F_2$ and a silane-based gas such as $SiH_4$ or $Si_2H_6$. In the case of directly forming the crystalline semiconductor film as described above and requiring a high temperature treatment, a quartz substrate that is highly heat resistant may preferably be used.

The heat treatment of the semiconductor film is considered to affect the release layer. For example, when the heat treatment is performed using a heating furnace or laser irradiation using a wavelength of 532 nm, the energy reaches the release layer in some cases.

On the other hand, in order to effectively crystallize the semiconductor film, the base film can be formed to have a structure that prevents the energy of a laser from reaching the release layer. For example, materials, film thickness, and laminate order of the base film can be selected.

A semiconductor film formed by any of the above described methods contains more hydrogen than a chip formed with a silicon wafer. Specifically, the semiconductor film can be formed to contain hydrogen of $1 \times 10^{19}/cm^3$ to $1 \times 10^{22}/cm^3$, preferably, $1 \times 10^{19}/cm^3$ to $5 \times 10^{20}/cm^3$. The hydrogen can provide a so-called defect termination effect, which reduces defects in the semiconductor film. Further, the hydrogen can increase flexibility of the thin film integrated circuit.

Further, damage or peeling of the thin film transistor due to bending stress can be prevented by making the ratio of an area of the patterned semiconductor film in the thin film integrated circuit 1% to 30%.

The gate insulating film 313 is formed to cover the semiconductor films 311 and 312. The gate insulating film 313 can be a single layer of silicon oxide, silicon nitride, silicon nitride oxide, or the like or can be formed by stacking a plurality of films thereof. A plasma CVD method, a sputtering method, or the like can be used to form the gate insulating film 313. Here, the gate insulating film 313 is formed from an insulating film containing silicon to a thickness of 30 nm to 200 nm by a sputtering method.

The gate electrodes 314 and 315 can be formed by forming a first conductive layer over the gate insulating film 313, forming a second conductive layer thereover, and patterning the first conductive layer and the second conductive layer. In this embodiment, tantalum nitride (TaN) is used for the first conductive layer and tungsten (W) is used for the second conductive layer. The TaN film may be formed by a sputtering method using a target of tantalum in a nitrogen atmosphere. The W film may be formed by a sputtering method using a target of tungsten.

In this embodiment, the first conductive layer is made from TaN and the second conductive layer is made from W. However, without limitation thereto, the first conductive layer and the second conductive layer may each be formed using an element selected from Ta, W, Ti, Mo, Al, Cu, Cr, and Nd; an alloy material or a compound material containing the element as its main component. Alternatively, a semiconductor film as typified by a polycrystalline silicon film, doped with impurity elements such as phosphorus, may be used. An AgPdCu alloy may be used instead. Combinations thereof may also be appropriately selected. The first conductive layer may be formed to a thickness in the range of 20 nm to 100 nm. The second conductive layer may be formed to a thickness in the range of 100 nm to 400 nm. In this embodiment, the gate electrodes are formed to have a laminated structure of two layers. Alternatively, they may have a single-layer structure or a laminated structure of three or more layers.

Subsequently, impurities imparting n-type or p-type conductivity are selectively added to the semiconductor films 311 and 312, using the gate electrode or a resist which is formed and patterned as a mask. The semiconductor films 311 and 312 each have a channel formation region and an impurity region (including a source region, a drain region, a GOLD region, and an LDD region), and can be distinguish from an n-channel TFT 304 and a p-channel TFT 305 depending on the conductivity of the added impurity elements.

In FIG. 14C, the n-channel TFT 304 has a sidewall on the side of the gate electrode 314, and a source region, a drain region, and an LDD region, to which impurities imparting n-type conductivity are selectively added, are formed in the semiconductor film 311. In the semiconductor film 312 of the p-channel TFT 305, a source region and a drain region, to which impurities imparting p-type conductivity are selectively added, are formed. Here, shown is a structure in which sidewalls are formed on the sides of the gate electrodes 314 and 315 and the LDD region is selectively formed in the n-channel TFT 304; however, the invention is not limited to this structure. The LDD region may also be formed in the p-channel TFT 305, and/or the sidewall may not be formed in the p-channel TFT 305.

Alternatively, a CMOS structure, in which the n-channel TFT 304 is complementarily combined with the p-channel TFT 305, may be formed. Note that impurity elements may be added in advance by doping or the like to the channel region of the semiconductor film. The addition of impurity elements to the channel region in the semiconductor film can suppress threshold variation or the like and can provide a thin film transistor with good characteristics.

Subsequently, an interlayer insulating film 307 is formed. The interlayer insulating film 307 may be an inorganic insulating film or an organic insulating film. A silicon oxide film or a silicon oxynitride film formed by a CVD method, a silicon oxide film applied by an SOG (Spin On Glass) method, or the like may be used as the inorganic insulating film. A film of polyimide, polyamide, BCB (benzocyclobutene), acrylic, a positive photosensitive organic resin, a negative photosensitive organic resin, or the like may be used as the organic insulating film. Moreover, a laminated structure of an acrylic film and a silicon oxynitride film may be used.

A siloxane resin may also be used for the interlayer insulating film.

The siloxane resin can be classified into, for example, silica glass, an alkyl siloxane polymer, an alkyl silsesquioxane polymer, a hydrosilsesquioxane polymer, a hydroalkyl silsesquioxane polymer, or the like depending on the structure. Alternatively, the interlayer insulating film may be formed from a material containing a polymer having a Si—N bond (polysilazane).

With the use of the above material, an interlayer insulating film with sufficient insulating properties and planarity can be obtained even if the thickness is thin. Further, the above material is highly resistant to heat; thus, an interlayer insulating film which can withstand the reflow process in a multilayer wiring can be obtained. Further, an interlayer insulating film with less dehydration can be formed due to low hygroscopicity of the material.

In this embodiment, a siloxane resin is used to form the interlayer insulating film 307. Irregularities on the substrate due to TFTs can be reduced and planarized using the interlayer insulating film 307. The interlayer insulating film 307 specifically functions to planarize; thus, an insulating film is preferably formed with a material which can be easily planarized.

In addition, a first passivation film may be formed before forming the interlayer insulating film 307. An insulating film containing silicon is formed as the passivation film to a thickness of 100 nm to 200 nm. A plasma CVD method or a sputtering method may be used to form the passivation film. Alternatively, a silicon oxynitride hydride film formed from $SiH_4$, $N_2O$, and $H_2$ may be used as the passivation film. Naturally, the passivation film can be formed to have a single-layer structure or a laminated structure.

Further, a second passivation film of a silicon nitride oxide film or the like may be formed after forming the interlayer insulating film 307. The second passivation film may be formed to a thickness of approximately 10 nm to 200 nm, which can protect the interlayer insulating film 307 from moisture. Alternatively, a silicon nitride film, an aluminum nitride film, an aluminum oxynitride film, a diamond-like carbon (DLC) film, or a carbon nitride (CN) film can be used as the second passivation film.

Next, the interlayer insulating film 307 is etched to form contact holes reaching the source regions and drain regions (FIG. 14D). Subsequently, wirings 308a to 308c, each of which is electrically connected to each source region and each drain region, are formed. The wirings 308a to 308c may each have a single-layer structure or a laminated structure including an element selected from Al, Ni, C, W, Mo, Ti, Pt, Cu, Ta, Au, and Mn, or an alloy containing a plurality of the elements. Here, the wirings 308a to 308c are preferably formed with a metal film containing Al. In this embodiment, a laminated film of a Ti film and an alloy film containing Al and Ti is patterned to form the wirings 308a to 308c. Naturally, the wirings may have a single-layer structure or a laminated structure of three or more layers without being limited to the two-layer structure. Further, the material of the wirings is not limited to a laminated film of Al and Ti. For example, a laminated film, in which an Al film or a Cu film is formed over a TaN film, and a Ti film is further formed thereover, may be patterned to form the wirings 308a to 308c.

Then, an insulating film 309 is formed to cover the wirings 308a to 308c. An insulating film containing oxygen or nitrogen such as a silicon oxide ($SiO_x$) film, a silicon nitride ($SiN_x$) film, a silicon oxynitride ($SiO_xN_y$) (x>y) film, or a silicon nitride oxide ($SiN_xO_y$) (x>y) film can be used as the insulating film 309. Typically, a silicon nitride oxide ($SiN_xO_y$) film is preferably used.

Subsequently, a protective film 310 is formed over the insulating film 309. For the protective film 310, a resin material such as an epoxy resin, an acrylic resin, a phenol resin, a novolac resin, a melamine resin, a urethane resin, or a silicone resin can be used. Alternatively, the protective film 310 may be formed from an organic material such as benzocyclobutene, parylene, flare, or permeable polyimide, a compound material formed by polymerization of a siloxane resin or the like, a composition material containing a water-soluble homopolymer and a water-soluble copolymer, or the like. The protective film 310 can be formed by a screen printing method or a droplet discharge method. Note that, in this embodiment, the protective film 310 is formed by a screen printing method using an epoxy resin.

A TFT layer 102 when peeled from the substrate 300 can be prevented from warping by providing the protective film 310.

Thereafter, the release layer 301 is completely removed. In this embodiment, the release layer is removed by chemical reaction thereof with an etchant.

As shown in FIG. 14D, a gas or a liquid containing halogen fluoride is introduced into an opening 322. When a processing temperature is in the range of 100° C. to 300° C. using a heating means, the reaction rate can be increased. Consequently, the consumption of a $ClF_3$ gas can be reduced and processing time can be shortened.

An etchant, gas flow rate, temperature, and the like are determined so that each layer of the TFT layer 102 is not etched. Since the $ClF_3$ gas used in this embodiment has a characteristic of selectively etching W, it selectively removes W which is the release layer. Therefore, a layer formed from a metal film containing W is used as the release layer and an insulating film containing oxygen or nitrogen is used as the base film. Since difference in the reaction rate between the release layer and the base film is large, meaning that the selectivity is high, the release layer can be easily removed with the TFT layer 102 protected. In this embodiment, the TFT layer 102 is not etched by $ClF_3$ due to the insulating films which are provided above and below the TFT layer and edge portions of the interlayer insulating film, the gate insulating film, the wiring, and the like which are exposed on the side face.

Note that $ClF_3$ can be generated through the process of $Cl_2(g)+3F_2(g) \rightarrow 2ClF_3$ (g) by the reaction of chlorine with fluorine at a temperature of 200° C. or more. $ClF_3$ (boiling point: 11.75° C.) may be liquid in some cases depending on the temperature of the reaction field. In that case, wet etching can also be employed.

A gas of $ClF_3$ or the like mixed with nitrogen may be used as another gas containing halogen fluoride.

The etchant is not limited to $ClF_3$ or halogen fluoride as long as it etches the release layer and it does not etch the base film. For example, a plasma gas containing fluorine such as $CF_4$, $SF_6$, $NF_3$, or $F_2$ can be used. A strong alkaline solution such as tetramethylammonium hydroxide (TMAH) may be used as another etchant.

The combination of the release layer and the base film is not limited to the above-described material as long as the material that is selectively etched is used for the release layer and a material that is not etched is used for the base film in the case of chemically removing the release layer with a gas containing halogen fluoride such as $ClF_3$.

Figure 15A:
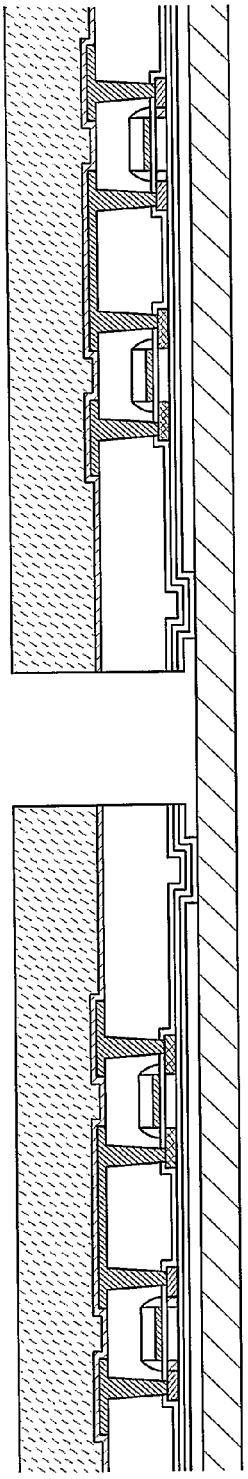
FIGS. 15A to 15C show a peeling method of the invention.

Subsequently, the substrate 300 is peeled after removing the release layer 301. In this embodiment, the insulating film included in the TFT layer 102 is attached to the substrate 300 in the opening 306 even after completely removing the release layer 301 (FIG. 15A). Therefore, the TFT layer 102 is peeled from the substrate 300 by using a physical means. A specific method thereof will be described below.

Figure 15B:
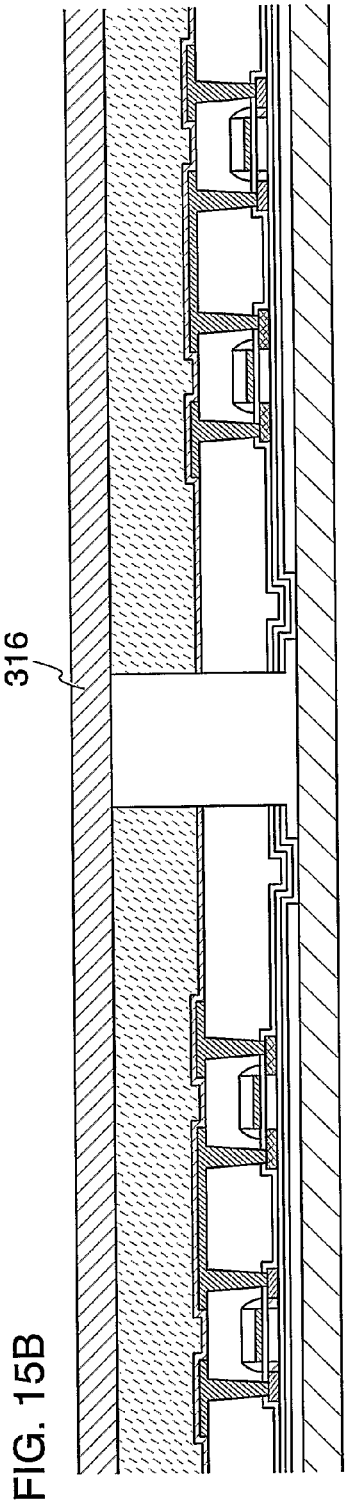

As shown in FIG. 15B, an auxiliary substrate 316 is provided over the protective film 310. As the auxiliary substrate 316, a quartz substrate or a flexible substrate is used. In the case where a flexible substrate is used, it can be attached to the protective film 310 with a flexible film having an adhesive on one surface. In this case, an adhesive such as a thermosetting resin, an ultraviolet curing resin, an epoxy or acrylic resin, or a resin additive, tape, or the like can be used as the adhesive for attaching the auxiliary substrate 316 to the protective film 310.

Figure 15C:
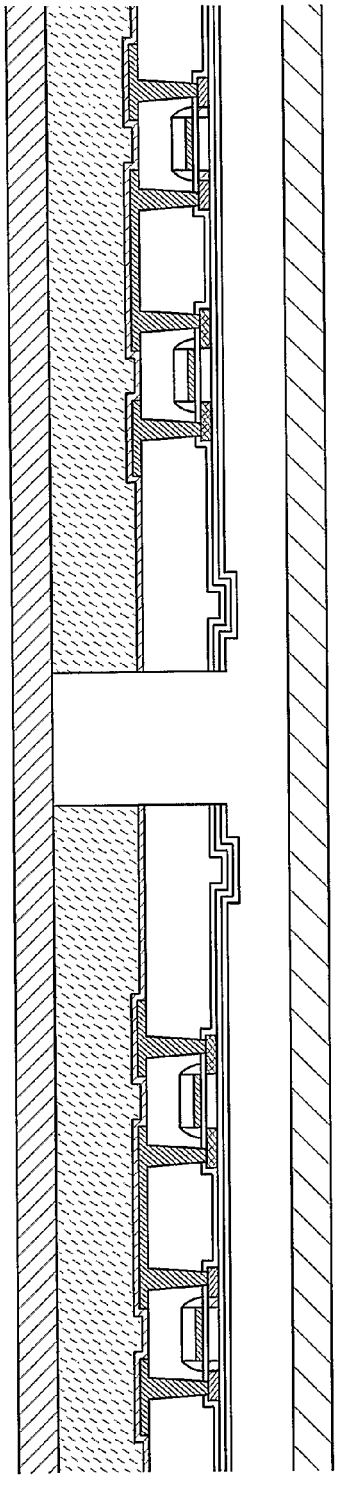

Then, the TFT layer 102 is physically peeled from the substrate 300 using the auxiliary substrate 316 (FIG. 15C). Through the above steps, the TFT layer 102 can be peeled from the substrate 300.

Next, the peeling method described in Embodiment Mode 4 will be explained with reference to FIGS. 16A to 16C and 17A to 17C.

Figure 16A:
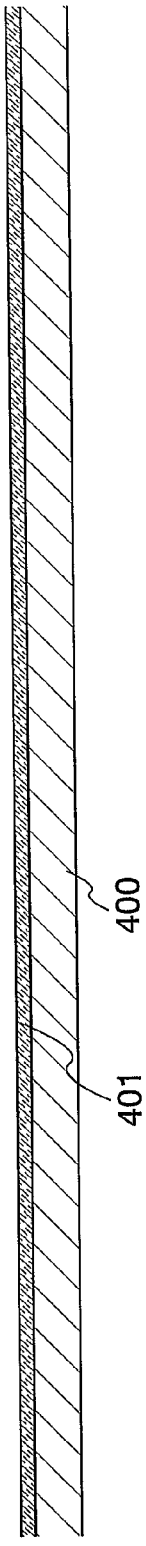
FIGS. 16A to 16C show a peeling method of the invention.

First, as shown in FIG. 16A, a substrate 400 is prepared, and a release layer 401 is formed over the substrate 400.

Figure 16B:
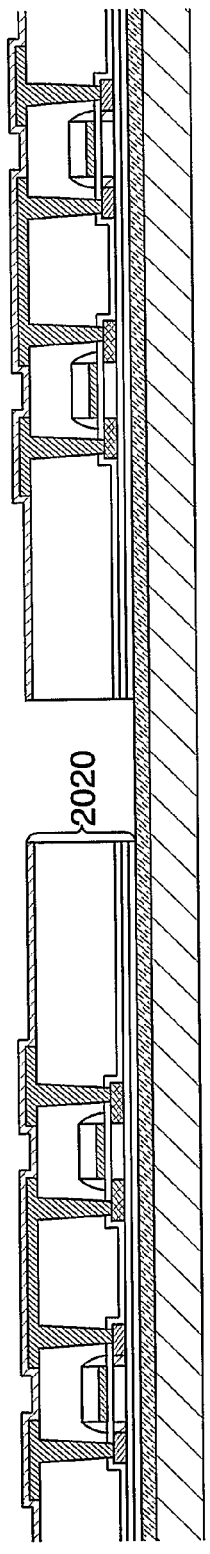
Figure 16C:
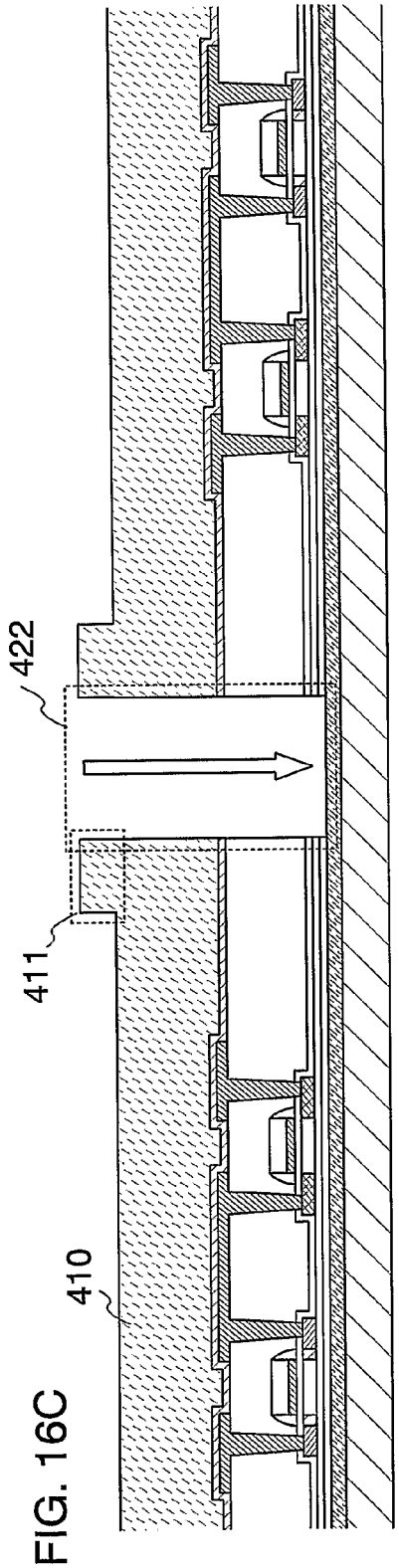

Subsequently, a TFT layer 2020 is formed over the release layer 401 without patterning the release layer 401 (FIG. 16B).

A protective film 410 is formed over the TFT layer 2020. In this embodiment, a thicker part (projection region 411) than the other part is provided at an end of the protective film 410. The projection region 411 is formed to be thicker than the other part of the protective film 410. The projection region 411 may be formed with the same material as the protective film 410, or only the projection region 411 may be separately formed with a different material. The projection region 411 can be easily formed by using a droplet discharge method. In this embodiment, described is an example in which the projection region 411 is formed at an end of the protective film 410. However, the position and the number thereof are not limited thereto, and the projection region is preferably formed in a part of the protective film 410 below which there is no thin film transistor.

Figure 17A:
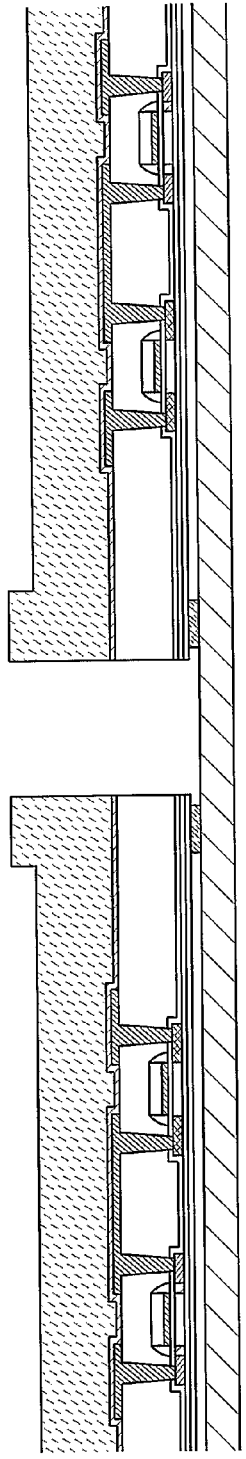
FIGS. 17A to 17C show a peeling method of the invention.

Subsequently, an etchant is introduced into an opening 422 (FIG. 16C) to remove the release layer 401 (FIG. 17A). At this time, the release layer disposed except below the projection region 411 is removed by controlling the etchant flow rate and reaction time. The release layer 401 disposed below the projection region 411 can be selectively left since etching proceeds slowly in the part.

Figure 17B:
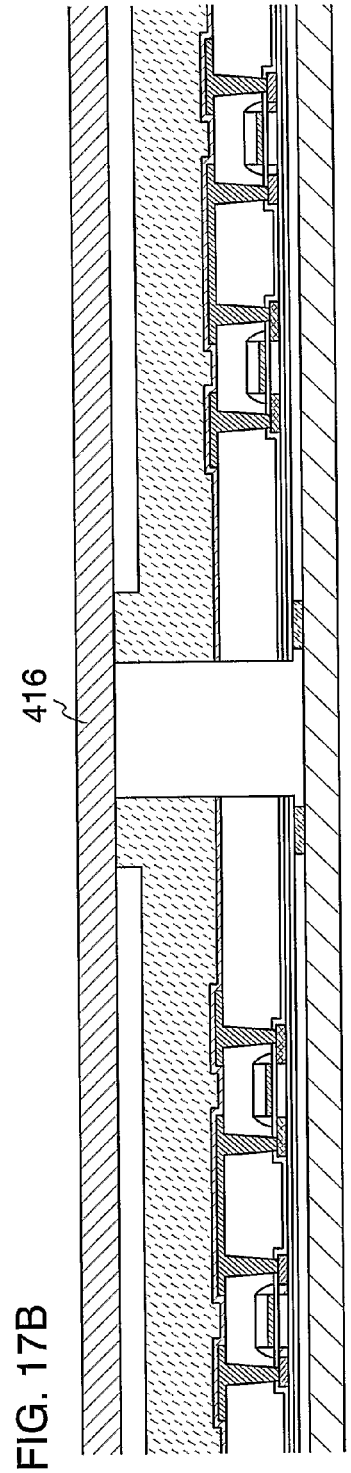
Figure 17C:
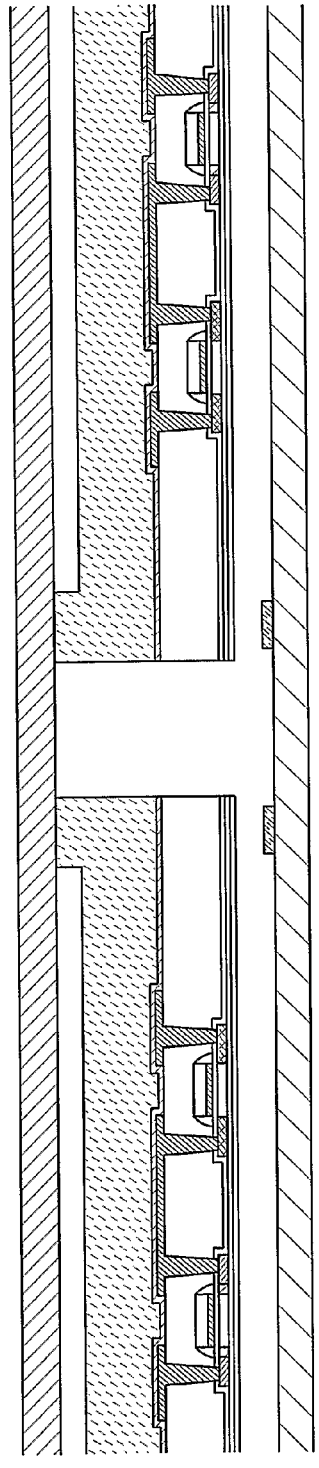

Then, an auxiliary substrate 416 is provided over the protective film 410 as shown in FIG. 17B. Thereafter, the TFT layer 2020 is physically peeled from the substrate 400 using the auxiliary substrate 416 (FIG. 17C). Through the above steps, the TFT layer 2020 can be peeled from the substrate 400.

By using the method described in this embodiment, the TFT layer 2020 after peeling can be obtained in a regularly arranged state as the same as before the peeling, without being separated.

In this embodiment, the TFT layer 2020 is peeled from the substrate 400 by separately attaching the auxiliary substrate 416. However, it may be peeled by another method.

Thereafter, the TFT layer 2020 separated from the substrate 400 may be directly mounted on an article or may be mounted together with a separate transfer layer to which the TFT layer is transferred. As the transfer substrate, a flexible substrate is preferable. A substrate made of a synthetic resin such as plastic typified by polyethyleneterephthalate (PET), polyethylenenaphthalate (PEN), or polyetersulfone (PES) or acrylic can be used as the flexible substrate.

An adhesive such as a thermosetting resin, an ultraviolet curing resin, an epoxy or acrylic resin, or a resin additive, two-sided tape, or the like can be used as an adhesive for attaching the flexible substrate.

As a result of transferring the thin film integrated circuit to the flexible substrate, the breaking strength of the thin film integrated circuit can be increased. The thin film integrated circuit can be made lightweight and thin, and flexibility thereof can be improved compared to a thin film integrated circuit formed over an insulating substrate.

The peeled substrate can be reused. Accordingly, cost reduction can be achieved in manufacturing a thin film integrated circuit even in the case of using a quartz substrate or the like. In the case of reusing a substrate, the peeling step is preferably controlled so as not to damage the substrate. However, even when the substrate is damaged, a planarization process may be performed by forming an organic or inorganic resin film by a coating method or a droplet discharge method.

In the case of thus forming a thin film integrated circuit over a substrate having an insulating surface, there is less limitation on the shape of a mother substrate, compared with the case of taking a chip out of a circular silicon wafer. Therefore, the productivity of the thin film integrated circuit can be increased, and mass production can be conducted. Moreover, cost can be reduced since the insulating substrate can be reused.

Note that this embodiment can be freely combined with any of the above embodiment modes.

Embodiment 3

In this embodiment, a different mode from the above embodiment modes or embodiments will be explained with reference to FIGS. 22A to 22C and 23A to 23C.

Figure 22A:
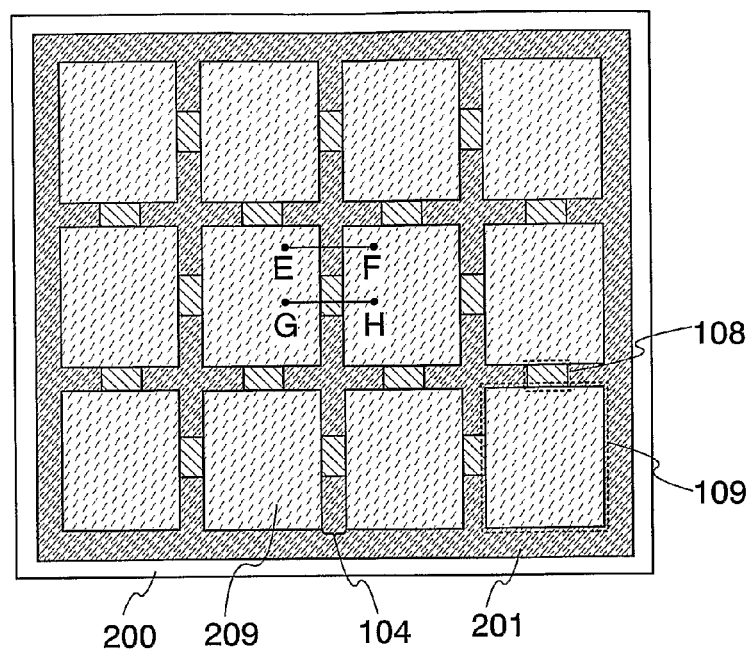
FIGS. 22A to 22C show a thin film integrated circuit of the invention.

As shown in FIG. 22A, a substrate 200, a release layer 201, a TFT layer 102, and a protective film 209 are sequentially formed. Note that FIG. 22A is a top view; a cross-sectional view taken along line E-F corresponds to FIG. 22B, and a cross-sectional view taken along line G-H corresponds to FIG. 22C.

In this embodiment, an insulating film and a conductive film which are both included in the TFT layer 102 are selectively formed over the substrate 200 in a region 109 to be provided with a thin film integrated circuit. At the same time, the insulating film or the conductive film is selectively formed also in a part of an opening 104. Note that the region where the insulating film or the conductive film is selectively formed in the opening 104 is referred to as a connection region 108.

Note that the connection region 108 is formed simultaneously with the step of manufacturing the TFT layer 102 and at least have a function of connecting the TFT layers 102 to be unified. The connection region 108 may have a single-layer structure or a laminated structure, and is formed with an insulating film or a conductive film. In this embodiment, the connection region 108 has a laminated structure of first and second insulating films 202 and 203, a gate insulating film 213, an interlayer insulating film 206, and an insulating film 208 (FIG. 22C).

Figure 23A:
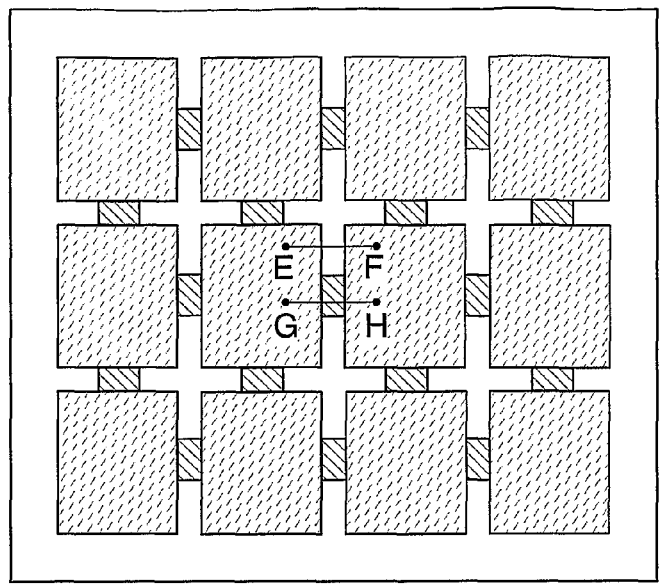
FIGS. 23A to 23C show a thin film integrated circuit of the invention.
Figure 23B:
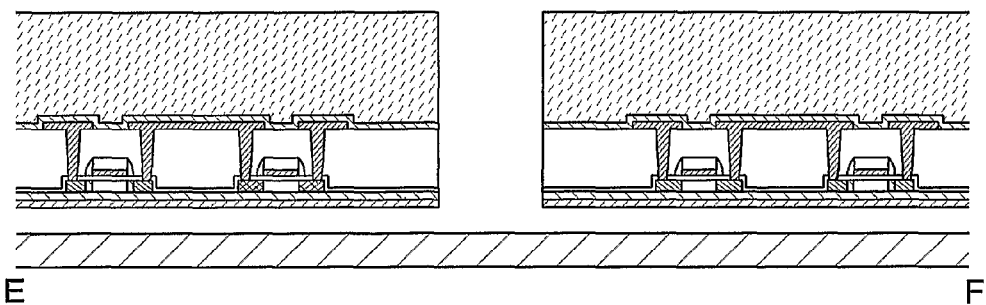
Figure 23C:
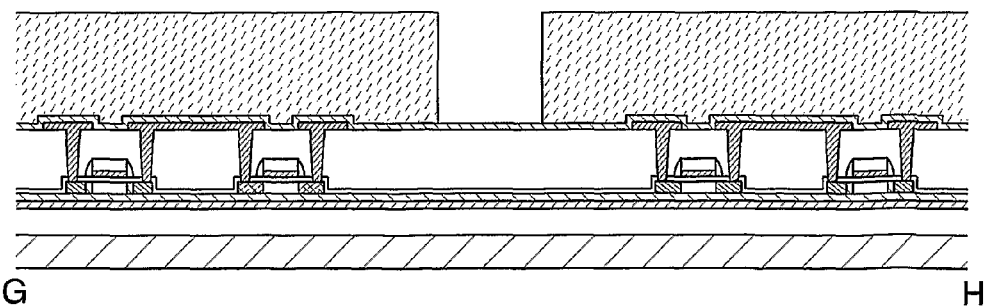

Subsequently, an etchant is introduced into the opening 104 to completely remove the release layer 201 (FIGS. 23A to 23C). As the etchant, a gas or a liquid containing halogen fluoride can be used as described in the above embodiment modes.

At this time, the reaction time and the introduction amount are adjusted so as to remove the release layer disposed below the connection region 108. Accordingly, the TFT layer 102 is separated from the substrate 100 in the case of completely removing the release layer. However, the TFT layers 102 are joined to each other by the connection region 108. Thus, they maintain the same arrangement as before peeling without being separated from each other.

Subsequently, each TFT layer 102 is cut by a dicing, scribing or laser cutting method. Each TFT layer 102 can be cut using a laser which is absorbed by a glass substrate, for example, a $CO_2$ laser. Thereafter, the TFT layer 102 separated from the substrate 200 may be directly mounted on an article or may be mounted together with a separate transfer layer to which the TFT layer is transferred as in Embodiment Mode 1. In addition, the peeled substrate 200 can be reused.

Note that this embodiment can be freely combined with the above embodiment modes or embodiments.

Embodiment 4

In this embodiment, a method for manufacturing the gate electrode in the TFT layer described in the above embodiments will be explained with reference to FIGS. 19A and 19B and FIGS. 20A and 20B.

First, a release layer 201 is formed over a substrate 200, and semiconductor films 211 and 212 are provided over the release layer 201 with insulating films 202 and 203 therebetween, as described in the above embodiments. Subsequently, a gate insulating film 213 is formed over the semiconductor films 211 and 212. Thereafter, a first conductive layer 901 and a second conductive layer 902 are stacked over the gate insulating film 213. In this embodiment, tantalum nitride (TaN) is used for the first conductive layer and tungsten (W) is used for the second conductive layer. The TaN film may be formed by a sputtering method using a target of tantalum in a nitrogen atmosphere. The W film may be formed by a sputtering method using a target of tungsten.

In this embodiment, the first conductive layer 901 is made from TaN and the second conductive layer 902 is made from W. However, without limitation thereto, the first conductive layer 901 and the second conductive layer 902 may each be formed using an element selected from Ta, W, Ti, Mo, Al, Cu, Cr, and Nd; an alloy material or a compound material containing the element as its main component. Alternatively, a semiconductor film as typified by a polycrystalline silicon film, doped with impurity elements such as phosphorus, may be used. An AgPdCu alloy may be used instead. Combinations thereof may also be appropriately selected. The first conductive layer 901 may be formed to a thickness in the range of 20 nm to 100 nm. The second conductive layer 902 may be formed to have a thickness in the range of 100 nm to 400 nm. In this embodiment, a laminated structure of two layers is employed. Alternatively, a single-layer structure or a laminated structure of three or more layers may be employed.

Figure 19A:
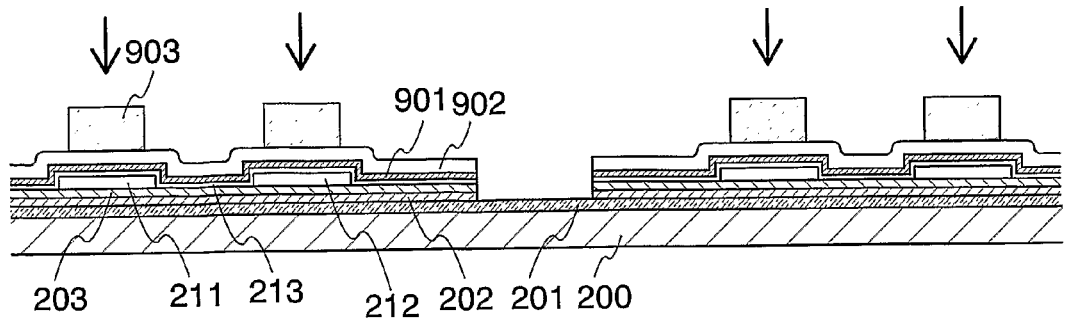
FIGS. 19A and 19B are cross-sectional views showing a thin film integrated circuit of the invention.
Figure 19B:
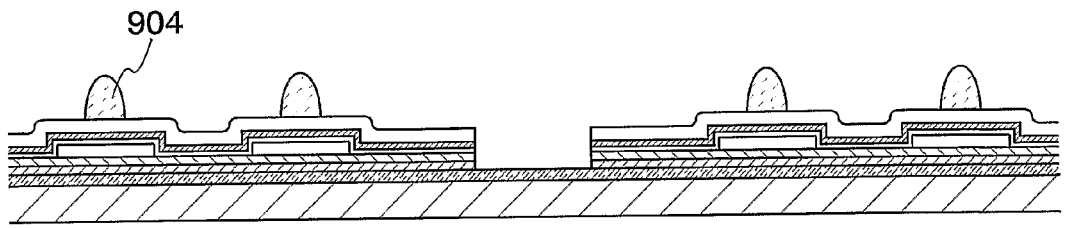

Then, a resist 903 is selectively formed over the second conductive layer 902 by photolithography or a droplet discharge method (FIG. 19A). Thereafter, the resist 903 is etched by known etching treatment such as $O_2$ (oxygen) plasma treatment to reduce the size of the resist 903 (FIG. 19B). A gate electrode having a narrower width can be formed by etching the first conductive layer 901 and the second conductive layer 902 using the thus reduced resist 904 as a mask. In other words, a gate electrode narrower than one formed by using the resist 903 which is obtained by usual patterning can be formed. In such a way, the width of a channel formation region is reduced by decreasing the size of a gate electrode structure. Accordingly, high speed operation becomes possible.

Figure 20A:
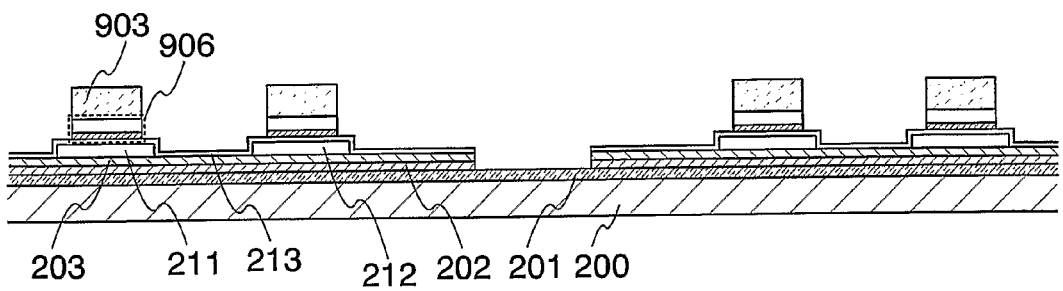
FIGS. 20A and 20B are cross-sectional views showing a thin film integrated circuit of the invention.
Figure 20B:
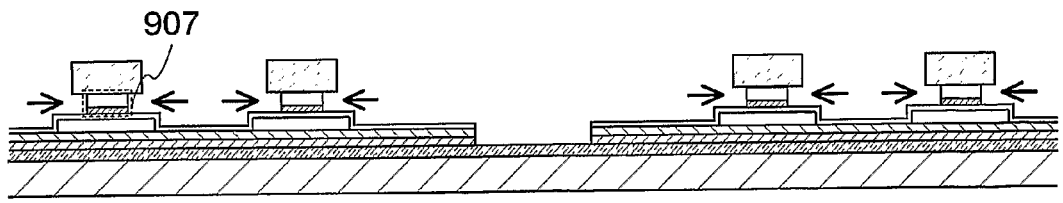

A method for manufacturing a gate electrode, which is different from that shown in FIGS. 19A and 19B, will be explained with reference to FIGS. 20A and 20B.

As previously shown in FIG. 19A, a release layer 201, insulating films 202 and 203, semiconductor films 211 and 212, a gate insulating film 213, a first conductive layer 901, and a second conductive layer 902 are stacked over a substrate 200. Then, a resist 903 is selectively formed. The first conductive layer 901 and the second conductive layer 902 are etched using the resist 903 as a mask (FIG. 20A). Through the steps, a gate electrode 906, which is formed with the first conductive layer 901 and the second conductive layer 902, is formed. Thereafter, the gate electrode 906 is etched by a known etching method. Since the resist 903 is provided over the gate electrode 906, each side of the gate electrode 906 is etched; accordingly, a gate electrode 907 narrower than the gate electrode 906 can be formed as shown in FIG. 20B.

According to the manufacturing method described in this embodiment, a minute gate electrode that is finer than the finest one formed by patterning by a photolithography method or the like can be manufactured. Further, a minuter element structure can be provided by reducing the size of the gate electrode. Accordingly, more elements can be formed in a certain area, and a high-performance circuit can be formed. A smaller thin film integrated circuit (IC chip or the like) can be obtained in the case where the thin film integrated circuit is formed with the same number of elements as before. The method shown in FIGS. 19A and 19B and the method shown in FIGS. 20A and 20B may be combined, so that a minuter gate electrode can be formed.

Note that this embodiment can be freely combined with the above-described embodiment modes and embodiments.

Embodiment 5

In this embodiment, the structure of a TFT layer, which is different from one described in the above embodiment, will be explained with reference to FIG. 24.

Figure 22B:
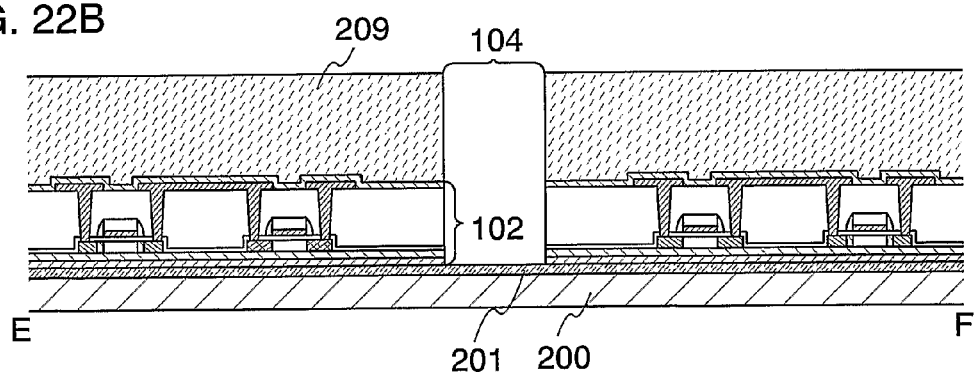
Figure 22C:
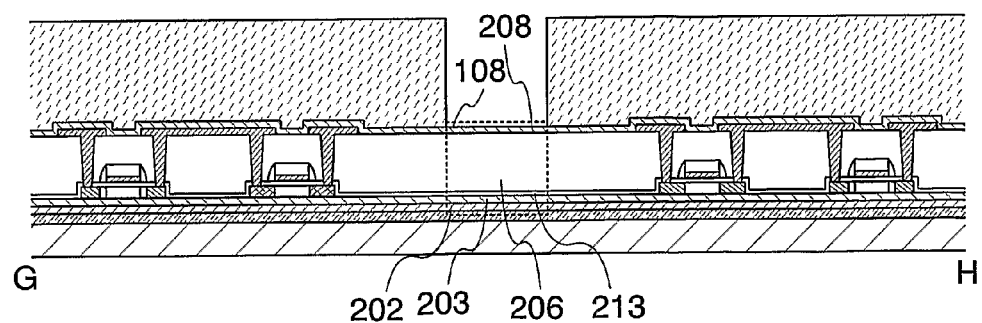

FIG. 24 shows a structure in which the TFT layer 102 shown in FIG. 13C, 22B, or the like is provided with a lower electrode provided with a lower electrode. In other words, as shown in FIG. 24, a channel region of a semiconductor layer 211 is interposed between a lower electrode 513 and a gate electrode 214 with an insulating film therebetween.

The lower electrode 513 can be formed from metal or a polycrystalline semiconductor doped with impurities having one conductivity. In the case of using metal, W, Mo, Ti, Ta, Al, or the like can be used. Further, a silicon nitride film 514 and a silicon oxynitride film 515 which serve as base insulating films are formed. However, the base insulating film is not limited to the materials and the order of lamination.

As described above, a TFT having a lower electrode can be used as the structure of the TFT layer 102. Generally, when the size of the TFT is reduced and a clock frequency for operating a circuit is improved, power consumption of an integrated circuit is increased. Accordingly, a method for applying a bias voltage to the lower electrode is effective in suppressing the increase in the power consumption. By changing the bias voltage, a threshold voltage of the TFT can be changed.

Application of threshold voltage makes current easily flow to the channel and the TFT can be operated at higher speed or at lower voltage. Further, the application of a positive bias voltage to the lower electrode of a p-channel TFT increases threshold voltage and reduces leakage. On the other hand, the application of a negative bias voltage decreases the threshold voltage, which makes current easily flow to the channel and the TFT can be operated at higher speed or at lower voltage. Thus, the characteristics of an integrated circuit can be drastically improved by controlling a bias voltage applied to the lower electrode.

By balancing the threshold voltage of the n-channel TFT with that of the p-channel TFT using the bias voltage, the characteristics of an integrated circuit can be improved. In this case, both a power source voltage and the bias voltage applied to the lower electrode may be controlled in order to reduce power consumption. When the circuit is in a standby mode, a large reverse bias voltage is applied to the lower electrode. In an operation mode, a small reverse bias voltage is applied to the lower electrode when load is light, whereas a small forward bias voltage is applied when the load is heavy. The application of the bias voltage may be made switchable depending on the operation state or load state of the circuit by providing a control circuit. By controlling power consumption or TFT performance in such a way, circuit performance can be maximized.

Note that this embodiment can be freely combined with the above-described embodiment modes and embodiments.

Embodiment 6

In this embodiment, the case of using the thin film integrated circuit described in the above embodiment modes or embodiments as an IC chip (a semiconductor device, such as a wireless tag, an RFID (radio frequency identification) tag, an IC tag, or an ID chip, which can wirelessly transmit and receive data will be explained.

The IC chip can be roughly divided into three types: a contactless type IC chip mounted with an antenna (also referred to as a wireless tag), a contact type IC chip provided with a terminal connected to an external power source without an antenna mounted, and a hybrid type IC chip which is a combination of the contactless type and the contact type.

In the case of using the thin film integrated circuit described in the above embodiment modes or embodiments as the contact type IC chip, the peeled thin film integrated circuit can be used by being directly mounted on an article.

On the other hand, in the case of using the thin film integrated circuit as the contactless type IC chip or the hybrid type IC chip, the integrated circuit is preferably used with an antenna mounted. Examples of a cross-sectional view of the IC chip when mounted with an antenna are shown in FIGS. 25A and 25B. Note that cross-sectional views in FIGS. 25A and 25B show a state before peeling the IC chip from a substrate.

FIG. 25A is a cross-sectional view showing an IC chip in which an antenna 232 is directly formed over a TFT layer 102. As described in the above embodiments, after forming up to wirings 207a to 207c, a second interlayer insulating film 231 is formed to cover the wirings 207a to 207c. The second interlayer insulating film 231 can be formed with any of the materials described in the above embodiments as the material of the interlayer insulating film 206. Here, the second interlayer insulating film 231 is formed using a siloxane resin.

Subsequently, contact holes are formed in the second interlayer insulating film 231 to reach the wirings 207a and 207c. Then, each antenna 232 is formed to electrically connect to the wiring 207a or 207c. As a material of the antenna 232, a conductive material such as Ag, Al, Au, Cu, or Pt can be used. In the case of using Al or Au which has relatively high resistance, the wiring resistance may be a concern. However, the wiring resistance can be reduced by thickening or widening the antenna. Alternatively, antennas may be laminated and covered with a material having low resistance. In the case of using a conductive material such as Cu, which would diffuse, an insulating film is preferably formed to cover the surface to be provided with the antenna or the periphery of Cu.

Then, a protective film 233 is formed to cover the antenna 232. The protective film 233 can also be formed by using any of the materials described in the above embodiments.

Subsequently, as described in the above embodiment modes or embodiments, the release layer is removed, so that the IC chip can be peeled from the substrate to be taken out. The peeling may be performed by completely removing the release layer or physically peeling after removing the release layer with a part thereof left, which may be appropriately selected by a practitioner. Thereafter, the peeled IC chip can be used by being mounted on an article or the like.

FIG. 25B is a cross-sectional view showing the case of attaching an antenna substrate 235 provided in advance with an antenna 234 to a TFT layer 102 with an adhesive or the like.

An anisotropic conductor 236 including dispersed conductors 237 can be used as an attaching means. The anisotropic conductor 236 can be conductive in a region 239 provided with a connection terminal 238 of the IC chip and a connection terminal of the antenna 234 since the conductors are bonded to each other by pressure due to the thickness of each connection terminal. The connection terminals are not electrically connected to each other in the other region since a sufficient distance is kept among the conductors. Instead of using the anisotropic conductor, the antenna substrate may be attached to the TFT layer with an ultrasonic adhesive, an ultraviolet curing resin, two-sided tape, or the like.

Structures different from those in FIGS. 25A and 25B are shown in FIGS. 26A and 26B.

FIG. 26A is a cross-sectional view of an IC chip in which an antenna 232 is directly formed over a TFT layer 102. As described in the above embodiments, after similarly forming up to wirings 207a to 207c, a second interlayer insulating film 231 is formed to cover the wirings 207a to 207c.

The second interlayer insulating film 231 can be formed from a similar material to one described in the above embodiments as the material for the interlayer insulating film 206. Here, the second interlayer insulating film 231 is formed using a siloxane resin.

Subsequently, contact holes are formed in the second interlayer insulating film 231 to reach the wirings 207a and 207c. Then, each antenna 232 is formed to electrically connect to the wiring 207a or 207c. As a material of the antenna 232, a conductive material such as Ag, Al, Au, Cu, or Pt can be used. In the case of using Al or Au which has relatively high resistance, the wiring resistance may be a concern. However, the wiring resistance can be reduced by thickening or widening the antenna. Alternatively, antennas may be laminated and covered with a material having low resistance. In the case of using a conductive material such as Cu, which would diffuse, an insulating film is preferably formed to cover the surface to be provided with the antenna or the periphery of Cu.

Then, a protective film 233 is formed to cover the antenna 232. The protective film 233 can also be formed by using any of the materials described in the above embodiments.

Subsequently, as described in the above embodiment modes or embodiments, the release layer is removed, so that the IC chip can be peeled from the substrate to be taken out. The peeling may be performed by completely removing the release layer or physically peeling after removing the release layer with a part thereof left, which may be appropriately selected by a practitioner Thereafter, the peeled IC chip can be used by being mounted on an article or the like.

FIG. 26B is a cross-sectional view showing the case of attaching an antenna substrate 235 provided in advance with an antenna 234 to a TFT layer 102 with an adhesive or the like.

An anisotropic conductor 236 including dispersed conductors 237 can be used as an attaching means. The anisotropic conductor 236 can be conductive in a region 239 provided with a connection terminal 238 of the IC chip and a connection terminal of the antenna 234 since the conductors are bonded to each other by pressure due to the thickness of each connection terminal. The connection terminals are not electrically connected to each other in the other region since a sufficient distance is kept among the conductors. Instead of using the anisotropic conductor, the antenna substrate may be attached to the TFT layer with an ultrasonic adhesive, an ultraviolet curing resin, two-sided tape, or the like.

Note that, in the case where the IC chip would warp when peeled from the substrate, a protective film is preferably formed over the antenna substrate 235. Thereafter, the IC chip separated from the substrate can be used by being directly mounted on an article, or mounted together with a separate transfer layer to which the TFT layer is transferred.

Since a thin film integrated circuit formed not with a silicon substrate but over an insulating substrate is used for the IC chip described in this embodiment, Therefore, there is less limitations on the shape of a mother substrate compared with a chip formed from a circular silicon wafer. Consequently, the cost of the IC chip can be reduced. Further, a semiconductor film with a thickness of 0.2 µm or less, typically, 40 nm to 170 nm, preferably, 50 nm to 150 nm is used as an active region in the IC chip of this embodiment; thus, the IC chip is very thin unlike a chip formed with a silicon substrate. As a result, the presence of the thin film integrated circuit is hard to notice even when it is mounted on an article, which leads to protection against falsification such as forgery.

Further, the IC chip described in this embodiment can receive signals with high sensitivity without electromagnetic wave absorption compared with a chip formed with a silicon substrate. In the case where a silicon substrate is not used, the thin film integrated circuit has light-transmitting properties. Accordingly, the IC chip of this embodiment can be applied to various articles; for example, it can be mounted on a printed surface of an article without spoiling the design.

Note that this embodiment can be freely combined with the above-described embodiment modes and embodiments.

Embodiment 7

In this embodiment, a structure of an IC chip manufactured by a peeling method according to the present invention will be explained.

Figure 27A:
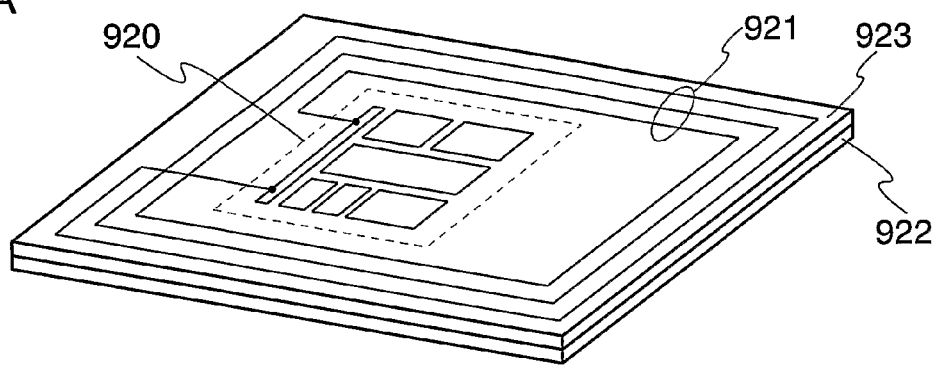
FIGS. 27A and 27B show an example of a semiconductor device of the invention.

FIG. 27A is a perspective view of one form of an IC chip. Reference numeral 920 denotes an integrated circuit and 921 denotes an antenna. The antenna 921 is electrically connected to the integrated circuit 920. Reference numeral 922 denotes a substrate and 923 denotes a cover member. The integrated circuit 920 and the antenna 921 are interposed between the substrate 922 and the cover member 923.

Figure 27B:
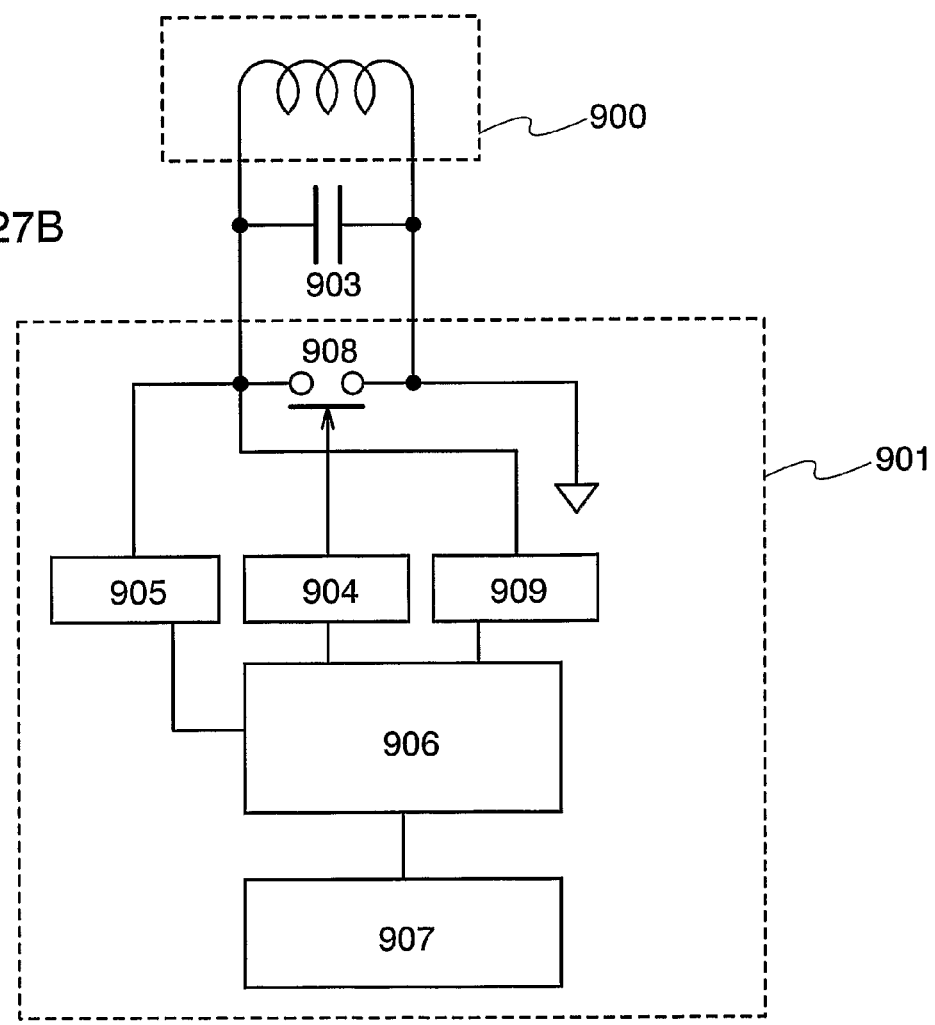

FIG. 27B is a block diagram showing one form of a functional structure of the IC chip shown in FIG. 27A.

In FIG. 27B, reference numeral 900 denotes an antenna; 901, an integrated circuit; and 903, a capacitor formed between both terminals of the antenna 900. The integrated circuit 901 has a demodulation circuit 909, a modulation circuit 904, a rectifier circuit 905, a microprocessor 906, a memory 907, and a switch 908 for applying load modulation to the antenna 900. There may be more than one memory 907. A plurality of memories such as an SRAM, a flash memory, a ROM, an FeRAM, and the like can be used.

A signal transmitted from a reader/writer as an electric wave is converted into an AC electrical signal by electromagnetic induction in the antenna 900. The demodulation circuit 909 demodulates the AC electrical signal and transmits it to the microprocessor 906 in a subsequent stage. The rectifier circuit 905 generates a power source voltage using an AC electrical signal and supplies it to the microprocessor 906 in a subsequent stage. The microprocessor 906 carries out various kinds of arithmetic processing according to the inputted signal. The memory 907 stores a program, data, or the like used in the microprocessor 906. The memory 907 can also be used as a workspace in the arithmetic processing.

When data is transmitted from the microprocessor 906 to the modulation circuit 904, the modulation circuit 904 can control the switch 908 to apply load modulation to the antenna 900 according to the data. The reader/writer can read the data from the microprocessor 906 by receiving the load modulation applied to the antenna 900.

Note that the IC chip need not necessarily have the microprocessor 906. The signal transmission method is not limited to such an electromagnetic induction method as shown in FIG. 27B. A microwave method or another transmission method may be used.

Since an IC chip having an antenna can exchange data with an external device (reader/writer), the IC chip can be used as a wireless memory or a wireless processor.

This embodiment can be freely combined with the above-described embodiment modes and embodiments.

Embodiment 8

In this embodiment, the case of peeling and sealing a thin film integrated circuit provided over a substrate by using a laminating apparatus will be specifically explained with reference to drawings.

Figure 28:
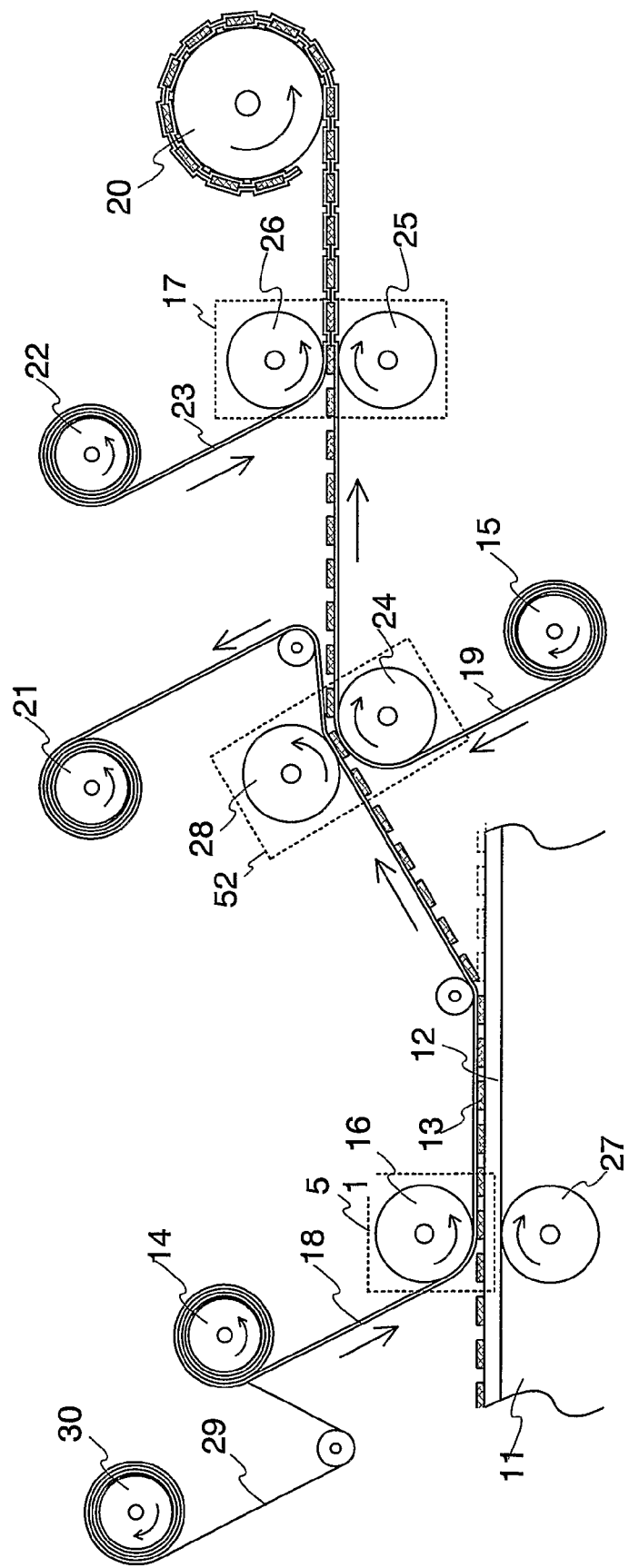
FIG. 28 shows a manufacturing apparatus of a semiconductor device of the invention.

As shown in FIG. 28, a laminating apparatus described in this embodiment has a transport means 11 which transports a substrate 12 provided with a plurality of thin film integrated circuits 13, a first supply roller 14 wound with a first sheet member 18, a first peeling means 51 provided with a roller 16 which peels the thin film integrated circuits 13 from the substrate 12 by attaching to the first sheet member 18, a second supply roller 15 wound with a second sheet member 19, a second peeling means 52 provided with rollers 24 and 28 which peels the thin film integrated circuits 13 from the first sheet member 18 by attaching to the second sheet member 19, a receiving roller 21 which receives the first sheet member 18, a third supply roller 22 which supplies a third sheet member 23, a laminating means 17 which seals the thin film integrated circuits 13 between the second sheet member 19 and the third sheet member 23, and a receiving roller 20 around which the sealed thin film integrated circuit 13 are wound.

In the apparatus shown in FIG. 28, the first sheet member 18 supplied from the first supply roller 14 is bonded to the thin film integrated circuits 13 over the substrate 12 which is transported by the transport means 11 to peel the thin film integrated circuits 13 from the substrate 12 by the first peeling means 51 provided with the roller 16. Thereafter, the peeled thin film integrated circuits 13 are bonded to the first sheet member 18 and travel toward the roller 28. The second sheet member 19 supplied from the second supply roller 15 travels toward the roller 24.

The second sheet member 19 is bonded to the opposite side of the transported thin film integrated circuits 13 which are bonded to the first sheet member 18 to peel the thin film integrated circuits 13 from the first sheet member 18 by the second peeling means 52 provided with the rollers 24 and 28. Either or both of pressure treatment and heat treatment are carried out when the thin film integrated circuits 13 bonded to the first sheet member 18 are bonded to the second sheet member 19. Thereafter, the peeled thin film integrated circuits 13 are bonded to the second sheet member 19 and travel toward the laminating means 17. Further, the third sheet member 23 supplied from the third supply roller 22 travels toward the laminating means 17.

The laminating means 17 bonds the third sheet member 23 to the opposite side of the transported thin film integrated circuits 13 (the side opposite to the side bonded to the second sheet 19) bonded to the second sheet member 19. Simultaneously, either or both of pressure treatment and heat treatment are carried out. Thereafter, the sealed thin film integrated circuits 13 travel toward the receiving roller 20 and wind around the receiving roller 20.

In the laminating apparatus shown in FIG. 28, as described above, the first sheet member 18 is supplied from the first supply roller, and sequentially passes through the roller 16 and the roller 28 included in the first peeling means, and then received by the receiving roller 21. The first supply roller 14 and the rollers 16 and 28 rotate in the same direction. The second sheet member 19 is supplied from the second supply roller 15, and sequentially passes through the roller 24 included in the second peeling means and the roller 25 included in the laminating means 17, and then received by the receiving roller 20. The second supply roller 15 and the rollers 24 and 25 rotate in the same direction. The third sheet member 23 is supplied from the third supply roller 22, and passes through the roller 26 included in the laminating means 17, and then received by the receiving roller 20. The third supply roller 22 and the roller 26 rotate in the same direction.

The transport means 11 transports the substrate 12 provided with a plurality of the thin film integrated circuits 13. In FIG. 28, the transport means 11 has a roller 27. The substrate 12 is transported by the rotation of the roller 27. The transport means 11 may have any structure as long as it can transport the substrate 12. For example, a conveyer belt, a plurality of rollers, a robot arm, or the like may be used as the transport means 11. The robot arm transports the substrate 12 itself or a stage provided with the substrate 12. Further, the transport means 11 transports the substrate 12 at a predetermined speed in accordance with a speed at which the first sheet member 18 moves.

The first sheet member 18, the second sheet member 19, and the third sheet member 23 are respectively wound around the first supply roller 14, the second supply roller 15, and the third supply roller 22. The first sheet member 18 is moved toward the roller 28 included in the second peeling means at a predetermined speed by rotating the first supply roller 14 at a predetermined speed. Each of the second sheet member 19 and the third sheet member 23 is moved toward the laminating means 17 at a predetermined speed by rotating each of the second supply roller 15 and the third supply roller 22 at a predetermined speed. The first supply roller 14, the second supply roller 15, and the third supply roller 22 are in columnar shapes and made from a resin material, a metal material, a rubber material, or the like.

The first sheet member 18 is formed from a flexible film, and has at least one adhesive surface. Specifically, the adhesive surface is prepared by providing an adhesive on a base film used as a base material of polyester or the like. As the adhesive, a resin material or a synthetic rubber material containing an acrylic resin or the like can be used. Further, a film having weak adhesive force (preferably, 0.01 N to 0.5 N, more preferably, 0.05 N to 0.35 N) is preferably used as the first sheet member 18 in order to attach the thin film integrated circuits again to the second sheet member after attaching the thin film integrated circuits provided over the substrate to the first sheet member. The thickness of the adhesive may be 1 μm to 100 μm, preferably, 1 μm to 30 μm. Preferably, the base film is formed from a polyester film or the like with a thickness of 10 μm to 1 mm for easy handling in processing.

In the case where the surface of the adhesive layer is protected by a separator, a separator receiving roller 30 may be provided as shown in FIG. 13/28 to remove the separator 29 in use. Further, a base film used as the base material subjected to antistatic treatment can be used as the separator. The separator is formed from a film of polyester or the like, paper, or the like. The separator is preferably formed from a film of polyethylene terephthalate or the like since paper powder and the like are not generated during the processing time The second sheet member 19 and the third sheet member 23 are formed from flexible films, for example, a laminate film, paper made from a fibrous material, or the like. The laminate film refers to films in general which can be used for lamination process. The laminate film is made from a material such as polypropylene, polystyrene, polyester, vinyl, polyvinyl fluoride, vinyl chloride, methyl methacrylate, nylon, polycarbonate, or the like, and the surface of the laminate film may be subjected to processing treatment such as embossing.

In this embodiment, the thin film integrated circuits are preferably sealed with a hot melt adhesive. The hot melt adhesive is a chemical substance which does not contain water or a solvent, which is made from a nonvolatile thermoplastic material being solid in room temperature, and which bonds things together by being applied in a melted state and being cooled. The hot melt adhesive has advantages of short bonding time, nonpolluting, safe, clean, energy-saving, and low cost.

Since the hot melt adhesive is solid at room temperature, the hot melt adhesive which is formed to be a film or fibrous in advance, or which is formed to be a film by forming an adhesive layer over a base film of polyester or the like can be used. Here, a sheet member in which a hot melt film is formed over a base film made from polyethylene terephthalate is used. The hot melt film is made from a resin having a lower softening point than that of the base film, and only the hot melt film is melted into a rubber state and attaches when heated and hardened when cooled. As the hot melt film, a film mainly containing, for example, ethylene-vinyl acetate copolymers (EVA), polyesters, polyamides, thermoplastic elastomers, polyolefins, or the like can be used.

Either or both of the second sheet member 19 and the third sheet member 23 may have an adhesive surface on one side. The adhesive surface may be a surface to which an adhesive of a thermosetting resin, an ultraviolet curing resin, an epoxy resin, a photo-curing adhesive, a moisture curing resin, a resin additive, or the like is applied.

Either or both of the second sheet member 19 and the third sheet member 23 may have a light transmitting property. In order to protect the thin film integrated circuits 13 to be sealed, either or both of the second sheet member 19 and the third sheet member 23 may be coated with a conductive material by being charged with static electricity. Either or both of the second sheet member 19 and the third sheet member 23 may be coated with a thin film mainly containing carbon (diamond like carbon film) or a conductive material such as indium tin oxide (ITO) as a protective film.

The first peeling means 51 has at least the roller 16 to attach one surface of the thin film integrated circuits 13 to one surface of the first sheet member 18 and to peel the thin film integrated circuits 13 from the substrate 12. By rotating the roller 16, the thin film integrated circuits 13 are attached to the first sheet member 18 and peeled from the substrate 12. Accordingly, the roller 16 is provided to oppose to the substrate 12 on the side provided with the thin film integrated circuits 13. Further, the roller 16 is in a columnar shape and made from a resin material, a metal material, a rubber material, or the like, preferably, a soft material.

The second peeling means 52 has at least the rollers 24 and 28 opposing to each other to attach the thin film integrated circuits 13 which is attached to the first sheet member 18 to one surface of the second sheet member 19 and to peel the thin film integrated circuits 13 from the first sheet member 18. At this time, the thin film integrated circuits 13 are attached to the second sheet member 19 which is supplied from the second supply roller 15 toward the roller 24; simultaneously, either or both of pressure treatment and heat treatment are carried out using either or both of the rollers 24 and 28 when the thin film integrated circuits 13 passes between the rollers 24 and 28.

Through this treatment, the thin film integrated circuits 13 attached to the first sheet member 18 are attached to the second sheet member 19. As the heat treatment, any method can be used as long as it can apply heat energy. For example, an oven; a heater with a heating wire; a heating medium such as oil; a hot stamp; a thermal head; laser light; an infrared flash; a heat stylus; or the like can be appropriately used. Further, the rollers 24 and 28 are in columnar shapes and made from a resin material, a metal material, a rubber material, or the like, preferably, a soft material.

When the thin film integrated circuits 13, of which one surface is bonded to the second sheet member 19, reaches the laminating means 17, the laminating means 17 attaches the third sheet member 23 to the other surface of the thin film integrated circuits 13; simultaneously, the thin film integrated circuits 13 are sealed with the second sheet member 19 and the third sheet member 23. The laminating means 17 has the rollers 25 and 26 opposing to each other. The other surface of the thin film integrated circuits 13 is attached to the third sheet member 23 which is supplied from the third supply roller 22 toward the roller 26; simultaneously, either or both of pressure treatment and heat treatment are carried out using the rollers 25 and 26 when the thin film integrated circuits 13 passes between the rollers 25 and 26. Through the treatment, the thin film integrated circuits 13 are sealed with the second sheet member 19 and the third sheet member 23.

Either or both of the rollers 25 and 26 composing the laminating means 17 have a heating means. As the heating means, an oven; a heater with a heating wire; a heating medium such as oil; a hot stamp; a thermal head; laser light; an infrared flash; a heat stylus; or the like can be used. The rollers 25 and 26 rotate at a predetermined speed in accordance with a speed at which the roller 24, the second supply roller 15, and the third supply roller 22 rotate. The rollers 25 and 26 are in columnar shapes and made from a resin material, a metal material, a rubber material, or the like, preferably, a soft material.

The receiving roller 20 is a roller for winding and receiving the thin film integrated circuits 13 sealed with the second sheet member 19 and the third sheet member 23. The receiving roller 20 rotates at a predetermined speed in accordance with a speed at which the rollers 25 and 26 rotate. The receiving roller 20 is in a columnar shape and made from a resin material, a metal material, a rubber material, or the like, preferably, a soft material.

Thus, according to the laminating apparatus shown in FIG. 28, processes of peeling the plurality of thin film integrated circuits 13 provided over the substrate 12, sealing the peeled thin film integrated circuits, and receiving the sealed thin film integrated circuits can be continuously carried out by rotating the first to third supply rollers 14, 15, and 21, the roller 16, the rollers 24 and 28, the rollers 25 and 26, and the receiving roller 20.

As described above, the laminating apparatus described in this embodiment can continuously perform the peeling and sealing of the thin film integrated circuits provided over the substrate. Therefore, the thin film integrated circuit, for example, shown in FIG. 12A can be effectively peeled, sealed, and received by using the laminating apparatus shown in FIG. 28. Thus, the laminating apparatus can provide high productivity and manufacturing efficiency.

Note that this embodiment can be freely combined with the above embodiment modes and embodiments.

Embodiment 9

Figure 29A:
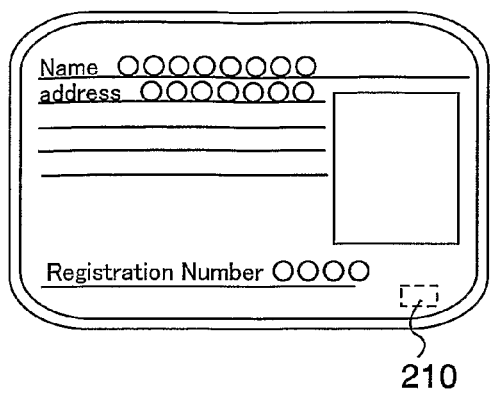
FIGS. 29A to 29E show examples of usage patterns of a semiconductor device of the invention.
Figure 29B:
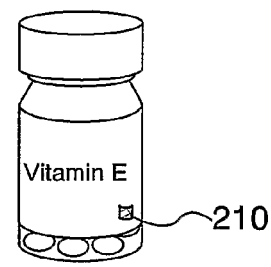
Figure 29C:
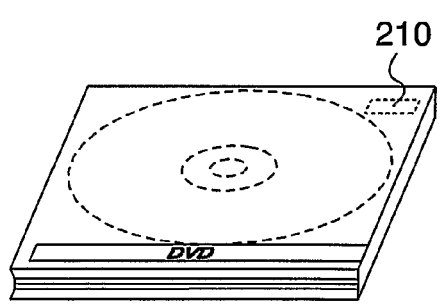
Figure 29D:
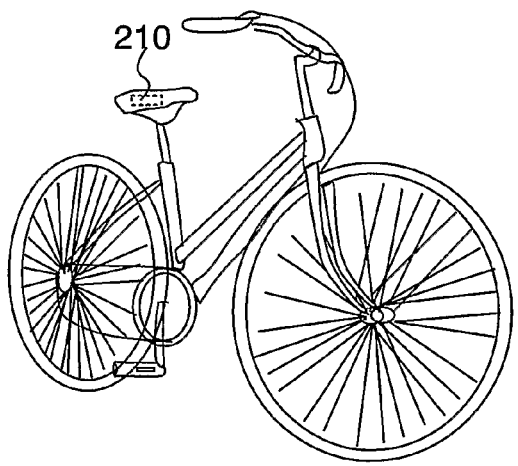
Figure 29E:
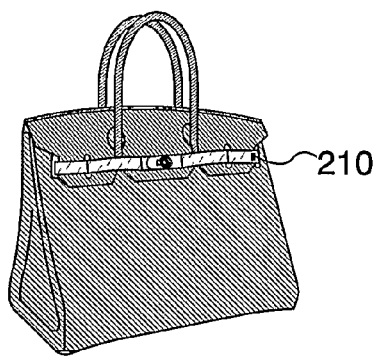

In this embodiment, the usage of the thin film integrated circuit described in the above embodiment modes or embodiments will be explained. The thin film integrated circuit peeled from the substrate can be used as an IC chip. For example, the IC chip can be used in paper money, coin, securities, bearer bonds, a certificate (such as a driver's license or a resident's card (FIG. 29A)), a packing case (such as a wrapper or a bottle (FIG. 29B)), a storage medium such as DVD software, a CD, or a video tape (FIG. 29C), a vehicle such as a car, a motorcycle, or a bicycle (FIG. 29D), personal belongings such as a bag or glasses (FIG. 29E), food, clothing, commodities, an electronic device, or the like. The electronic device includes a liquid crystal display device, an EL display device, a television apparatus (also simply referred to as TV or a television receiver), a cellular phone, and the like.

The IC chip can be fixed to an article by attaching it to the surface of the article, embedding it in the article, or the like. For example, the IC chip may be embedded in paper of a book, or in an organic resin of a package formed of an organic resin. Providing the IC chip for paper money, coin, securities, bearer bonds, a certificate, or the like can prevent forgery. Further, providing the IC chip for a packing case, a storage medium, personal belongings, foods, commodities, an electronic device, or the like can improve efficiency of an inspection system, a system for a rental shop, or the like. Providing the IC chip for a vehicle can prevent forgery or robbery.

Figure 30A:
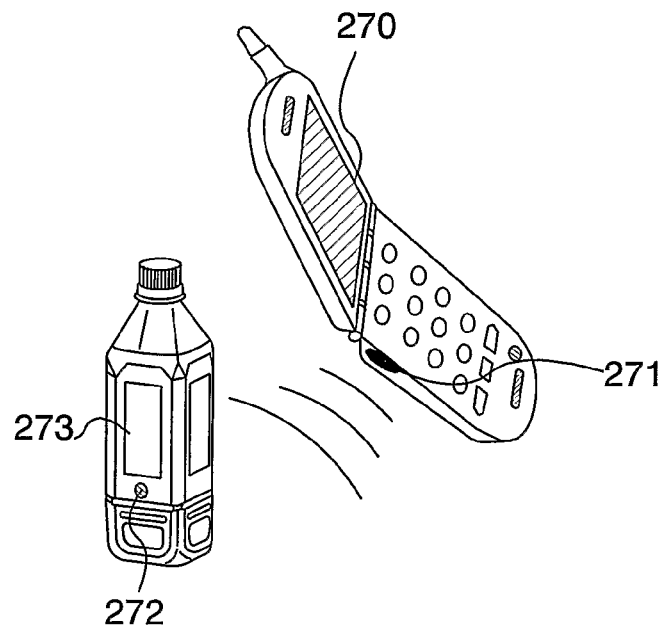
FIGS. 30A and 30B show examples of usage patterns of a semiconductor device of the invention.
Figure 30B:
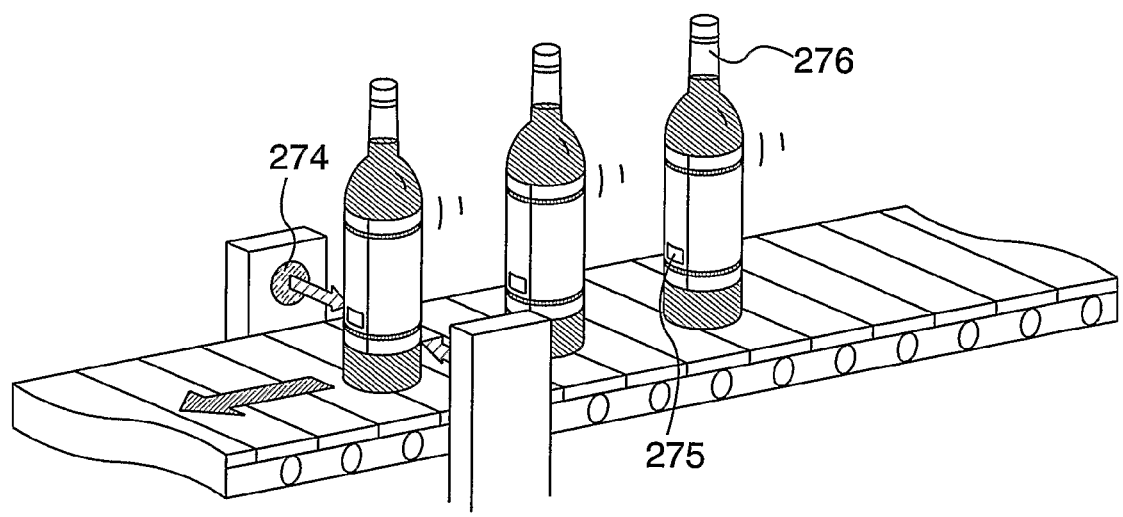

Further, the IC chip may be applied to a system of commodity management or commodity distribution, thereby improving functionality of the system. For example, a side face of a portable terminal including a display area 270 is provided with a reader/writer 271, and a side face of an article 273 is provided with an IC chip 272 (FIG. 30A). In this case, when the IC chip 272 is held over the reader/writer 271, information of the article 273 such as the raw materials, the place of origin, or the history of distribution is displayed on the display area 270. As an alternative, a reader/writer 274 can be provided at the side of a conveyer belt (FIG. 30B). In this case, an article 276 can be easily checked.

The present application is based on Japanese Priority Application No. 2004-224762 filed on Jul. 30, 2004 and No. 2004-224803 filed on Jul. 30, 2004 with the Japan Patent Office, the entire contents of which are hereby incorporated by references.

EXPLANATION OF REFERENCE

100: a substrate, 101: a release layer, 102: a TFT layer, 103: a protective film, 104: an opening, 105: an auxiliary substrate, 106: an opening, 200: a substrate, 201: a release layer, 202: a first insulating film, 203: a second insulating film, 204: an n-channel TFT, 205: a p-channel TFT, 206: an interlayer insulating film, 207: a wiring a, 207: a wiring b, 207: a wiring c, 208: an insulating film, 209: a protective film, 211: a semiconductor film, 212: a semiconductor film, 213: a gate insulating film, 214: a gate electrode, 215: a gate electrode, 221: a release layer, 222: an auxiliary substrate, 223: a transfer substrate, 230: a semiconductor film, 270: a display area, 271: a reader/writer, 272: an IC chip, 273: an article, 274: a reader/writer, 276: an article, 282: a laser spot, 283: a path, 284: a carrier flow direction, 124: a semiconductor film, 290: a laser oscillator, 291: an optical system, 293: a galvano mirror, 294: a lens, 295: an XY stage, 296: a control device 300: a substrate, 301: a release layer, 302: a first insulating film, 303: a second insulating film, 304: an n-channel TFT, 305: a p-channel TFT, 306: an opening, 307: an interlayer insulating film, 308: a wiring a, 308: a wiring b, 308: a wiring c, 309: an insulating film, 310: a protective film, 311: a semiconductor film, 312: a semiconductor film, 313: a gate insulating film, 314: a gate electrode, 315: a gate electrode, 316: an auxiliary substrate, 322: an opening, 400: a substrate, 401: a release layer, 410: a protective film, 411: a projection region, 416: an auxiliary substrate, 422: an opening, 2000: a substrate, 2010: a release layer, 2020: a TFT layer, 2030: a protective film, 2040: a projection region, 2050: an opening, 2060: a the remain area, 2070: an auxiliary substrate.

The invention claimed is:

1. A method for manufacturing a semiconductor device, comprising the steps of:
forming a release layer comprising a metal over a substrate;
forming a metal oxide film over the release layer;
forming at least one thin film integrated circuit over the release layer;
covering each upper surface of the at least one thin film integrated circuit with a protective film;
removing the release layer by using an etchant through an opening portion of the protective film, wherein at least a part of the release layer is disposed below the at least one thin film integrated circuit; and
peeling by physical force the substrate from the at least one thin film integrated circuit attached to the substrate with the part of the release layer.

2. A method for manufacturing a semiconductor device, comprising the steps of:
forming a release layer comprising a metal over a substrate;
forming a metal oxide film over the release layer;
forming at least one thin film integrated circuit over the release layer;
covering each upper surface of the at least one thin film integrated circuit with a resin film;
removing the release layer by using an etchant through an opening portion of the resin film, wherein at least a part of the release layer is disposed below the at least one thin film integrated circuit; and
peeling by physical force the substrate from the at least one thin film integrated circuit attached to the substrate with the part of the release layer.

3. A method for manufacturing a semiconductor device according to any one of claims 1 or 2, wherein the release layer is formed with a metal film containing an element selected from the group consisting of tungsten (W), molybdenum (Mo), niobium (Nb), and titanium (Ti).

4. A method for manufacturing a semiconductor device according to any one of claims 1 or 2, wherein the release layer is formed with a film selected from the group consisting of a film containing $WO_x$ over W, a film containing $MoO_x$ over Mo, a film containing $NbO_x$ over Nb, or a film containing $TiO_x$ over Ti.

5. A method for manufacturing a semiconductor device according to any one of claims 1 or 2, wherein the etchant is selected from the group Consisting of $ClF_3$, a plasma gas comprising $CF_4$, $SF_4$, $NF_3$, $F_2$, or the like, or tetramethylammonium hydroxide (TMAH).

6. A method for manufacturing a semiconductor device according to claim 2, wherein the resin film is selected from the group consisting of an epoxy resin, an acrylic resin, a phenol resin, a novolac resin, a melamine resin, a urethane resin, or silicone resin.

7. A method for manufacturing a semiconductor device according to any one of claim 1 or 2, wherein the substrate is selected from the group consisting of a glass substrate, a quartz substrate, a ceramic substrate, a metal substrate, a semiconductor substrate, or a plastic substrate.

8. A method for manufacturing a semiconductor device according to any one of claims 1 or 2, further comprising the steps of; fixing the at least one of peeled thin film integrated circuits to a flexible substrate.

9. A method for manufacturing a semiconductor device according to any one of claims 1 or 2, further comprising the steps of; covering each side surface of the at least one thin film integrated circuit with a resin film.

10. A method for manufacturing a semiconductor device according to claim 1, wherein the release layer is completely removed by the etchant.

11. A method for manufacturing a semiconductor device according to claim 1, further comprising forming a base film between the substrate and the release layer.

12. A method for manufacturing a semiconductor device according to claim 1, wherein the protective film is formed by a screen printing method.

13. A method for manufacturing a semiconductor device according to claim 1, wherein the protective film is formed by a droplet discharge method.

14. A method for manufacturing a semiconductor device according to claim 1, wherein a flexible substrate is attached to the protective film with an adhesive.

15. A method for manufacturing a semiconductor device according to claim 1, wherein the etchant is introduced into an opening between the thin film integrated circuits.

16. A method for manufacturing a semiconductor device according to claim 2, further comprising forming a base film between the substrate and the release layer.

17. A method for manufacturing a semiconductor device according to claim 2, wherein the resin film is formed by a screen printing method.

18. A method for manufacturing a semiconductor device according to claim 2, wherein the resin film is formed by a droplet discharge method.

19. A method for manufacturing a semiconductor device according to claim 2, wherein a flexible substrate is attached to the resin film with an adhesive.

20. A method for manufacturing a semiconductor device according to claim 2, wherein the etchant is introduced into an opening between the thin film integrated circuits.

21. A method for manufacturing a semiconductor device according to claim 1, wherein the protective film is selected from the group consisting of an epoxy resin, an acrylic resin, a phenol resin, a novolac resin, a melamine resin, a urethane resin, or silicone resin.

* * * * *